(12) United States Patent
Peng et al.

(10) Patent No.: US 10,784,869 B2
(45) Date of Patent: Sep. 22, 2020

(54) INTEGRATED CIRCUIT AND METHOD OF MANUFACTURING THE SAME

(71) Applicant: TAIWAN SEMICONDUCTOR MANUFACTURING COMPANY, LTD., Hsinchu (TW)

(72) Inventors: Shih-Wei Peng, Hsinchu (TW); Cheng-Chi Chuang, New Taipei (TW); Chih-Ming Lai, Hsinchu (TW); Jiann-Tyng Tzeng, Hsinchu (TW); Wei-Cheng Lin, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/506,728

(22) Filed: Jul. 9, 2019

(65) Prior Publication Data

US 2020/0021292 A1    Jan. 16, 2020

Related U.S. Application Data

(60) Provisional application No. 62/698,762, filed on Jul. 16, 2018.

(51) Int. Cl.
| | |
|---|---|
| *H03K 19/0948* | (2006.01) |
| *H01L 27/02* | (2006.01) |
| *H01L 23/522* | (2006.01) |
| *H03K 19/20* | (2006.01) |
| *H01L 23/528* | (2006.01) |
| *G06F 30/392* | (2020.01) |

(52) U.S. Cl.
CPC ....... *H03K 19/0948* (2013.01); *G06F 30/392* (2020.01); *H01L 23/528* (2013.01); *H01L 23/5226* (2013.01); *H01L 27/0207* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 2014/0040838 A1 | 2/2014 | Liu et al. | |
| 2015/0278429 A1 | 10/2015 | Chang | |
| 2018/0018419 A1* | 1/2018 | Rowhani | G06F 17/5072 |
| 2018/0158811 A1* | 6/2018 | Subhash | H01L 27/0207 |

* cited by examiner

*Primary Examiner* — Jany Richardson
(74) *Attorney, Agent, or Firm* — Hauptman Ham, LLP

(57) ABSTRACT

An integrated circuit includes a first gate, a second gate, a first contact and a first insulating layer. The first gate extends in the first direction and is located on a first level. The second gate extends in the first direction, is located on the first level, and is separated from the first gate in a second direction different from the first direction. The first contact extends in the second direction, overlaps the first gate and the second gate, is located on a second level different from the first level, and is coupled to at least the first gate. The first insulating layer extends in the second direction, overlaps the first gate and the second gate, and is between the second gate and the first contact.

20 Claims, 29 Drawing Sheets

INTEGRATED CIRCUIT AND METHOD OF MANUFACTURING THE SAME

PRIORITY CLAIM

This application claims the benefit of U.S. Provisional Application No. 62/698,762, filed Jul. 16, 2018, which is herein incorporated by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
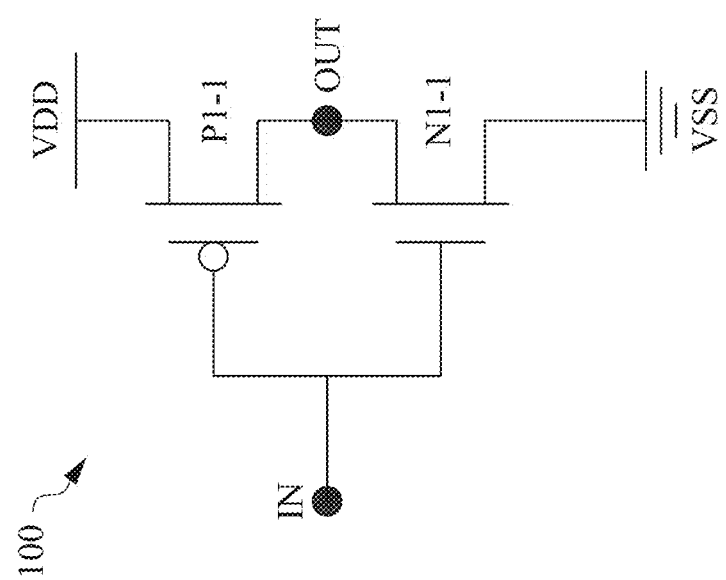
FIG. 1 is a circuit diagram of an integrated circuit, in accordance with some embodiments.

The patent or application file contains drawings/photographs executed in color. Copies of this patent with color drawing(s)/photograph(s) will be provided by the Office upon request and payment of the necessary fee.

DETAILED DESCRIPTION

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first gate, a second gate, a first contact and a first insulating layer. The first gate extends in the first direction and is located on a first level. The second gate extends in the first direction, is located on the first level, and is separated from the first gate in a second direction different from the first direction.

The first contact extends in the second direction and is located on a second level different from the first level. The first contact overlaps the first gate and the second gate, and is coupled to at least the first gate.

The first insulating layer extends in the second direction, and overlaps the first gate and the second gate. In some embodiments, the first insulating layer is over the second gate and is below the first contact, thereby electrically insulating the second gate from the first contact. In some embodiments, by positioning the first insulating layer over the second gate, the first contact can provide routing resources below upper metallization levels (e.g., M0, M1, etc.) for integrated circuit.

In some embodiments, the integrated circuit further includes a second contact coupled to a first active region and a second active region. In some embodiments, the integrated circuit further includes a third contact overlapping at least a portion of the second contact and a second insulating layer below the third contact and over the portion of the second contact.

In some embodiments, by positioning the second insulating layer over the portion of the second contact, the third contact can provide routing resources below upper metallization levels (e.g., M0, M1, etc.) for integrated circuit.

In some embodiments, by providing routing resources below upper metallization levels (e.g., M0, M1, etc.), the use of the upper metallization levels (e.g., M0, M1, etc.) can be reduced or the upper metallization levels (e.g., M0, M1, etc.) can be utilized as additional routing resources resulting in an integrated circuit having a smaller area and standard cell than other approaches.

Integrated Circuit

FIG. 1 is a circuit diagram of an integrated circuit 100, in accordance with some embodiments. In some embodiments, integrated circuit 100 is a complementary metal oxide semiconductor (CMOS) inverter circuit. A CMOS inverter circuit is used for illustration, other types of circuits are within the scope of the present disclosure.

Integrated circuit 100 includes a P-type metal oxide semiconductor (PMOS) transistor P1-1 coupled to an N-type metal oxide semiconductor (NMOS) transistor N1-1.

A gate terminal of PMOS transistor P1-1 and a gate terminal of NMOS transistor N1-1 are coupled together, and are configured as an input node IN. A drain terminal of PMOS transistor P1-1 and a drain terminal of NMOS transistor N1-1 are coupled together, and are configured as an output node OUT. A source terminal of PMOS transistor P1-1 is coupled to a voltage supply VDD. A source terminal of NMOS transistor N1-1 is coupled to a reference voltage supply VSS.

Layout Design of an Integrated Circuit

Figure 2A:
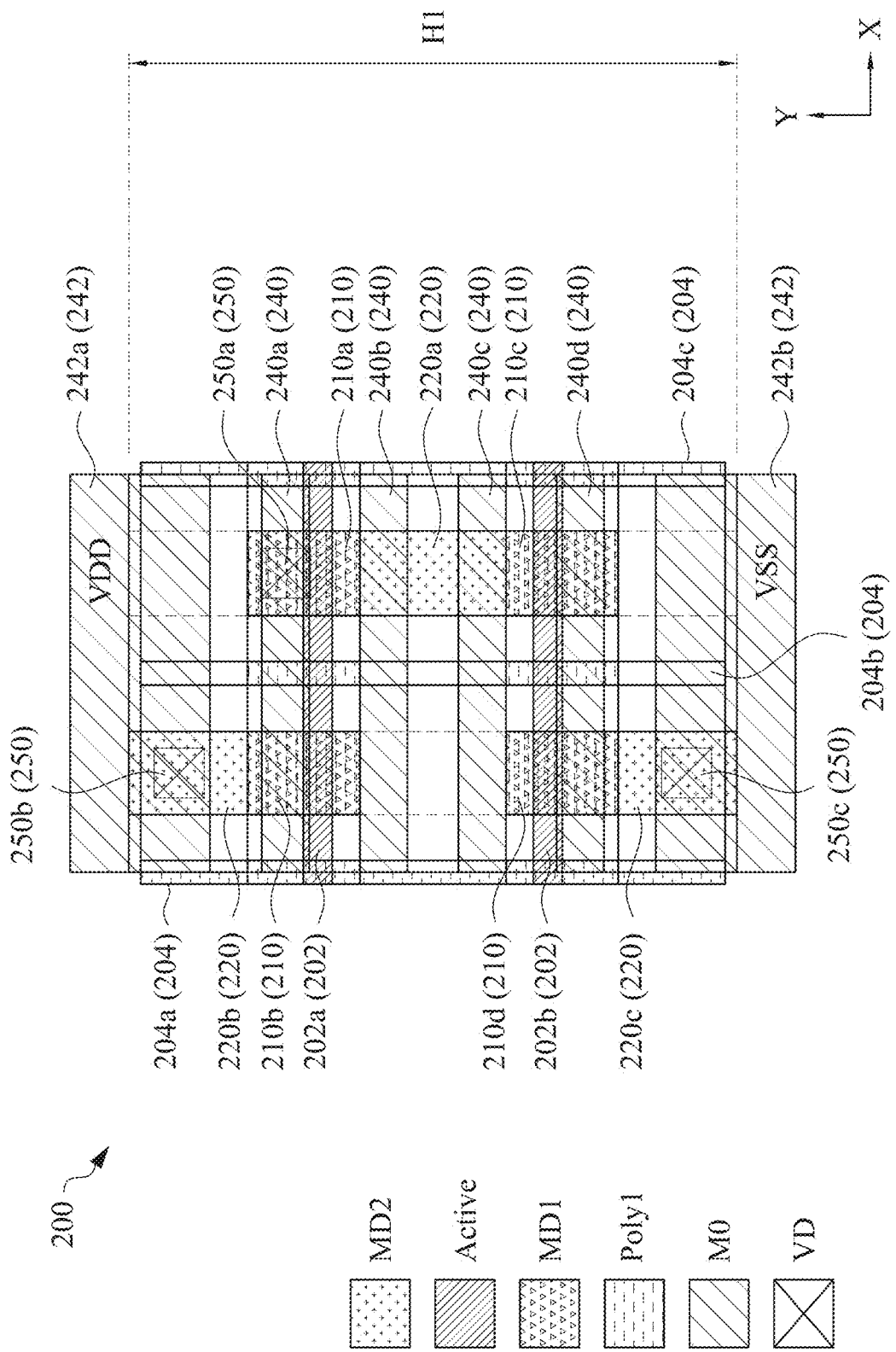
FIGS. 2A-2C are diagrams of a layout design of an integrated circuit, in accordance with some embodiments.
Figure 2B:
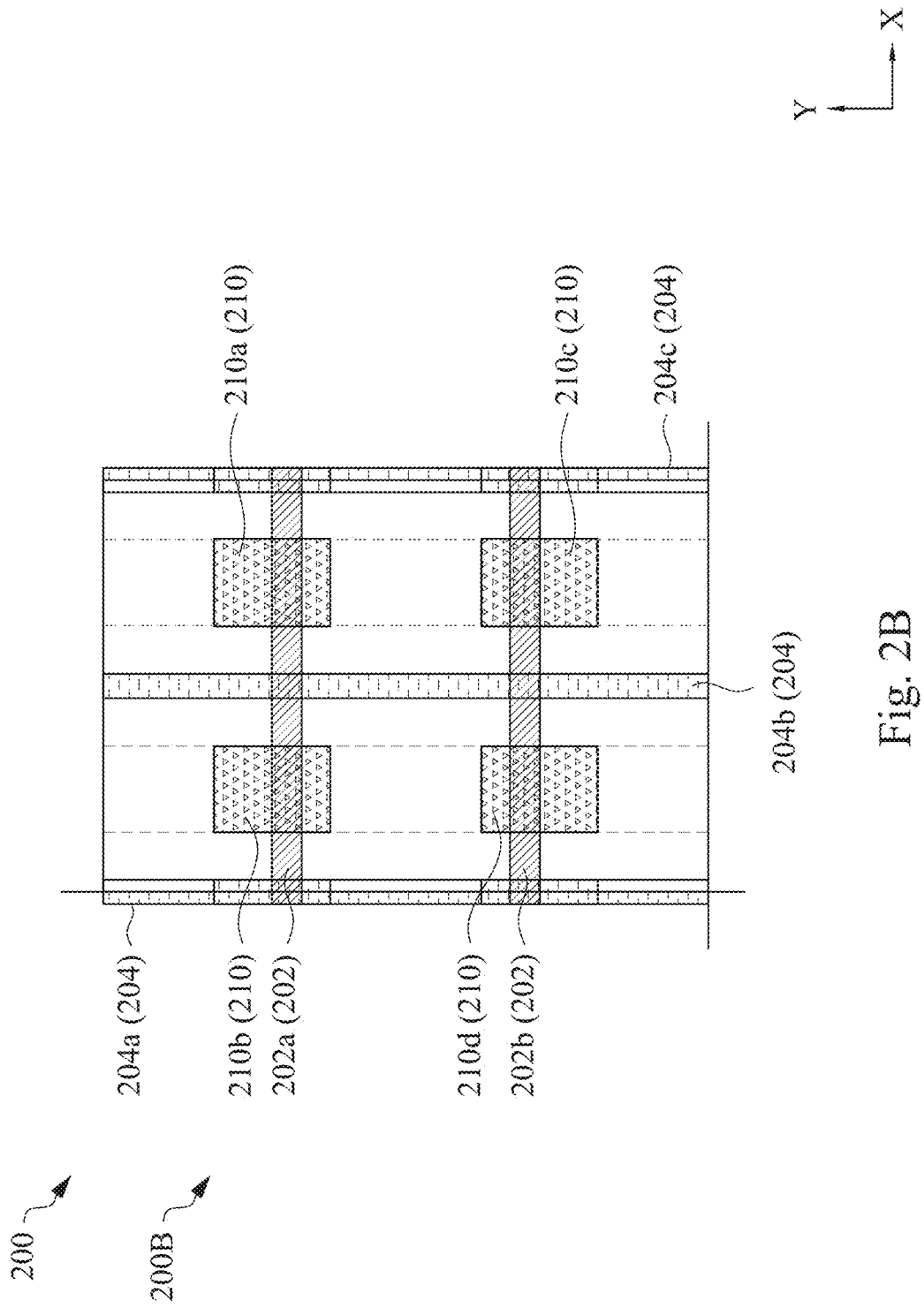
Figure 2C:
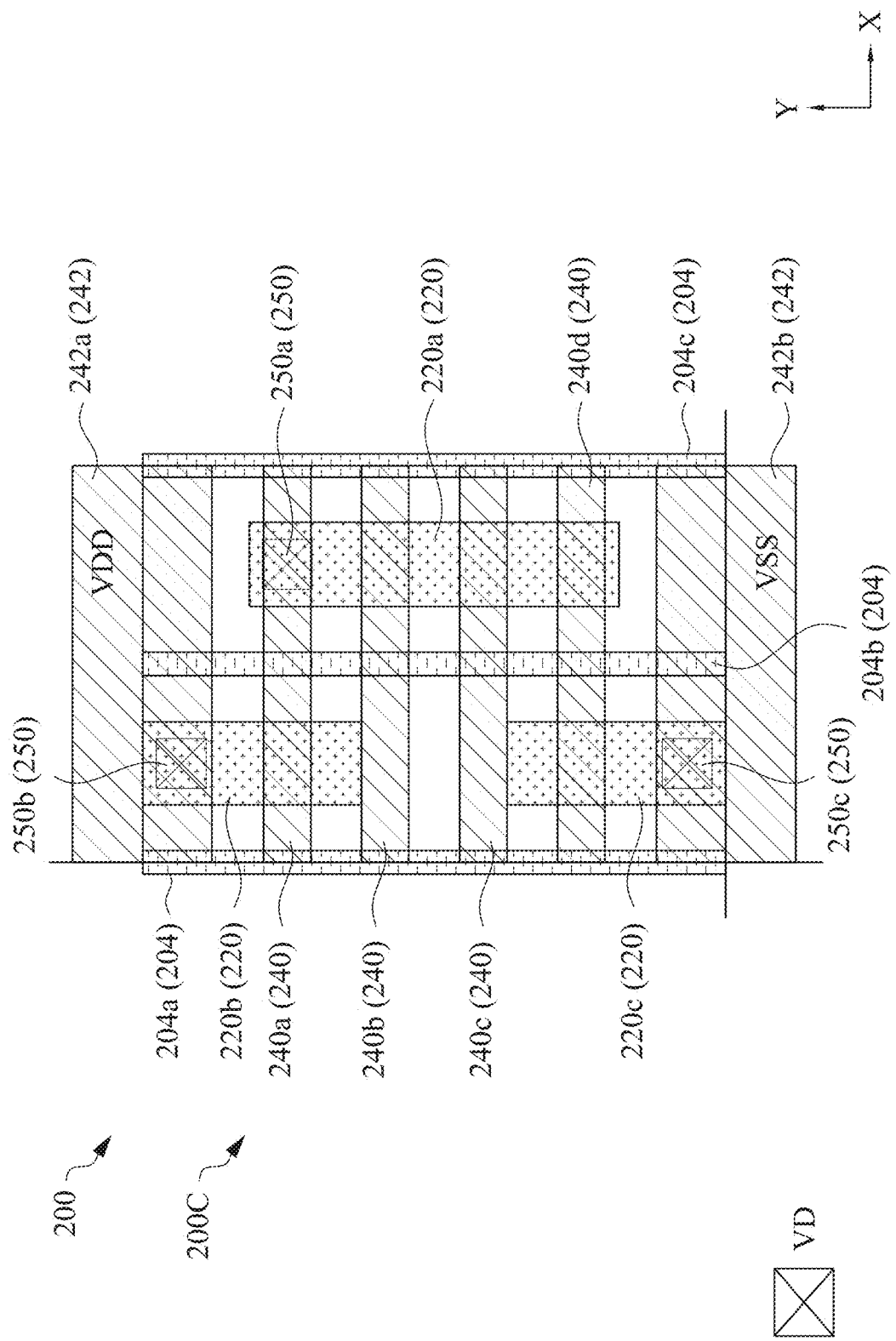

FIGS. 2A-2C are diagrams of a layout design 200 of an integrated circuit, in accordance with some embodiments. Layout design 200 is a layout diagram of integrated circuit 100 of FIG. 1.

FIG. 2A is a diagram of a layout design 200. For ease of illustration, some of the labeled elements of FIG. 2A are not labelled in FIGS. 2B-2C. In some embodiments, FIGS. 2A-2C include additional elements not shown in FIGS. 2A-2C.

FIGS. 2B-2C are diagrams of a corresponding portion 200B-200C of layout design 200 of FIG. 2A, simplified for ease of illustration. Portion 200B includes one or more features of layout design 200 of FIG. 2A of the active (OD) level, the POLY1 level and the MD1 level of layout design 200. Portion 200C includes one or more features of layout design 200 of FIG. 2A of the POLY1 level, the MD2 level, the VD level and the M0 level of layout design 200. Layout design 200 is usable to manufacture integrated circuit 100 of FIG. 1 or integrated circuit 300 of FIG. 3. Components that are the same or similar to those in each of FIGS. 2-15 are given the same reference numbers, and detailed description thereof is thus omitted.

Layout design 200 includes active region layout patterns 202a and 202b (collectively referred to as a "set of active region layout patterns 202") extending in a first direction X. Active region layout patterns 202a, 202b of the set of active region layout patterns 202 are separated from one another in a second direction Y different from the first direction X. The set of active region layout patterns 202 is usable to manufacture a corresponding set of active regions 302 (FIG. 3) of integrated circuit 300. In some embodiments, active region layout pattern 202a, 202b of the set of active region layout patterns 202 is usable to manufacture corresponding active regions 302a, 302b of the set of active regions 302 (FIG. 3) of integrated circuit 300. In some embodiments, the set of active region layout patterns 202 is referred to as an oxide diffusion (OD) region which defines the source or drain diffusion regions of integrated circuit 300. In some embodiments, active region layout pattern 202b of the set of active region layout patterns 202 is usable to manufacture source and drain regions of NMOS transistor N1-1, and active region layout pattern 202b of the set of active region layout patterns 202 are usable to manufacture source and drain regions of PMOS transistor P1-1 of integrated circuit 100 (FIG. 1). In some embodiments, the set of active region layout patterns 202 is located on a first layout level. In some embodiments, the first layout level corresponds to an active level or an OD level of one or more of layout designs 200, 500, 800, 1100 (FIGS. 2, 5, 8, 11) or integrated circuit 300, 600, 900 or 1200-1200' (FIGS. 3, 6, 9, 12A-12D).

Layout design 200 further includes at least gate layout pattern 204a, 204b or 204c (collectively referred to as a "set of gate layout patterns 204") extending in the second direction Y. The set of gate layout patterns 204 of layout design 200 and integrated circuit 300 have a contact poly pitch (CPP) of 2.

Each of the layout patterns of the set of gate layout patterns 204 is separated from an adjacent layout pattern of the set of gate layout patterns 204 in the first direction X by a first pitch (not labelled). The set of gate layout patterns 204 is usable to manufacture a corresponding set of gates 304 (FIG. 3) of integrated circuit 300. In some embodiments, gate layout pattern 204b of the set of gate layout patterns 204 is usable to manufacture corresponding gate 304b of the set of active regions 302 (FIG. 3) of integrated circuit 300.

The set of gate layout patterns 204 are positioned on a first portion of a second layout level. In some embodiments, the first portion of the second layout level is different from the first layout level. In some embodiments, the first portion of the second layout level corresponds to a POLY layer of one or more of layout designs 200, 500, 800, 1100A-1100G (FIGS. 2A-2C, 5, 8, 11A-11G) or integrated circuit 300, 600, 900, 1200-1200' (FIGS. 3, 6A, 9, 12A-12D).

The set of active region layout patterns 202 is below the set of gate layout patterns 204. Gate layout pattern 204b is usable to manufacture the gate terminal of PMOS transistor P1-1 and the gate terminal of NMOS transistor N1-1 of FIG. 1. Other configurations, arrangements on other layout levels or quantities of patterns in the set of gate layout patterns 204 are within the scope of the present disclosure.

Figure 12A:
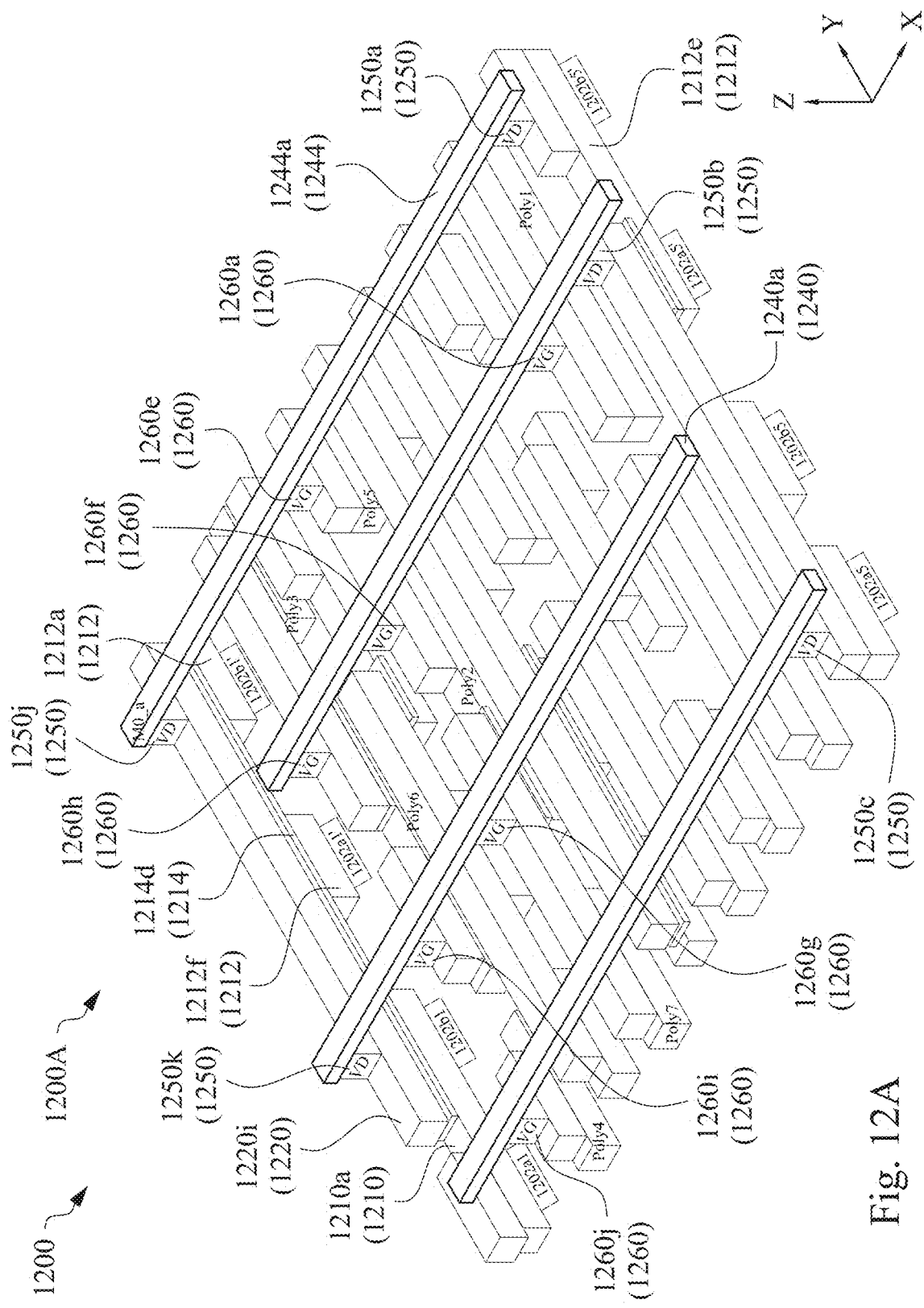
FIGS. 12A-12B are a perspective view of a diagram of an integrated circuit, in accordance with some embodiments.
Figure 12B:
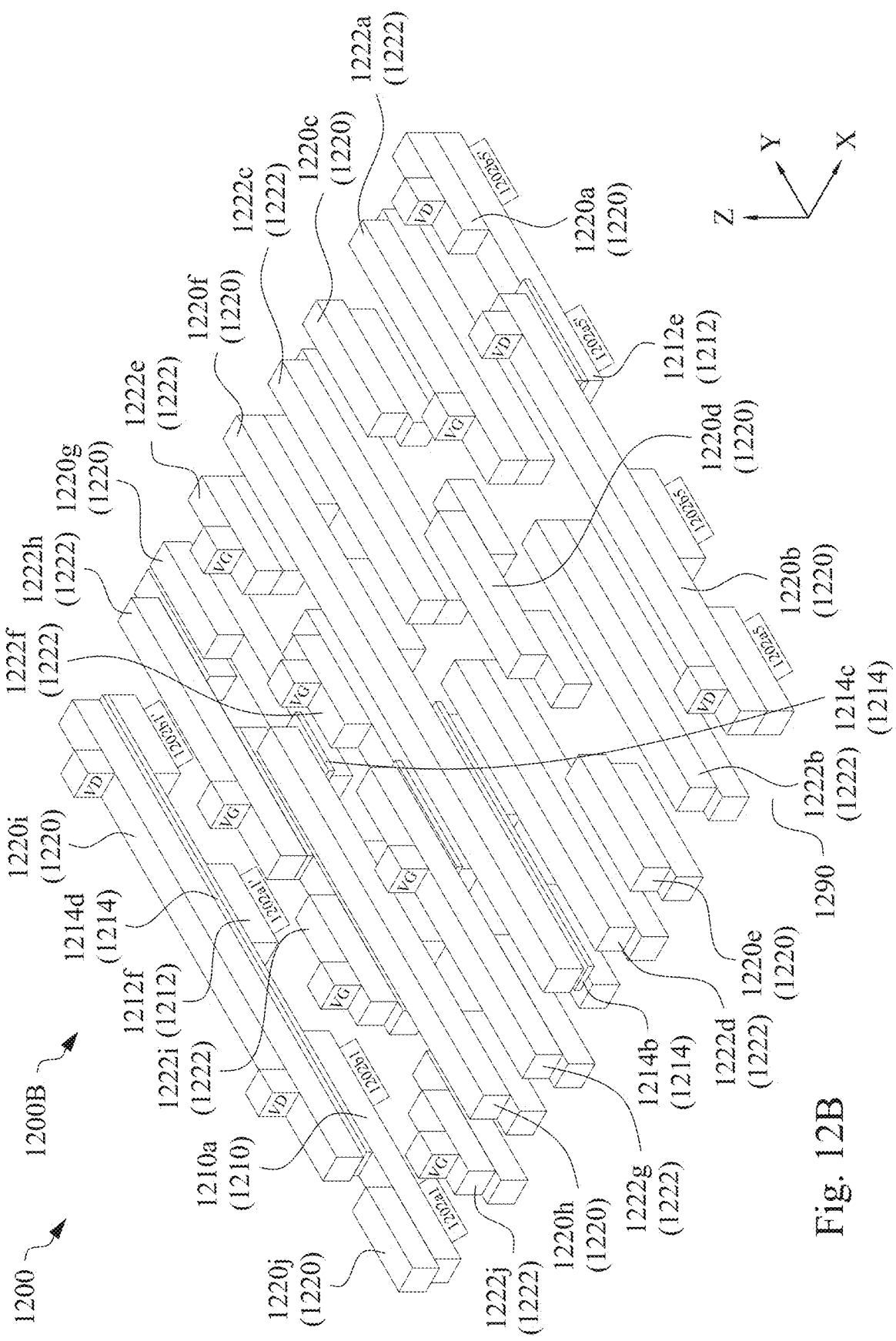
Figure 13:
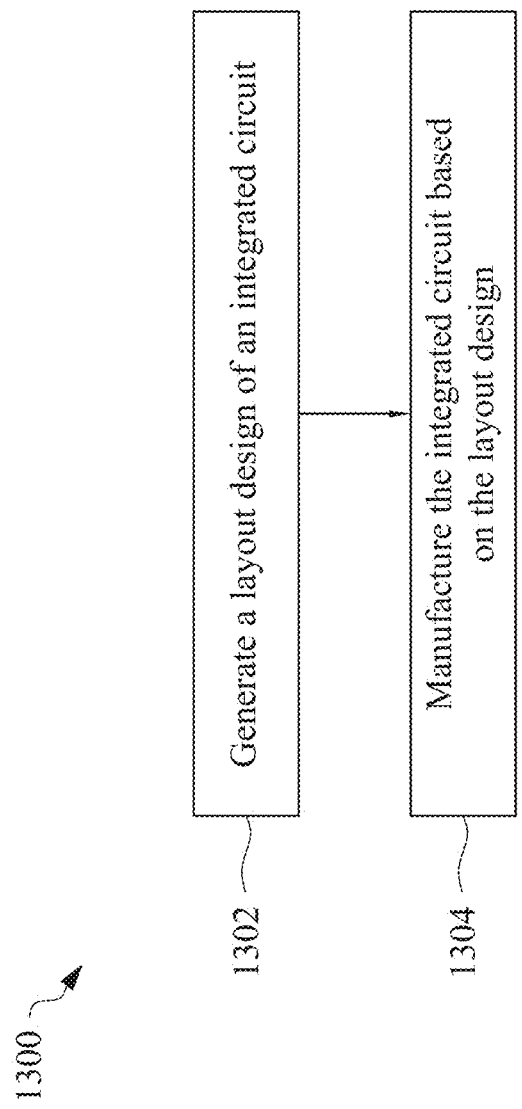
FIG. 13 is a flowchart of a method of manufacturing an integrated circuit, in accordance with some embodiments.

In some embodiments, one or more cut feature layout patterns (not shown) overlap at least one of the set of gate layout patterns 204 are not shown in layout design 200 for brevity. In some embodiments, the one or more cut feature layout patterns (not shown) identify a cut region of the set of gates 304, 604 (FIG. 6A), 904 (FIG. 9) or 1204 (FIGS. 12A-12B) removed during manufacturing, e.g., during operation 1304 of method 1300 (FIG. 13). In some embodiments, one or more cut feature layout patterns (not shown) are positioned on the second layout level (POLY1).

Other configurations or quantities of patterns in the set of gate layout patterns 204 are within the scope of the present disclosure.

Layout design 200 further includes at least metal over diffusion layout pattern 210a, 210b, 210c or 210d (collectively referred to as a "set of metal over diffusion layout patterns 210") extending in the second direction Y. At least one of the layout patterns of the set of metal over diffusion layout patterns 210 overlaps the set of active region layout patterns 202. The layout patterns of the set of metal over diffusion layout patterns 210 are separated from an adjacent layout pattern of the set of metal over diffusion layout patterns 210 in at least the first direction X or the second direction Y. In some embodiments, the set of metal over diffusion layout patterns 210 is located on a second portion of the second layout level. In some embodiments, the second portion of the second layout level corresponds to a metal over diffusion one (MD1) level of one or more of layout designs 200, 500, 800, 1100A-1100G (FIGS. 2A-2C, 5, 8, 11A-11G) or integrated circuit 300, 600, 900, 1200-1200' (FIGS. 3, 6A, 9, 12A-12D). In some embodiments, the second layout level includes an MD1 portion and a POLY1 portion. The set of metal over diffusion layout patterns 210 is usable to manufacture a corresponding set of contacts 310 (FIG. 3) of integrated circuit 300. In some embodiments, metal over diffusion layout patterns 210a, 210b, 210c, 210d of the set of metal over diffusion layout patterns 210 is usable to manufacture corresponding contacts 310a, 310b, 310c, 310d of the set of contacts 310 (FIG. 3) of integrated circuit 300.

In some embodiments, each of the layout patterns of the set of metal over diffusion layout patterns 210 have a regular layout pattern. In some embodiments, regular layout patterns are layout patterns that are aligned in at least a single direction with respect to each other. In some embodiments, regular layout patterns are layout patterns aligned in at least the first direction X or the second direction Y.

Other configurations, arrangements on other layout levels or quantities of patterns in the set of metal over diffusion layout patterns 210 are within the scope of the present disclosure.

Layout design 200 further includes at least metal over diffusion layout pattern 220a, 220b or 220c (collectively referred to as a "set of metal over diffusion layout patterns 220") extending in the second direction Y. At least one of the layout patterns of the set of metal over diffusion layout patterns 220 overlaps at least one of the set of active region layout patterns 202 or at least one of the set of metal over diffusion layout patterns 210. Metal over diffusion layout pattern 220a overlaps metal over diffusion layout patterns 210a and 210c. Metal over diffusion layout pattern 220b, 220c overlap corresponding metal over diffusion layout patterns 210b, 210d.

The layout patterns of the set of metal over diffusion layout patterns 220 are separated from an adjacent layout pattern of the set of metal over diffusion layout patterns 220 in at least the first direction X or the second direction Y. The set of metal over diffusion layout patterns 220 is located on a third layout level. In some embodiments, the third layout level is different from the first layout level and the second layout level. In some embodiments, the third layout level corresponds to a metal over diffusion two (MD2) level of one or more of layout designs 200, 500, 800 or 1100A-1100G (FIGS. 2A-2C, 5, 8 or 11A-11G) or integrated circuit 300, 600, 900, 1200-1200' (FIGS. 3, 6A, 9 or 12A-12D). In some embodiments, the MD2 level is above the MD1 level or the POLY1 level. The set of metal over diffusion layout patterns 220 is usable to manufacture a corresponding set of contacts 320 (FIG. 3) of integrated circuit 300. In some embodiments, metal over diffusion layout patterns 220a, 220b, 220c of the set of metal over diffusion layout patterns 220 is usable to manufacture corresponding contacts 320a, 320b, 320c of the set of contacts 320 (FIG. 3) of integrated circuit 300.

In some embodiments, at least metal over diffusion layout pattern 210a or a portion of metal over diffusion layout pattern 220a is usable to manufacture the drain terminal of PMOS transistor P1-1 of FIG. 1. In some embodiments, at least metal over diffusion layout pattern 210c or a portion of metal over diffusion layout pattern 220a is usable to manufacture the drain terminal of NMOS transistor N1-1 of FIG. 1. In some embodiments, metal over diffusion layout pattern 210b is usable to manufacture the source terminal of PMOS transistor P1-1 of FIG. 1, and metal over diffusion layout pattern 210d is usable to manufacture the source terminal of NMOS transistor N1-1 of FIG. 1.

Other configurations, arrangements on other layout levels or quantities of patterns in the set of metal over diffusion layout patterns 220 are within the scope of the present disclosure.

Layout design 200 further includes at least conductive feature layout pattern 240a, 240b, 240c or 240d (collectively referred to as a "set of conductive feature layout patterns 240") extending in the first direction X. The set of conductive feature layout patterns 240 is usable to manufacture a corresponding set of conductive structures 340 (FIG. 3) of integrated circuit 300. In some embodiments, conductive feature layout patterns 240a, 240b, 240c, 240d of the set of conductive feature layout patterns 240 is usable to manufacture corresponding conductive features 340a, 340b (not shown), 340c (not shown), 340d (not shown) of the set of conductive features 340 (FIG. 3) of integrated circuit 300.

The set of conductive feature layout patterns 240 overlap at least the set of metal over diffusion layout patterns 210 or the set of metal over diffusion layout patterns 220. The set of conductive feature layout patterns 240 is located on a fourth layout level. In some embodiments, the fourth layout level is different from at least the first layout level, the second layout level or the third layout level. In some embodiments, the fourth layout level corresponds to a metal zero (M0) layer of one or more of layout designs 200, 500, 800, 1100A-1100G (FIGS. 2A-2C, 5, 8, 11A-11G) or integrated circuit 300, 600, 900, 1200-1200' (FIGS. 3, 6A, 9, 12A-12D). Other layout levels are within the scope of the present disclosure. Other configurations, arrangements on other layout levels or quantities of patterns in the set of conductive feature layout patterns 240 are within the scope of the present disclosure.

Figure 3:
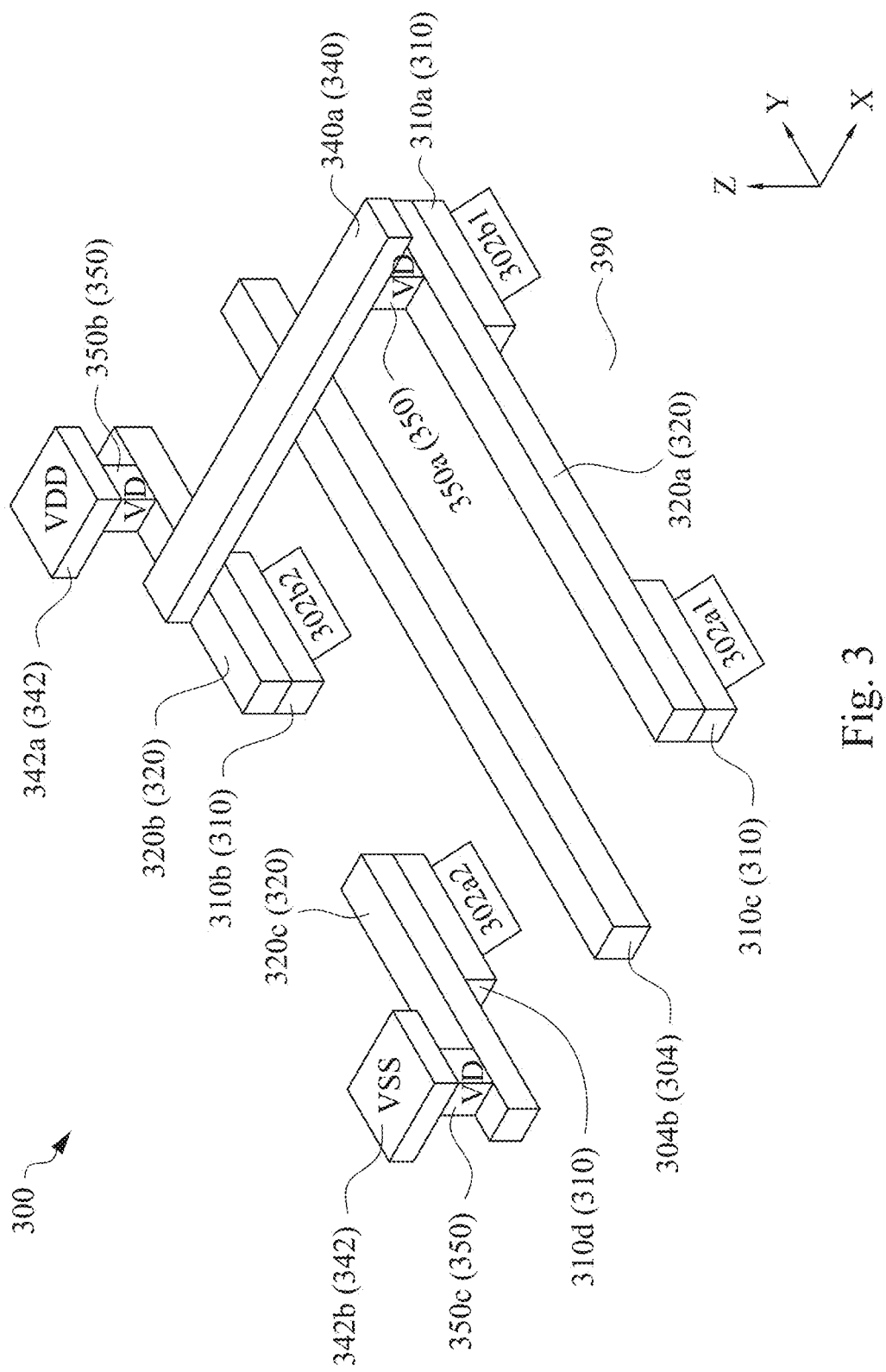
FIG. 3 is a perspective view of a diagram of an integrated circuit, in accordance with some embodiments.

Layout design 200 further includes one or more power rail layout patterns 242a or 242b (collectively referred to as a "set of power rail layout patterns 242") extending in the first direction X, and being located on the fourth layout level. The set of power rail layout patterns 242 is usable to manufacture a corresponding set of power rails 342 of integrated circuit 300 (FIG. 3). In some embodiments, power rail layout patterns 242a, 242b of the set of power rail layout patterns 242 is usable to manufacture corresponding power rails 342a, 342b of the set of power rails 342 (FIG. 3) of integrated circuit 300.

In some embodiments, the set of power rails 342 is configured to provide a first supply voltage of a voltage supply VDD or second supply voltage of a reference voltage supply VSS to the integrated circuit, such as integrated circuit 300. In some embodiments, each power rail layout pattern of the set of power rail layout patterns 242 is located along a corresponding edge of a standard cell of layout design 300. Other configurations, arrangements on other layout levels or quantities of patterns in the set of power rail layout patterns 242 are within the scope of the present disclosure.

Layout design 200 further includes at least via layout pattern 250a, 250b or 250c (collectively referred to as a "set of via layout patterns 250"). The set of via layout patterns 250 is usable to manufacture a corresponding set of vias 350 (FIG. 3). In some embodiments, via layout patterns 250a, 250b, 250c of the set of via layout patterns 250 is usable to manufacture corresponding vias 350a, 350b, 350c of the set of vias 350 (FIG. 3) of integrated circuit 300. In some embodiments, the set of via layout patterns 250 are between the set of conductive feature layout patterns 240 or the set of power rail layout patterns 242 and the set of metal over diffusion layout patterns 220.

Set of via layout patterns 250 are positioned at a via over diffusion (VD) level or a tall via over diffusion (VDT) of one or more of layout designs 200, 500, 800 or 1100A-1100G (FIGS. 2A-2C, 5, 8 or 11A-11G) or integrated circuit 300, 600, 900, 1200-1200' (FIGS. 3, 6A, 9 or 12A-12D). In some embodiments, the VD level is between the M0 level and the MD2 level. In some embodiments, the VDT level is between the M0 level and the MD1 level. In some embodiments, the MD2 level is above the MD1 level or the POLY1 level. In some embodiments, the VDT level is between the fourth layout level and the second portion of the second layout level (e.g., MD1). In some embodiments, the VD level is between the fourth layout level and the third layout level (e.g., MD2). Other layout levels are within the scope of the present disclosure.

Via layout patterns 250b, 250c are between corresponding power rail layout patterns 242a, 242b and corresponding metal over diffusion layout patterns 220b, 220c. Via layout pattern 250a is between conductive feature layout pattern 240a and metal over diffusion layout patterns 220a. In some embodiments, at least one layout pattern of the set of metal over diffusion layout patterns 220 is not included in layout design 200; therefore a corresponding via layout pattern of the set of via layout patterns 250, over the removed layout pattern of the set of metal over diffusion layout patterns 220, is positioned at the VDT level. Other configurations, arrangements on other layout levels or quantities of patterns in the set of via layout patterns 250 are within the scope of the present disclosure.

Layout design 200, 500 (FIG. 5) and 800 (FIG. 8) have a height H1 in the second direction Y. In some embodiments, layout design 200, 500 (FIG. 5) and 800 (FIG. 8) are referred to as a single height standard cell.

Integrated Circuit

FIG. 3 is a perspective view of a diagram of an integrated circuit 300, in accordance with some embodiments.

Integrated circuit 300 is manufactured by layout design 200. Integrated circuit 300 is an embodiment of a portion of integrated circuit 100.

Structural relationships including alignment, lengths and widths, as well as configurations of integrated circuit 300 are similar to the structural relationships and configurations of layout design 200 of FIG. 2, and similar detailed description will not be described in FIG. 3 for brevity.

Integrated circuit 300 includes the set of active regions 302, the set of gates 304, the set of contacts 310, the set of contacts 320, the set of conductive features 340, the set of rails 342 and the set of vias 350. However, for ease of illustration, integrated circuit 300 does not show at least one of the members in the set of gates 304, the set of contacts 310, the set of contacts 320, the set of conductive features 340, the set of power rails 342 or the set of vias 350.

Gate 304b of the set of gates 304 extends in the second direction Y. Gate 304b of the set of gates 304 corresponds to the gate terminal of PMOS transistor P1-1 and the gate terminal of NMOS transistor N1-1 of FIG. 1.

The set of active regions 302 include active regions 302a and 302b. Active region 302a includes active region 302a1 and active region 302a2. Active region 302b includes active region 302b1 and active region 302b2.

In some embodiments, active region 302a1 corresponds to the drain of NMOS transistor N1-1, active region 302a2 corresponds to the source of NMOS transistor N1-1, active region 302b1 corresponds to the drain of PMOS transistor N1-1, and active region 302b2 corresponds to the source of PMOS transistor P1-1. Other configurations or arrangements in the set of active regions 302 are within the scope of the present disclosure.

Contacts 310a, 310b, 310c, 310d of the set of contacts 310 extend in the second direction Y, and overlap corresponding active regions 302b1, 302b2, 302a1, 302a2 of the set of active regions 302. Contacts 310a, 310b, 310c, 310d of the set of contacts 310 are electrically coupled to corresponding active regions 302b1, 302b2, 302a1, 302a2 of the set of active regions 302.

Contact 320b, 320c of the set of contacts 320 extend in the second direction Y, and overlap corresponding contacts 310b, 310d of the set of contacts 310. Contacts 320b, 320c of the set of contacts 320 are electrically coupled to corresponding contacts 310b, 310d of the set of contacts 310.

Contact 320a of the set of contacts 320 extends in the second direction Y, and overlaps contact 310a and contact 310c of the set of contacts 310 thereby providing an electrical connection between contact 310a and contact 310c of the set of contacts 310. In some embodiments, contact 320a or other contacts similar to contact 320a are referred to as "MD flyer" portions as these contacts overlap or extend over at least a pair of contacts in the MD1 level.

In some embodiments, at least one contact in the set of contacts 320, 620 (FIGS. 6A-6B), 920 (FIG. 9) includes one or more layers of a conductive material. In some embodiments, the conductive material includes Tungsten, Cobalt, Ruthenium, Copper, or the like or combinations thereof.

In some embodiments, the active region 302b2 (e.g., source of PMOS transistor P1-1) is electrically coupled to the voltage supply VDD. For example, in some embodiments, active region 302b2 is electrically coupled to contact 310b of the set of contacts 310, contact 310b of the set of contacts 310 is electrically coupled to contact 320b of the set of contacts 320, and contact 320b of the set of contacts 320 is electrically coupled to power rail 342a by via 350b. In some embodiments, power rail 342a is coupled to voltage supply VDD.

In some embodiments, the active region 302a2 (e.g., source of NMOS transistor N1-1) is electrically coupled to the reference voltage supply VSS. For example, in some embodiments, active region 302a2 is electrically coupled to contact 310d of the set of contacts 310, contact 310d of the set of contacts 310 is electrically coupled to contact 320c of the set of contacts 320, and contact 320c of the set of contacts 320 is electrically coupled to power rail 342b by via 350c. In some embodiments, power rail 342b is coupled to the reference voltage supply VSS.

In some embodiments, contact 320a of the set of contacts 320 is configured to provide an electrical connection between a first portion (e.g., drain) of a transistor (e.g., NMOS N1-1) and a second portion (e.g., drain) of another transistor (e.g., PMOS P1-1). For example, in some embodiments, the active region 302a1 corresponds to the drain of NMOS transistor N1-1, and the active region 302b1 corresponds to the drain of PMOS transistor N1-1, and are electrically coupled together by at least contact 320a of the set of contacts 320. In some embodiments, active region 302a1 is electrically coupled to contact 310c of the set of contacts 310, contact 310c of the set of contacts 310 is electrically coupled to contact 320a of the set of contacts 320, contact 320a of the set of contacts 320 is electrically coupled to contact 310a of the set of contacts 310, and contact 310a of the set of contacts 310 is electrically coupled to active region 302b1.

In some embodiments, by providing an electrical connection between active regions 302a1 and 302b1 of the set of active regions 302 using contact 320a of the set of contacts 320 in the MD2 layer, other metallization levels (e.g., M0, M1, etc.) can be utilized for additional routing resources resulting in integrated circuit 300 having a smaller area and standard cell than other approaches.

Conductive features 340a of the set of conductive features 340 is electrically coupled to contact 320a by via 350a.

Integrated Circuit

Figure 4:
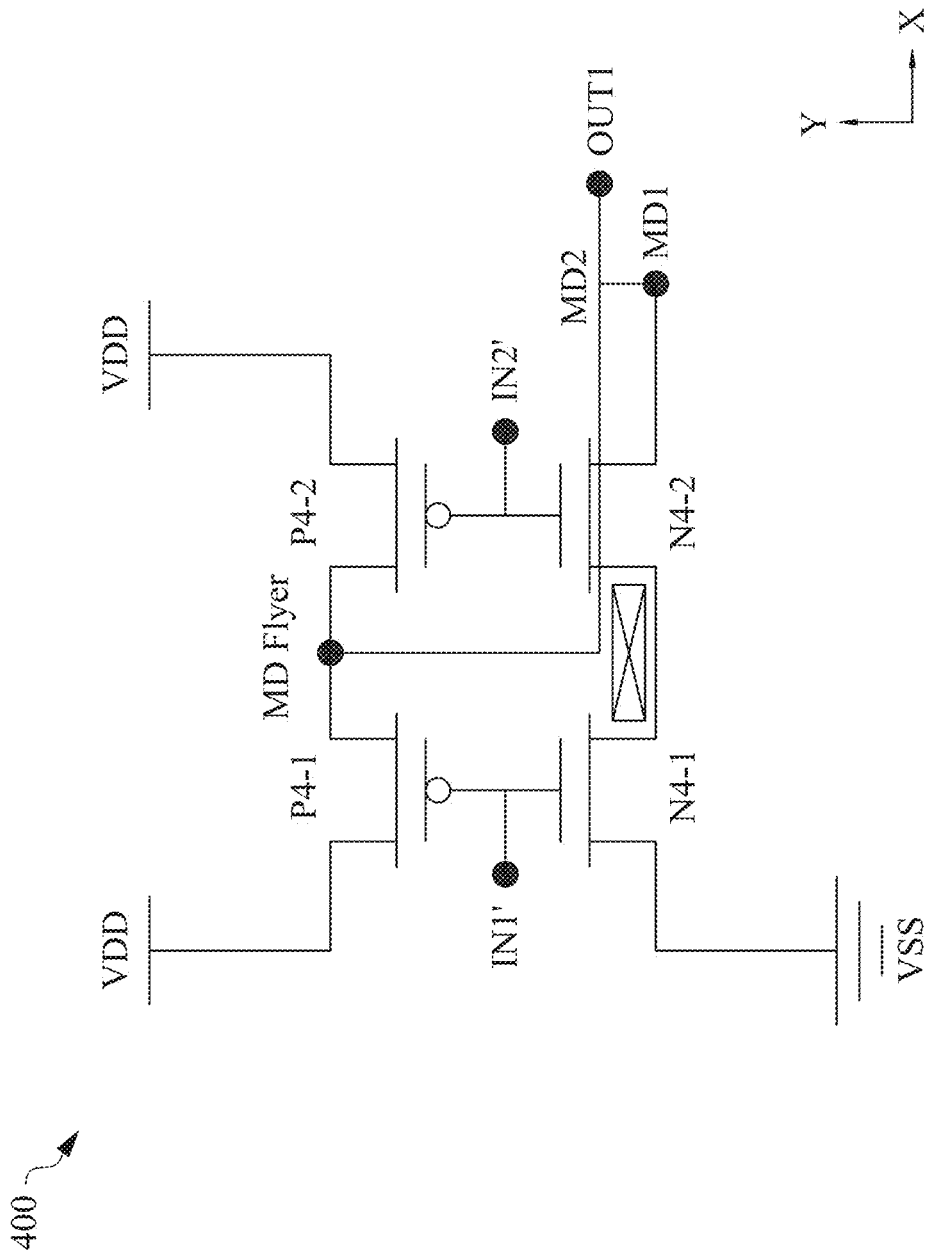
FIG. 4 is a circuit diagram of an integrated circuit, in accordance with some embodiments.

FIG. 4 is a circuit diagram of an integrated circuit 400, in accordance with some embodiments. In some embodiments, integrated circuit 400 is a NAND gate. A NAND gate is used for illustration, other types of circuits are within the scope of the present disclosure.

Integrated circuit 400 includes PMOS transistors P4-1 and P4-2 coupled to NMOS transistors N4-1 and N4-2.

A gate terminal of PMOS transistor P4-1 and NMOS transistor N4-1 are coupled together, and are configured as an input node IN1'. A gate terminal of PMOS transistor P4-2 and NMOS transistor N4-2 are coupled together, and are configured as an input node IN2'.

A source terminal of PMOS transistor P4-1 and a source terminal of PMOS transistor P4-2 are coupled to the voltage supply VDD. A source terminal of NMOS transistor N4-1 is coupled to the reference voltage supply VSS. A source terminal of NMOS transistor N4-2 and a drain terminal of NMOS transistor N4-1 are coupled to each other.

A drain terminal of PMOS transistor P4-1, a drain terminal of PMOS transistor P4-2, and a drain terminal of NMOS transistor N4-2 are coupled to each other, and are configured as an output node OUT1.

Layout Design of an Integrated Circuit

Figure 5:
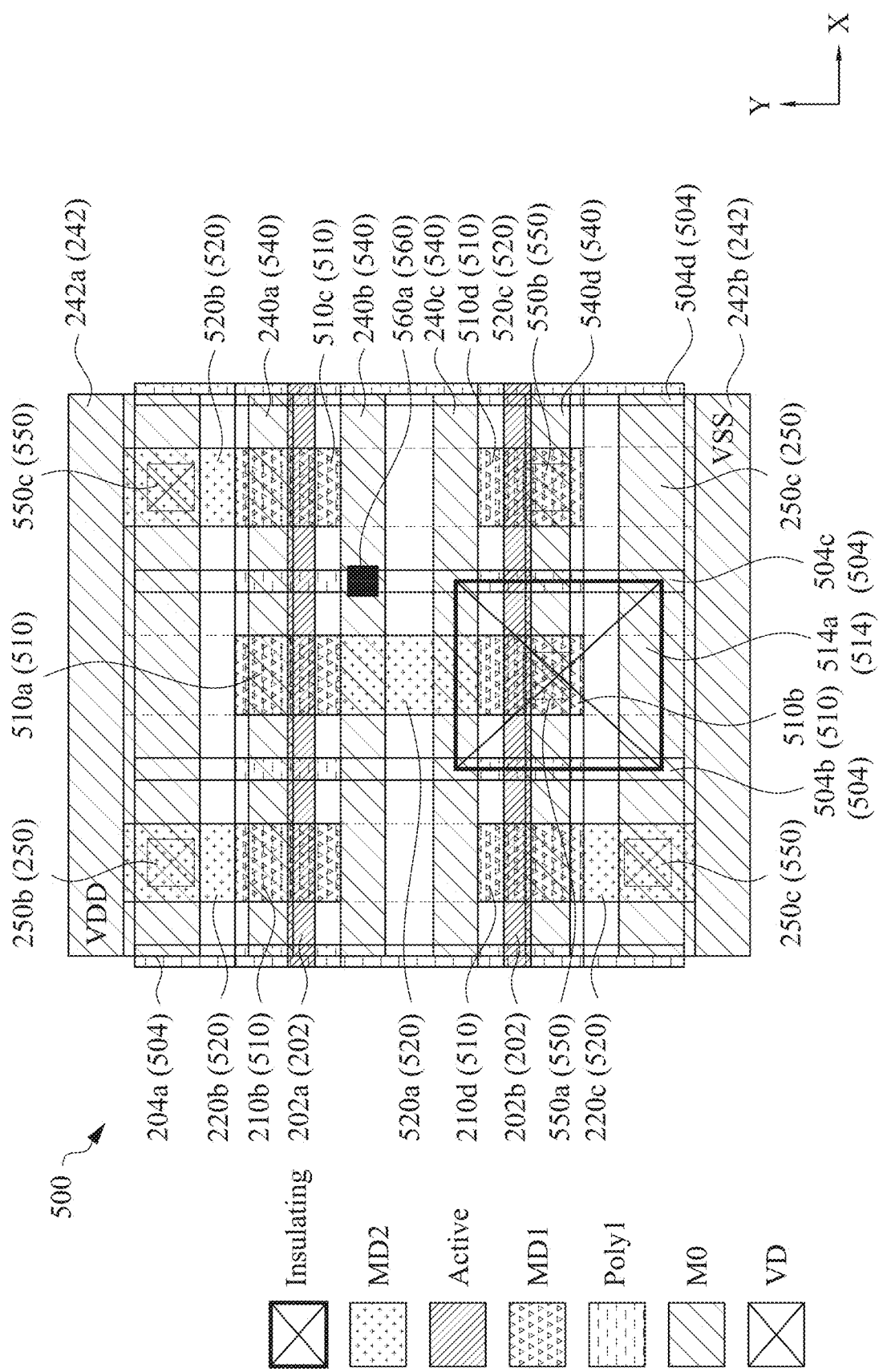
FIG. 5 is a diagram of a layout design of an integrated circuit, in accordance with some embodiments.

FIG. 5 is a diagram of a layout design 500 of an integrated circuit, in accordance with some embodiments.

Layout design 500 is a variation of layout design 200 (FIG. 2). For example, layout design 500 illustrates an example where an insulating layer layout pattern 514a is positioned between a metal over diffusion layout pattern 520a and a metal over diffusion layout pattern 510b.

Layout design 500 is usable to manufacture an integrated circuit similar to integrated circuit 400 of FIG. 4 or integrated circuit 600 of FIG. 6.

Layout design 500 includes the set of active region layout patterns 202, the set of rail layout patterns 242, a set of gate layout patterns 504, a set of metal over diffusion layout patterns 510, an insulating layer layout pattern 514a (collectively referred to as a "a set of insulating layer layout patterns 514"), a set of metal over diffusion layout patterns 520, a set of conductive feature layout patterns 540, and a set of via layout patterns 550 and 560.

In comparison with layout design 200 of FIG. 2, the set of gate layout patterns 504 of layout design 500 replace the set of gate layout patterns 204. The set of gate layout patterns 504 of layout design 500 and integrated circuit 600 have a CPP of 3. The set of gate layout patterns 504 are similar to the set of gate layout patterns 204, and similar detailed description is therefore omitted. Members of the set of gate layout patterns 504 are similar to the corresponding members of the set of gate layout patterns 204, and similar detailed description is therefore omitted.

Set of gate layout patterns 504 includes at least gate layout pattern 204a, 504b, 504c or 504d. The set of gate layout patterns 504 is usable to manufacture a corresponding set of gates 604 (FIG. 6) of integrated circuit 600. In some embodiments, gate layout patterns 504b, 504c of the set of gate layout patterns 504 are usable to manufacture corresponding gates 304b, 604c of the set of gates 604 (FIG. 6) of integrated circuit 600.

Gate layout pattern 504c replaces gate layout pattern 204c, and similar detailed description is therefore omitted. In comparison with gate layout pattern 204c of FIG. 3, gate layout pattern 504c is not positioned along the edge of layout design 500. Gate layout pattern 504d is positioned along the edge of layout design 500. In some embodiments, for at least reasons including being positioned along the edge of the layout design (e.g., layout design 500), the features of gate layout pattern 504d are similar to gate layout pattern 204c, and similar detailed description is therefore omitted.

Gate layout pattern 504b is usable to manufacture the gate terminal of PMOS transistor P4-1 and the gate terminal of NMOS transistor N4-1 of FIG. 4, gate layout pattern 504c is usable to manufacture the gate terminal of PMOS transistor P4-2 and the gate terminal of NMOS transistor N4-2 of FIG. 4. Other configurations, arrangements on other layout levels or quantities of patterns in the set of gate layout patterns 504 are within the scope of the present disclosure.

In comparison with layout design 200 of FIG. 2, the set of metal over diffusion layout patterns 510 replaces the set of metal over diffusion layout patterns 210. The set of metal over diffusion layout patterns 510 are similar to the set of metal over diffusion layout patterns 204, and similar detailed description is therefore omitted. Members of the set of metal over diffusion layout patterns 510 are similar to the corresponding members of the set of metal over diffusion layout patterns 210, and similar detailed description is therefore omitted. In some embodiments, each of the layout patterns of the set of metal over diffusion layout patterns 510 have a regular layout pattern. In some embodiments, each of the layout patterns of the set of metal over diffusion layout patterns 510 have a same area as one another.

Set of metal over diffusion layout patterns 510 includes at least metal over diffusion layout pattern 210b, 210d, 510a, 510b, 510c or 510d. The set of metal over diffusion layout patterns 510 is usable to manufacture a corresponding set of contacts 610 (FIG. 6) of integrated circuit 600.

In some embodiments, metal over diffusion layout patterns 210b, 210d, 510a, 510b, 510c, 510d of the set of metal over diffusion layout patterns 510 are usable to manufacture corresponding contacts 310b, 310d, 610a, 610b, 610c, 610d of the set of contacts 610 (FIG. 6) of integrated circuit 600.

Metal over diffusion layout patterns 510a, 510b replace corresponding metal over diffusion layout patterns 210a, 210*b* of FIG. 2, and similar detailed description is therefore omitted. In some embodiments, metal over diffusion layout patterns 510*c*, 510*d* are mirror images of corresponding metal over diffusion layout patterns 210*b*, 210*d* with respect to the second direction Y, and similar detailed description is therefore omitted.

Other configurations, arrangements on other layout levels or quantities of patterns in the set of metal over diffusion layout patterns 510 are within the scope of the present disclosure.

In comparison with layout design 200 of FIG. 2, the set of metal over diffusion layout patterns 520 replaces the set of metal over diffusion layout patterns 220. The set of metal over diffusion layout patterns 520 are similar to the set of metal over diffusion layout patterns 220, and similar detailed description is therefore omitted. Members of the set of metal over diffusion layout patterns 520 are similar to the corresponding members of the set of metal over diffusion layout patterns 220, and similar detailed description is therefore omitted. In some embodiments, each of the layout patterns of the set of metal over diffusion layout patterns 520 have a regular layout pattern.

Set of metal over diffusion layout patterns 520 includes at least metal over diffusion layout pattern 220*b*, 220*c*, 520*a*, 520*b* or 520*c*. The set of metal over diffusion layout patterns 520 is usable to manufacture a corresponding set of contacts 620 (FIG. 6) of integrated circuit 600.

In some embodiments, metal over diffusion layout patterns 220*b*, 220*c*, 520*a*, 520*b*, 520*c* of the set of metal over diffusion layout patterns 520 are usable to manufacture corresponding contacts 320*b*, 320*c*, 620*a*, 620*b*, 620*c* of the set of contacts 620 (FIG. 6) of integrated circuit 600.

Metal over diffusion layout patterns 520*a* replaces corresponding metal over diffusion layout pattern 220*a* of FIG. 2, and similar detailed description is therefore omitted.

In some embodiments, metal over diffusion layout pattern 520*b* is a mirror image of corresponding metal over diffusion layout pattern 220*b* with respect to a central portion of layout design 500 in the second direction Y, and similar detailed description is therefore omitted.

In some embodiments, metal over diffusion layout pattern 520*c* overlaps active region layout pattern 202*b* and is over metal over diffusion layout pattern 510*d*.

Other configurations, arrangements on other layout levels or quantities of patterns in the set of metal over diffusion layout patterns 520 are within the scope of the present disclosure.

In some embodiments, at least metal over diffusion layout pattern 210*b* or a portion of metal over diffusion layout pattern 220*b* is usable to manufacture the source terminal of PMOS transistor P4-1 of FIG. 4. In some embodiments, at least metal over diffusion layout pattern 510*a* or a portion of metal over diffusion layout pattern 520*a* is usable to manufacture the drain terminal of PMOS transistor P4-1 or the drain terminal of PMOS transistor P4-2 of FIG. 4. In some embodiments, at least metal over diffusion layout pattern 510*c* or a portion of metal over diffusion layout pattern 520*b* is usable to manufacture the source terminal of PMOS transistor P4-2 of FIG. 4.

In some embodiments, at least metal over diffusion layout pattern 210*d* or a portion of metal over diffusion layout pattern 220*c* is usable to manufacture the source terminal of NMOS transistor N4-1 of FIG. 4. In some embodiments, at least metal over diffusion layout pattern 510*b* or a portion of metal over diffusion layout pattern 520*a* is usable to manufacture the drain terminal of NMOS transistor N4-1 or the source terminal of NMOS transistor N4-2 of FIG. 4. In some embodiments, at least metal over diffusion layout pattern 510*d* or a portion of metal over diffusion layout pattern 520*c* is usable to manufacture the drain terminal of NMOS transistor N4-2 of FIG. 4.

Insulating layer layout pattern 514*a* (collectively referred to as "a set of insulating layer layout patterns 514") extends in the second direction Y. At least one of the layout patterns of the set of insulating layer layout patterns 514 overlaps the set of active region layout patterns 202. In some embodiments, at least one of the layout patterns of the set of insulating layer layout patterns 514 is over at least one of the layout patterns of the set of metal over diffusion layout patterns 510. Insulating layer layout pattern 514*a* of the set of insulating layer layout patterns 514 is over metal over diffusion layout pattern 510*b* of the set of metal over diffusion layout patterns 510.

In some embodiments, at least one of the layout patterns of the set of insulating layer layout patterns 514 overlaps at least one of the layout patterns of the set of metal over diffusion layout patterns 510.

In some embodiments, at least one of the layout patterns of the set of insulating layer layout patterns 514 is below at least one of the layout patterns of the set of metal over diffusion layout patterns 520. Insulating layer layout pattern 514*a* of the set of insulating layer layout patterns 514 is below metal over diffusion layout pattern 520*a* of the set of metal over diffusion layout patterns 520. Insulating layer layout pattern 514*a* is between metal over diffusion layout pattern 520*a* and metal over diffusion layout pattern 510*b*.

In some embodiments, the set of metal over diffusion layout patterns 510 is located between the second portion of the second layout level and the third layout level. In some embodiments, the set of insulating layer layout patterns 514 is located between the MD2 portion and the MD1 portion. In some embodiments, the set of insulating layer layout patterns 514 is located between a gate (POLY2) portion (e.g., FIGS. 12A-12B) and a gate of the POLY1 portion.

The set of insulating layer layout patterns 514 is usable to manufacture the set of insulating layers 614 (FIG. 6) of integrated circuit 600. In some embodiments, insulating layer layout patterns 514*a* of the set of insulating layer layout patterns 514 is usable to manufacture a corresponding insulating layer 614*a* of the set of insulating layers 614 (FIG. 6) of integrated circuit 600.

Other configurations, arrangements on other layout levels or quantities of patterns in the set of insulating layer layout patterns 514 are within the scope of the present disclosure. For example, in some embodiments, the set of insulating layer layout patterns 514 includes a number of layout patterns greater than 1, and the layout patterns of the set of insulating layer layout patterns 514 are separated from other layout patterns of the set of insulating layer layout patterns 514 in at least the first direction X or the second direction Y.

In comparison with layout design 200 of FIG. 2, the set of conductive feature layout patterns 540 replaces the set of conductive feature layout patterns 240. The set of conductive feature layout patterns 540 are similar to the set of conductive feature layout patterns 240, and similar detailed description is therefore omitted. Members of the set of conductive feature layout patterns 540 are similar to the corresponding members of the set of conductive feature layout patterns 240, and similar detailed description is therefore omitted.

Set of conductive feature layout patterns 540 includes at least conductive feature layout patterns 240*a*, 240*b*, 240*c* or 540*d*. Conductive feature layout pattern 540*d* replaces corresponding conductive feature layout pattern 240d of FIG. 2, and similar detailed description is therefore omitted.

The set of conductive feature layout patterns 540 is usable to manufacture a corresponding set of conductive features 640 (FIG. 6) of integrated circuit 600. In some embodiments, conductive feature layout patterns 240a, 240b, 240c, 540d of the set of conductive feature layout patterns 540 are usable to manufacture corresponding conductive features 340a (not shown), 340b (not shown), 340c (not shown), 640d of the set of conductive features 640 (FIG. 6) of integrated circuit 600.

Other configurations, arrangements on other layout levels or quantities of patterns in the set of conductive feature layout patterns 540 are within the scope of the present disclosure.

In comparison with layout design 200 of FIG. 2, the set of via layout patterns 550 replaces the set of via layout patterns 250. The set of via layout patterns 550 or 560 are similar to the set of via layout patterns 250, and similar detailed description is therefore omitted. Members of the set of via layout patterns 550 or 560 are similar to the corresponding members of the set of via layout patterns 250, and similar detailed description is therefore omitted.

Set of via layout patterns 550 includes at least via layout patterns 250b, 250c, 550a, 550b or 550c. Set of via layout patterns 560 includes at least via layout pattern 560a. Set of via layout patterns 560 are positioned at a tall via over gate (VGT) of one or more of layout designs 200, 500, 800 or 1100A-1100G (FIGS. 2A-2C, 5, 8 or 11A-11G) or integrated circuit 300, 600, 900, 1200-1200' (FIGS. 3, 6A, 9 or 12A-12D). In some embodiments, the VGT level is between the M0 level and the POLY1 level. In some embodiments, the VGT level is between the fourth layout level and the first portion of the second layout level (POLY1).

Via layout pattern 550a is between conductive feature layout pattern 540d and metal over diffusion layout pattern 520a. Via layout pattern 550b is between conductive feature layout pattern 540d and metal over diffusion layout patterns 520c. Via layout pattern 550c is between power rail layout pattern 242a and metal over diffusion layout pattern 520b. Via layout pattern 560a is between conductive feature layout pattern 240b and gate layout pattern 504c.

The set of via layout patterns 550, 560 is usable to manufacture a corresponding set of vias 650, 660 (FIG. 6) of integrated circuit 600. In some embodiments, via layout patterns 250b, 250c, 550a, 550b, 550c of the set of via layout patterns 550 are usable to manufacture corresponding vias 350b, 350c, 650a, 650b, 650c of the set of vias 650 (FIG. 6) of integrated circuit 600. In some embodiments, via layout pattern 560a of the set of via layout patterns 560 is usable to manufacture corresponding via 660a of the set of vias 660 (FIG. 6) of integrated circuit 600. In some embodiments, the set of via layout patterns 560 includes other members (not shown for ease of illustration).

Other configurations, arrangements on other layout levels or quantities of patterns in the set of via layout patterns 550 or 560 are within the scope of the present disclosure.

Integrated Circuit

Figure 6A:
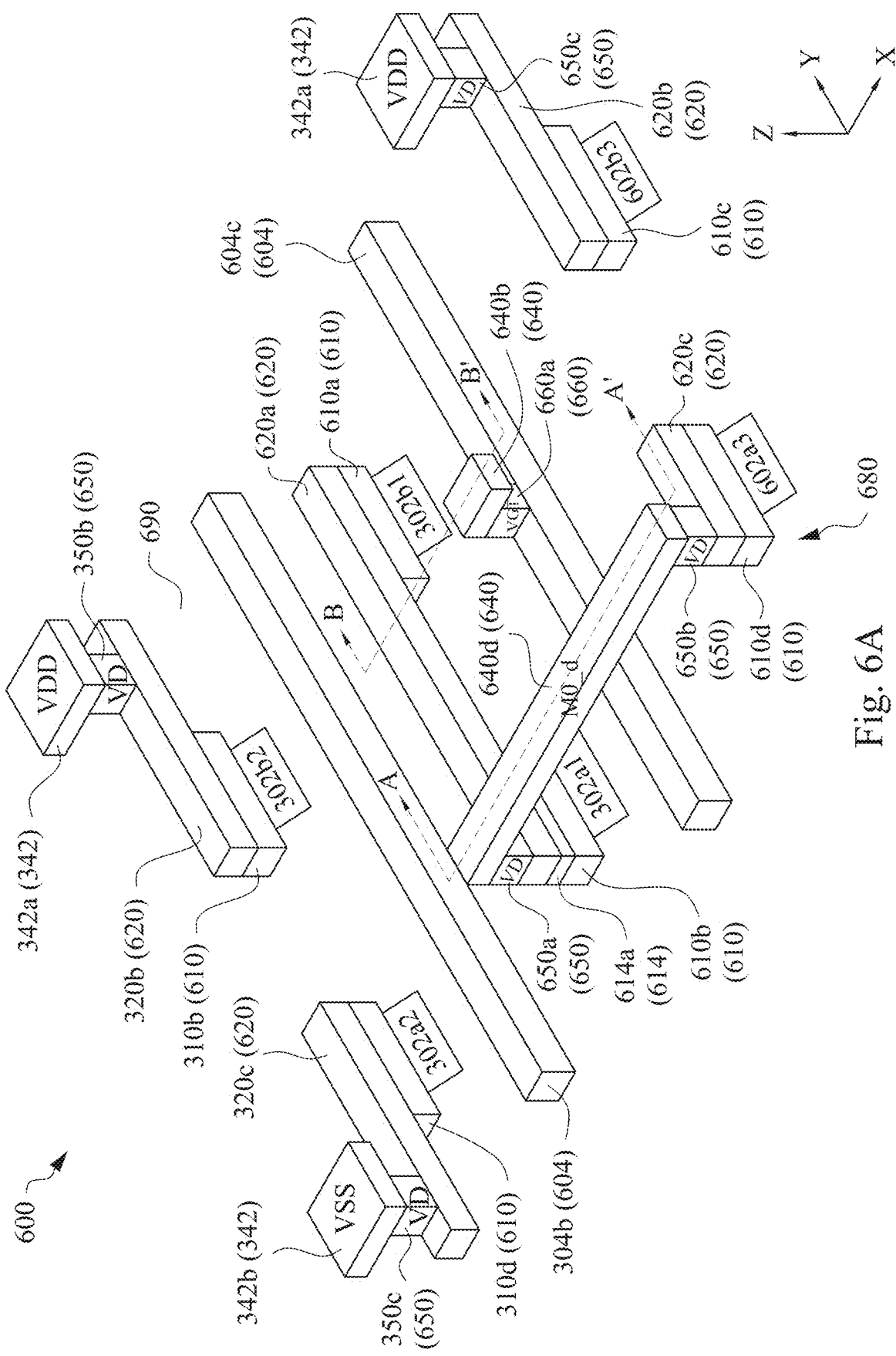
FIG. 6A is a perspective view of a diagram of an integrated circuit, in accordance with some embodiments.
Figure 6C:
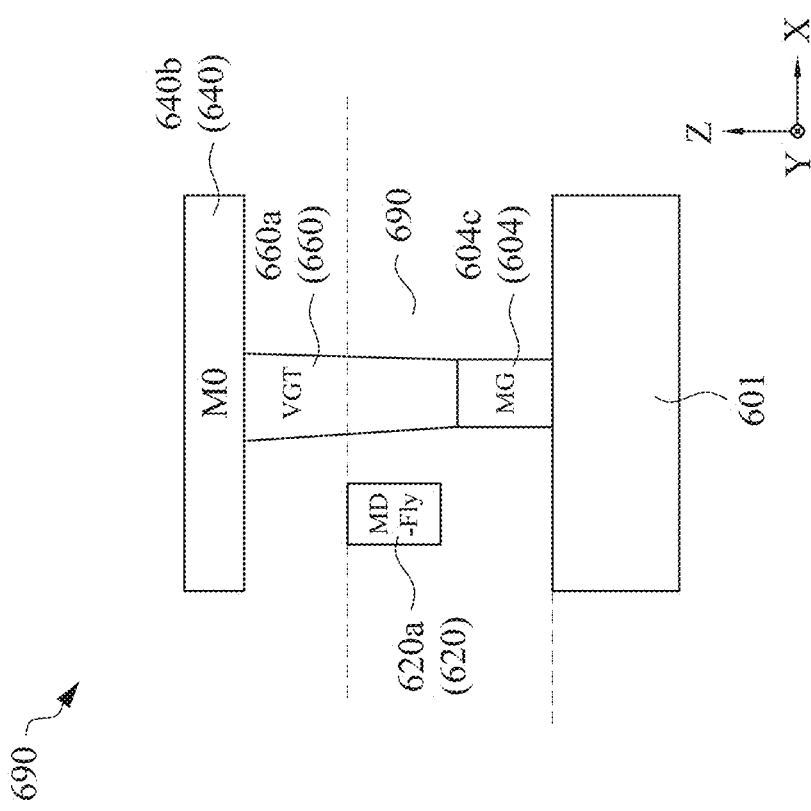
FIGS. 6B-6C are corresponding cross-sectional views of corresponding enlarged portions of an integrated circuit, in accordance with some embodiments.
Figure 6B:
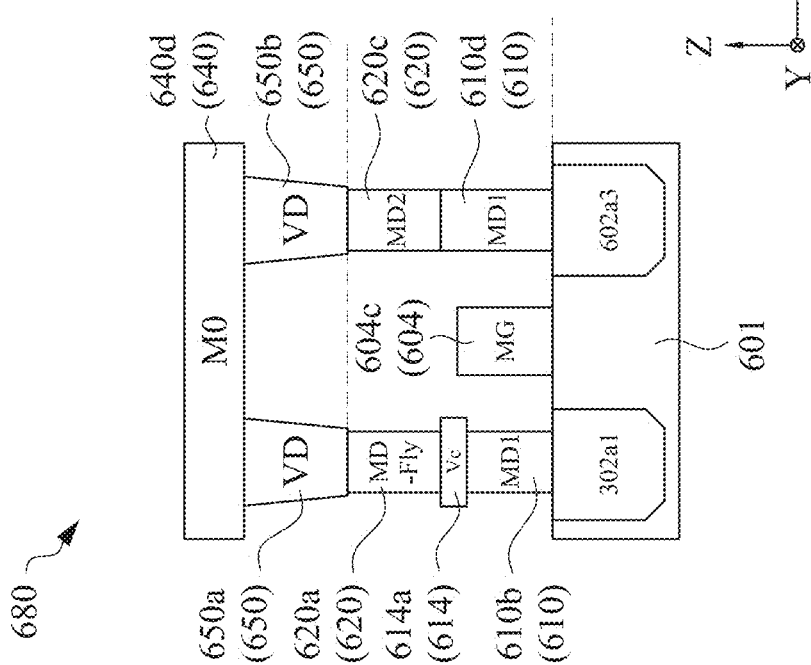

FIG. 6A is a perspective view of a diagram of an integrated circuit 600, in accordance with some embodiments. FIG. 6B is a cross-sectional view of an enlarged portion 680 of integrated circuit 600 as intersected by plane A-A', in accordance with some embodiments. FIG. 6C is a cross-sectional view of an enlarged portion 690 of integrated circuit 600 as intersected by plane B-B', in accordance with some embodiments.

Integrated circuit 600 is a variation of integrated circuit 300 (FIG. 3). For example, in some embodiments, integrated circuit 600 illustrates an example of where contacts 610a, 610b and 620a replace corresponding contacts 310a, 310c and 320a, and an insulating layer 614a is positioned between contact 620a and contact 610b thereby electrically insulating the contacts 620a, 610a from each other.

Integrated circuit 600 is manufactured by layout design 500. Integrated circuit 600 is an embodiment of a portion of integrated circuit 400.

Structural relationships including alignment, lengths and widths, as well as configurations of integrated circuit 600 are similar to the structural relationships and configurations of layout design 500 of FIG. 5, and similar detailed description will not be described in FIG. 6 for brevity.

Integrated circuit 600 includes a substrate 601, the set of active regions 602, the set of gates 604, the set of contacts 610, a set of insulating layers 614, the set of contacts 620, the set of conductive features 640, the set of power rails 342 and the set of vias 650 and 660, and an insulating region 690. However, for ease of illustration, integrated circuit 300 does not show at least one of the members in the set of gates 604, the set of contacts 610, the set of contacts 620, the set of conductive features 640, the set of power rails 342, the set of vias 650 or the set of vias 660.

In comparison with integrated circuit 300 of FIG. 3, set of active regions 602 replaces set of active regions 302, set of gates 604 replaces set of gates 304, set of contacts 610 replaces set of contacts 310, set of contacts 620 replaces set of contacts 320, set of conductive features 640 replaces set of conductive features 340 and set of vias 650 or 660 replaces the set of vias 350.

The set of active regions 602 are similar to the set of active regions 302, the set of gates 604 are similar to the set of gates 204, the set of contacts 610 are similar to the set of contacts 310, the set of contacts 620 are similar to the set of contacts 320, the set of conductive features 640 are similar to the set of conductive features 340 and the set of vias 650 or 660 are similar to the set of vias 350, and similar detailed description is therefore omitted.

Set of gates 604 includes gate 304a (not shown), 304b, 604c and 604d (not shown). Gate 604c extends in the second direction Y. Gate 304b of the set of gates 604 corresponds to the gate terminal of PMOS transistor P4-1 and the gate terminal of NMOS transistor N4-1 of FIG. 4. Gate 604c of the set of gates 604 corresponds to the gate terminal of PMOS transistor P4-2 and the gate terminal of NMOS transistor N4-2 of FIG. 4.

The set of active regions 602 includes active regions 302a1, 302a2, 302b1 and 302b2 and active regions 602a3 and 602b3 within the substrate 601. In some embodiments, active region 302a1 corresponds to the drain of NMOS transistor N4-1 or the source of NMOS transistor N4-2. In some embodiments, active region 302b1 corresponds to the drain of PMOS transistor P4-1 or the drain of PMOS transistor P4-2.

In some embodiments, active region 302a2 corresponds to the source of NMOS transistor N4-1, active region 302b2 corresponds to the source of PMOS transistor P4-1, active region 602a3 corresponds to the drain of NMOS transistor N4-2, and active region 602b3 corresponds to the source of PMOS transistor P4-2. Other configurations or arrangements in the set of active regions 602 are within the scope of the present disclosure.

The set of contacts 610 includes contacts 310b, 310d, 610a, 610b, 610c and 610d. Contacts 610a, 610b, 610c, 610d of the set of contacts 610 extend in the second direction Y, and overlap corresponding active regions 302b1, 302a1, 602b3, 602a3 of the set of active regions 602. Contacts 610a, 610b, 610c, 610d of the set of contacts 610 are electrically coupled to corresponding active regions 302b1, 302a1, 602b3, 602a3 of the set of active regions 602. Other configurations or arrangements of the set of contacts 610 are within the scope of the present disclosure.

The set of insulating layers 614 includes insulating layer 614a. The set of insulating layers 614 extend in the second direction Y. Insulating layer 614a is over contact 610b. Insulating layer 614a is positioned between contact 610b and contact 620a of set of contacts 620, thereby electrically isolating contacts 610b and 620a from each other.

In some embodiments, the set of insulating layers 614 are over other contacts of the set of contacts 610 different from contact 610b, and the set of insulating layers 614 electrically isolate the corresponding one or more other contacts from other overlying layers (e.g., contacts in the MD2 layer).

In some embodiments, the set of insulating layers 614 are over one or more gates of the set of gates 604 (similar to FIGS. 12A-12B) and the set of insulating layers 614 electrically isolate the corresponding one or more gates from other overlying layers (e.g., contacts in the MD2 layer).

In some embodiments, at least one insulating layer in the set of insulating layers 614 includes one or more layers of a dielectric material. In some embodiments, the dielectric material includes SiOCN, SiO$_2$, SiOC, or the like or combinations thereof.

In some embodiments, at least one insulating layer in the set of insulating layers 614, 914, 1214 or 1216 (FIGS. 9 & 12A-12B) has a thickness $T_{IL}$ in the third direction Z that ranges from about 0.05 $T_{MD1}$ to about 0.15 $T_{MD1}$, where thickness $T_{MD1}$ corresponds to a thickness in the third direction Z of one or more contacts 610 or contacts 310, 910, 1210 or 1212 (FIGS. 3, 9 & 12A-12B) in the MD1 metallization layer or one or more gates in the set of gates 304, 604, 904, 1204 (FIGS. 3, 6, 9 & 12A-12B) in the POLY1 layer. In some instances, if the thickness $T_{IL}$ is less than 0.05 $T_{MD1}$, then the insulating layer 614a may not effectively electrically isolate the corresponding contacts from each other resulting in electrical short circuits. In some instances, if the thickness $T_{IL}$ is greater than 0.15 $T_{MD1}$, then the area of the insulating layer 614a may increase the area of the integrated circuit 600 or decrease the area of contacts 610b or 620a affecting yield.

Other configurations or arrangements in the set of insulating layers 614 are within the scope of the present disclosure.

Insulating region 690 is similar to insulating layer 614, and similar detailed description is therefore omitted. Insulating region 690 is configured to insulate one or more elements in integrated circuit 600 from each other. Insulating regions 390, 690, 990, 1290 are shown in corresponding integrated circuits 300, 600, 900, 1200A (1200B), and similar detailed description is therefore omitted. Other configurations or arrangements in the insulating region 390, 690, 990 and 1290 are within the scope of the present disclosure.

The set of contacts 620 includes contacts 320b, 320c, 620a, 620b and 620c. Contacts 620a, 620b, 620c of the set of contacts 620 extend in the second direction Y.

Contact 620a overlaps and is electrically coupled to contact 610a. Contact 620a overlaps insulating layer 614a and contact 610b. However, contact 620a is not electrically coupled to contact 610b since insulating layer 614a is positioned between contact 610b and contact 620a.

In some embodiments, contact 620a or other contacts similar to contact 620a are referred to as "MD flyer" portions as these contacts overlap or extend over at least a pair of contacts in the MD1 level.

In some embodiments, by positioning contact 620a on insulating layer 614a and overlapping contact 610a, contact 620a thereby provides additional routing resources extending in the second direction Y and positioned below other metallization levels (e.g., M0, M1, etc.) for integrated circuit 600. By providing routing resources below other metallization levels (e.g., M0, M1, etc.), the use of the other metallization levels (e.g., M0, M1, etc.) can be reduced or the other metallization levels (e.g., M0, M1, etc.) can be utilized as additional routing resources resulting in integrated circuit 600 having a smaller area and standard cell than other approaches.

Contact 620b overlaps contact 610c thereby providing an electrical connection between contact 620b and contact 610c. Contact 620c is over and electrically coupled with contact 610d. Other configurations or arrangements of the set of contacts 620 are within the scope of the present disclosure.

The set of conductive features 640 includes conductive features 340a (not shown), 340b (not shown), 340c (not shown) and 640d. Conductive feature 640a is electrically coupled to contact 620a by via 650a and electrically coupled to contact 620c by via 650b. Other configurations or arrangements of the set of conductive features 640 are within the scope of the present disclosure.

The set of vias 650 includes vias 350b, 350c, 650a, 650b and 650c. The set of vias 660 includes via 660a. Via 650a is between conductive feature 640d and contact 620a, and thereby provides an electrical connection between conductive feature 640d and contact 620a.

Via 650b is between conductive feature 640d and contact 620c, and thereby provides an electrical connection between conductive feature 640d and contact 620c.

Via 650c is between power rail 342a and contact 620b, and thereby provides an electrical connection between power rail 342a and contact 620b. In some embodiments, at least one via of the set of vias 650 has a same height in a third direction Z as at least one other via in the set of vias 650.

Via 660a is between conductive feature 640b and gate 604c. Via 660a is directly coupled to gate 604c. Via 660a provides an electrical connection between conductive feature 640b and gate 604c. In some embodiments, at least one via of the set of vias 660 has a same height in the third direction Z as at least one via in the set of vias 660. In some embodiments, via 660a is directly coupled to gate 604c without an overlying contact (e.g., POLY2 in the level), and thus a height (not labelled) of at least one via of the set of vias 660 is greater than a height (not labelled) of at least one via in the set of vias 650 in the third direction Z.

In some embodiments, the active region 602b3 (e.g., source of PMOS transistor P4-2) is electrically coupled to the voltage supply VDD. For example, in some embodiments, active region 602b3 is electrically coupled to contact 610c, contact 610c is electrically coupled to contact 620b, contact 620b is electrically coupled to power rail 342a by via 350b, and power rail 342a is coupled to voltage supply VDD.

As shown in FIGS. 6A-6C, via 650b (located in the VD level) is directly coupled to contact 620c positioned in the MD2 layer, and via 660a (located in the VGT level) is directly coupled to gate 604c (positioned in the POLY1 level). In some embodiments, each of the vias of the set of vias 660 located in the VGT level is directly coupled to a corresponding gate of the set of gates 604 in the POLY1 layer without the use of a gate in the POLY2 layer of FIGS. 12A-12B. In some embodiments, the layout designs 300 and 900 of FIGS. 3, & 9 can be modified to include vias similar to that described for via 660a of the set of vias 660, and is within the scope of the present disclosure. Other configurations or arrangements of the set of vias 650 or 660 are within the scope of the present disclosure.

In some embodiments, one or more of the set of contacts 610, the set of insulating layers 614, the set of contacts 620 or the set of conductive features 640 can be configured in a manner similar to conductive feature 640d, via 650a, contacts 620a and insulating layer 614a in order to electrically couple one or more active regions of the set of active regions 602 with one or more gates of the set of gates 604 in integrated circuit 600.

In some embodiments, at least contact 620a is configured to provide an electrical connection between a first portion (e.g., drain) of a transistor (e.g., NMOS N4-2) and a second portion (e.g., drain) of a pair of transistors (e.g., PMOS P4-1 & PMOS P4-2). For example, in some embodiments, the active region 602a3 corresponds to the drain of NMOS transistor N4-2, and the active region 302b1 corresponds to the drain of PMOS transistor P4-1 and the drain of PMOS transistor P4-2, and the active region 602a3 and the active region 302b1 are electrically coupled together by at least contact 620a of the set of contacts 620.

In some embodiments, active region 602a3 is electrically coupled to contact 610d, contact 610d is electrically coupled to contact 620c, contact 620c is electrically coupled to via 650b, via 650b is electrically coupled to conductive feature 640d, conductive feature 640d is electrically coupled to via 650a, via 650a is electrically coupled to contact 620a, contact 620a is electrically coupled to contact 610a, and contact 610a is electrically coupled to active region 302b1.

In some embodiments, by positioning insulating layer 614a on contact 610b, contact 620a in the MD2 layer can be positioned on insulating layer 614a and extends in the second direction Y to overlap contact 610a thereby providing an electrical connection between active regions 602a3 and 302b1 of the set of active regions 602, and providing routing resources below other metallization levels (e.g., M0, M1, etc.) for integrated circuit 600. By providing routing resources below other metallization levels (e.g., M0, M1, etc.), the use of the other metallization levels (e.g., M0, M1, etc.) can be reduced or the other metallization levels (e.g., M0, M1, etc.) can be utilized as additional routing resources resulting in integrated circuit 600 having a smaller area and standard cell than other approaches.

Integrated Circuit

Figure 7:
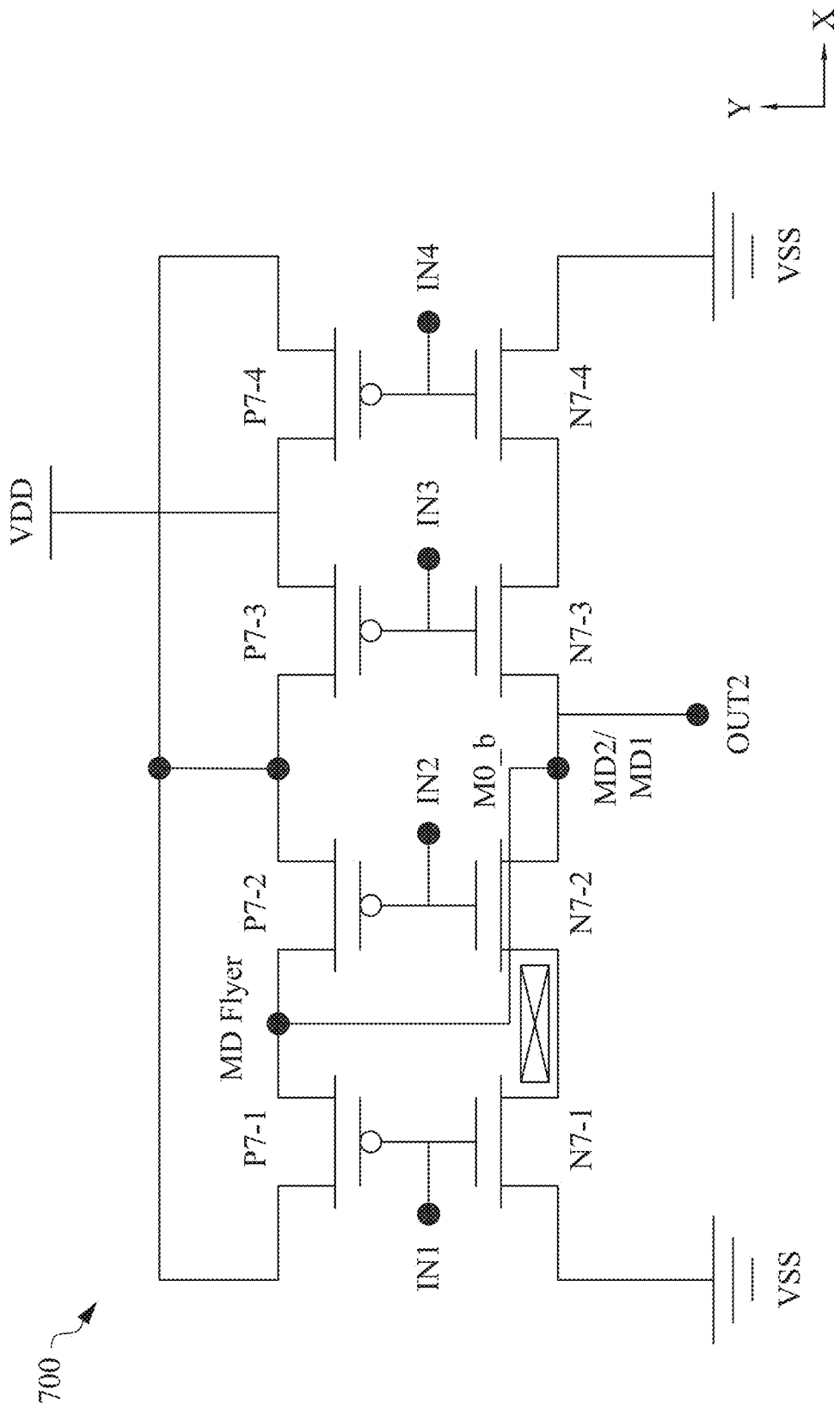
FIG. 7 is a circuit diagram of an integrated circuit, in accordance with some embodiments.

FIG. 7 is a circuit diagram of an integrated circuit 700, in accordance with some embodiments. In some embodiments, integrated circuit 700 is a 2-2 AND OR INVERT (AOI) circuit. A 2-2 AOI circuit is used for illustration, other types of circuits including other types of AOI circuits are within the scope of the present disclosure.

Integrated circuit 700 includes PMOS transistors P7-1, P7-2, P7-3 and P7-4 coupled to NMOS transistors N7-1, N7-2, N7-3 and N7-4.

A gate terminal of PMOS transistor P7-1 and NMOS transistor N7-1 are coupled together, and are configured as an input node IN1. A gate terminal of PMOS transistor P7-2 and NMOS transistor N7-2 are coupled together, and are configured as an input node IN2. A gate terminal of PMOS transistor P7-3 and NMOS transistor N7-3 are coupled together, and are configured as an input node IN3. A gate terminal of PMOS transistor P7-4 and NMOS transistor N7-4 are coupled together, and are configured as an input node IN4.

A source terminal of PMOS transistor P7-3 and a source terminal of PMOS transistor P7-4 are coupled to the voltage supply VDD. A source terminal of NMOS transistor N7-1 and a source terminal of NMOS transistor N7-4 are each coupled to the reference voltage supply VSS.

A source terminal of NMOS transistor N7-2 and a drain terminal of NMOS transistor N7-1 are coupled to each other. A source terminal of NMOS transistor N7-3 and a drain terminal of NMOS transistor N7-4 are coupled to each other.

A source terminal of PMOS transistor P7-1, a source terminal of PMOS transistor P7-2, a drain terminal of PMOS transistor P7-3 and a drain terminal of PMOS transistor P7-4 are coupled to each other.

A drain terminal of PMOS transistor P7-1, a drain terminal of PMOS transistor P7-2, a drain terminal of NMOS transistor N7-2 and a drain terminal of NMOS transistor N7-3 are coupled to each other, and are configured as an output node OUT2.

Layout Design of an Integrated Circuit

Figure 8:
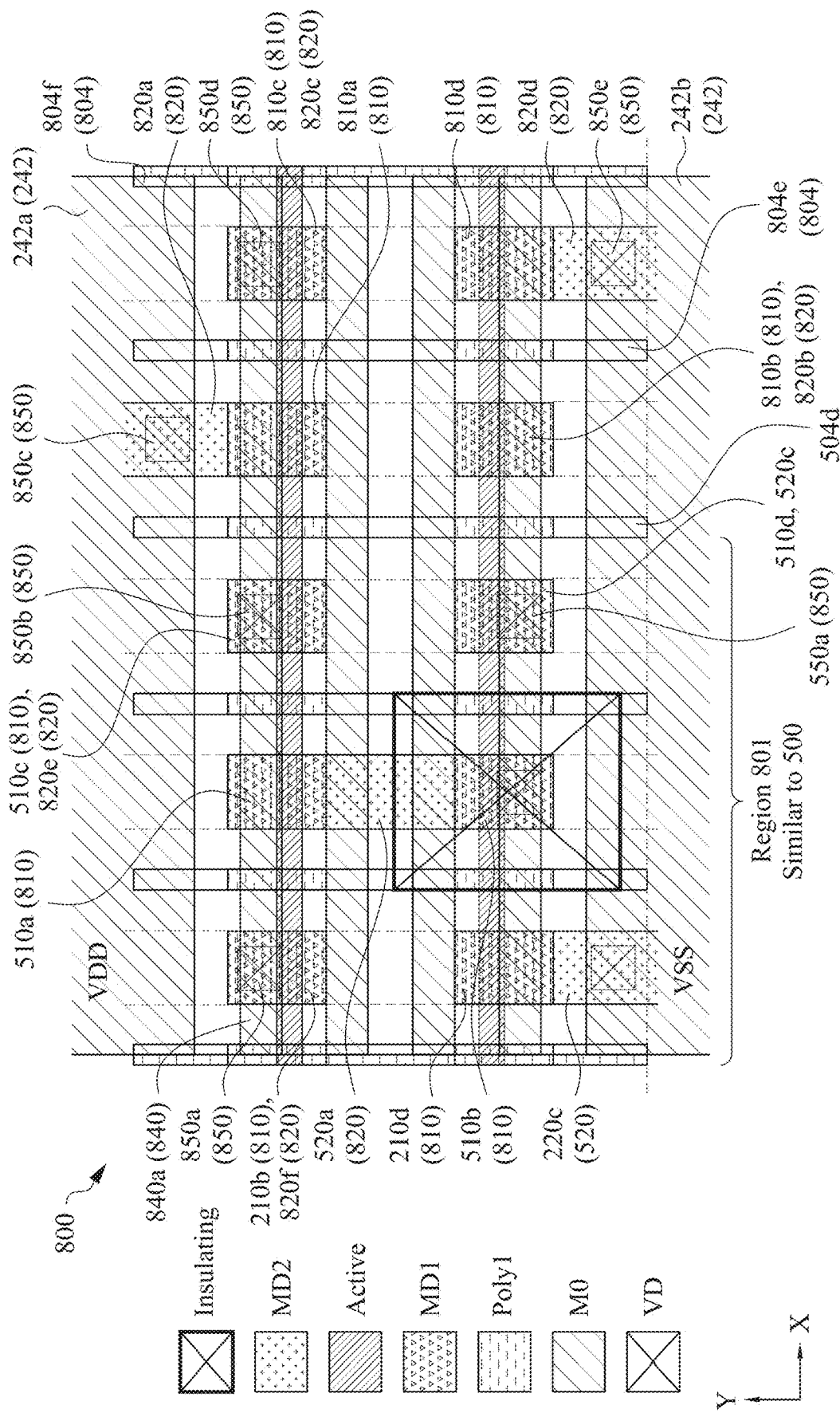
FIG. 8 is a diagram of a layout design of an integrated circuit, in accordance with some embodiments.

FIG. 8 is a diagram of a layout design 800 of an integrated circuit, in accordance with some embodiments.

Layout design 800 is a variation of layout design 500 (FIG. 5).

Figure 9:
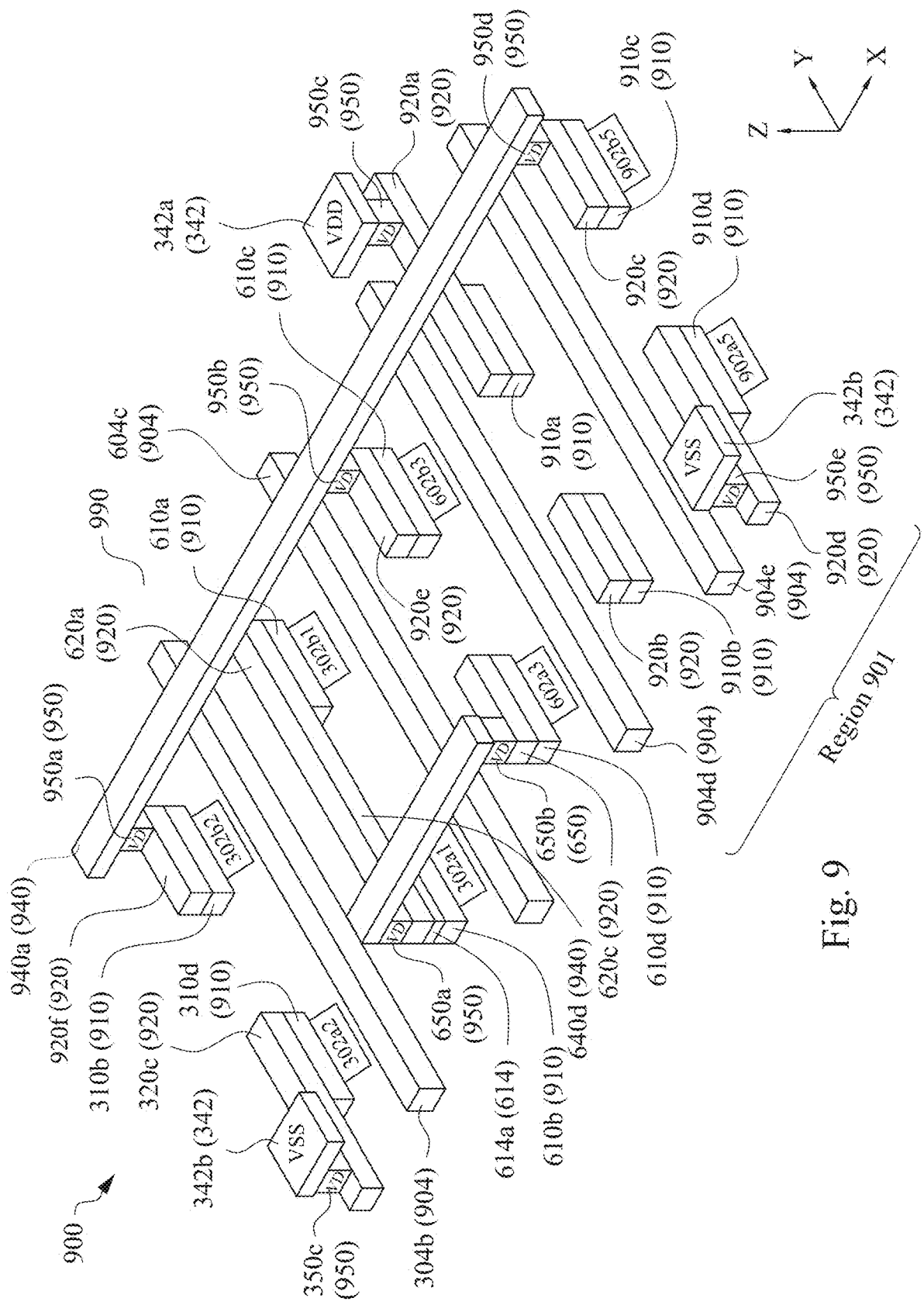
FIG. 9 is a perspective view of a diagram of an integrated circuit, in accordance with some embodiments.

Layout design 800 is usable to manufacture an integrated circuit similar to integrated circuit 700 of FIG. 7 or integrated circuit 900 of FIG. 9.

Layout design 800 includes the set of active region layout patterns 202, the set of rail layout patterns 242, a set of gate layout patterns 804, a set of metal over diffusion layout patterns 810, the set of insulating layer layout patterns 514, a set of metal over diffusion layout patterns 820, a set of conductive feature layout patterns 840, and a set of via layout patterns 850.

In some embodiments, layout design 800 includes a region 801 that is similar to portions of layout design 500 of FIG. 5, and similar detailed description is therefore omitted for brevity, and labelling of some similar elements in region 801 is also omitted for ease of illustration.

In comparison with layout design 500 of FIG. 5, set of gate layout patterns 804 replaces set of gate layout patterns 504, set of metal over diffusion layout patterns 810 replaces set of metal over diffusion layout patterns 510, set of metal over diffusion layout patterns 820 replaces set of metal over diffusion layout patterns 520, set of conductive feature layout patterns 840 replaces set of conductive feature layout patterns 540 and set of via layout patterns 850 replaces set of via layout patterns 550.

The set of gate layout patterns 804 are similar to the set of gate layout patterns 504, the set of metal over diffusion layout patterns 810 are similar to the set of metal over diffusion layout patterns 510, the set of metal over diffusion layout patterns 820 are similar to the set of metal over diffusion layout patterns 520, the set of conductive feature layout patterns 840 are similar to the set of conductive feature layout patterns 540 and the set of via layout patterns 850 are similar to the set of via layout patterns 550, and similar detailed description is therefore omitted.

Set of gate layout patterns 804 includes the set of gate layout patterns 504, and gate layout patterns 804e and 804f. The set of gate layout patterns 804 of layout design 800 and integrated circuit 900 have a CPP of 5. The set of gate layout patterns 804 is usable to manufacture a corresponding set of gates 904 (FIG. 9) of integrated circuit 900. In some embodiments, gate layout patterns 504d, 804e of the set of gate layout patterns 804 are usable to manufacture corresponding gates 904d, 904e of the set of gates 904 (FIG. 9) of integrated circuit 900.

In comparison with layout design 500 of FIG. 5, gate layout pattern 504d of FIG. 8 is not positioned along the edge of layout design 800. Gate layout patterns 804e, 804f are similar to gate layout pattern 504b or 504c, and similar detailed description is therefore omitted. Gate layout pattern 804f is positioned along the edge of layout design 500. In some embodiments, for at least reasons including being positioned along the edge of the layout design (e.g., layout design 800), the features of gate layout pattern 804f are similar to gate layout pattern 204c (FIG. 2) or 504d (FIG. 5), and similar detailed description is therefore omitted.

In some embodiments, gate layout pattern 504b is usable to manufacture the gate terminal of PMOS transistor P7-1 and the gate terminal of NMOS transistor N7-1 of FIG. 7, gate layout pattern 504c is usable to manufacture the gate terminal of PMOS transistor P7-2 and the gate terminal of NMOS transistor N7-2 of FIG. 7, gate layout pattern 504d is usable to manufacture the gate terminal of PMOS transistor P7-3 and the gate terminal of NMOS transistor N7-3 of FIG. 7, and gate layout pattern 804e is usable to manufacture the gate terminal of PMOS transistor P7-4 and the gate terminal of NMOS transistor N7-4 of FIG. 7. Other configurations, arrangements on other layout levels or quantities of patterns in the set of gate layout patterns 804 are within the scope of the present disclosure.

Set of metal over diffusion layout patterns 810 includes the set of metal over diffusion layout patterns 510 and metal over diffusion layout patterns 810a, 810b, 810c and 810d. The set of metal over diffusion layout patterns 810 is usable to manufacture a corresponding set of contacts 910 (FIG. 9) of integrated circuit 900. In some embodiments, metal over diffusion layout patterns 810a, 810b, 810c, 810d of the set of metal over diffusion layout patterns 810 are usable to manufacture corresponding contacts 910a, 910b, 910c, 910d of the set of contacts 910 (FIG. 9) of integrated circuit 900.

In some embodiments, metal over diffusion layout patterns 810a, 810b, 810c, 810d are mirror images of corresponding metal over diffusion layout patterns 510a, 510b, 210b, 210d, with respect to a central portion of layout design 800 in the second direction Y, and similar detailed description is therefore omitted.

In some embodiments, each of the layout patterns of the set of metal over diffusion layout patterns 810 have a regular layout pattern. In some embodiments, each of the layout patterns of the set of metal over diffusion layout patterns 810 have a same area as one another.

Other configurations, arrangements on other layout levels or quantities of patterns in the set of metal over diffusion layout patterns 810 are within the scope of the present disclosure.

Set of metal over diffusion layout patterns 820 includes at least metal over diffusion layout pattern 220c, 520a, 520c, 820a, 820b, 820c, 820d, 820e or 820f.

The set of metal over diffusion layout patterns 820 is usable to manufacture a corresponding set of contacts 920 (FIG. 9) of integrated circuit 900.

In some embodiments, metal over diffusion layout patterns 220c, 520a, 520c, 820a, 820b, 820c, 820d, 820e or 820f of the set of metal over diffusion layout patterns 820 are usable to manufacture corresponding contacts 320c, 620a, 620c, 920a, 920b, 920c, 920d, 920e, 920f of the set of contacts 920 (FIG. 9) of integrated circuit 900.

In some embodiments, one or more of metal over diffusion layout patterns 820b, 820c are similar to metal over diffusion layout pattern 520c of FIG. 5, and similar detailed description is therefore omitted. In some embodiments, metal over diffusion layout patterns 820a, 820d are similar to corresponding metal over diffusion layout patterns 520b, 220c of FIG. 5, and similar detailed description is therefore omitted.

In some embodiments, metal over diffusion layout patterns 820a, 820c overlap active region layout pattern 202a and are over corresponding metal over diffusion layout patterns 810a, 810c. In some embodiments, metal over diffusion layout patterns 820b, 820d overlap active region layout pattern 202b and are over corresponding metal over diffusion layout patterns 810b, 810d.

In some embodiments, metal over diffusion layout patterns 820a, 820d overlap corresponding metal over diffusion layout patterns 810a, 810d.

In some embodiments, sides of metal over diffusion layout patterns 820b, 820c are aligned with corresponding sides of corresponding metal over diffusion layout patterns 810b, 810c.

Metal over diffusion layout patterns 820e, 820f replace corresponding metal over diffusion layout patterns 520b, 220b of FIG. 5, and similar detailed description is therefore omitted. In some embodiments, sides of metal over diffusion layout patterns 820e, 820f are aligned with corresponding sides of corresponding metal over diffusion layout patterns 510c, 210b.

Other configurations, arrangements on other layout levels or quantities of patterns in the set of metal over diffusion layout patterns 820 are within the scope of the present disclosure.

In some embodiments, at least metal over diffusion layout pattern 210b or a portion of metal over diffusion layout pattern 820f is usable to manufacture the source terminal of PMOS transistor P7-1 of FIG. 7. In some embodiments, at least metal over diffusion layout pattern 510a or a portion of metal over diffusion layout pattern 520a is usable to manufacture the drain terminal of PMOS transistor P7-1 or the drain terminal of PMOS transistor P7-2 of FIG. 7. In some embodiments, at least metal over diffusion layout pattern 510c or a portion of metal over diffusion layout pattern 820e is usable to manufacture the source terminal of PMOS transistor P7-2 or the drain terminal of PMOS transistor P7-3 of FIG. 7. In some embodiments, at least metal over diffusion layout pattern 810a or a portion of metal over diffusion layout pattern 820a is usable to manufacture the source terminal of PMOS transistor P7-3 or the source terminal of PMOS transistor P7-4 of FIG. 7. In some embodiments, at least metal over diffusion layout pattern 810c or a portion of metal over diffusion layout pattern 820c is usable to manufacture the drain terminal of PMOS transistor P7-4 of FIG. 7.

In some embodiments, at least metal over diffusion layout pattern 210d or a portion of metal over diffusion layout pattern 220c is usable to manufacture the source terminal of NMOS transistor N7-1 of FIG. 7. In some embodiments, at least metal over diffusion layout pattern 510b or a portion of metal over diffusion layout pattern 520a is usable to manufacture the drain terminal of NMOS transistor N7-1 or the source terminal of NMOS transistor N7-2 of FIG. 7. In some embodiments, at least metal over diffusion layout pattern 510d or a portion of metal over diffusion layout pattern 520c is usable to manufacture the drain terminal of NMOS transistor N7-2 or the drain terminal of NMOS transistor N7-3 of FIG. 7. In some embodiments, at least metal over diffusion layout pattern 810b or a portion of metal over diffusion layout pattern 820b is usable to manufacture the source terminal of NMOS transistor N7-3 or the drain terminal of NMOS transistor N7-4 of FIG. 7. In some embodiments, at least metal over diffusion layout pattern 810d or a portion of metal over diffusion layout pattern 820d is usable to manufacture the source terminal of NMOS transistor N7-4 of FIG. 7.

Set of conductive feature layout patterns 840 includes at least conductive feature layout patterns 840a, 240b, 240c or 540d. Conductive feature layout pattern 840a replaces corresponding conductive feature layout pattern 240a of FIGS. 2 and 5, and similar detailed description is therefore omitted.

The set of conductive feature layout patterns 840 is usable to manufacture a corresponding set of conductive features 940 (FIG. 9) of integrated circuit 900. In some embodiments, conductive feature layout patterns 840a, 240b, 240c, 540d of the set of conductive feature layout patterns 840 are usable to manufacture corresponding conductive features 940a, 340b (not shown), 340c (not shown), 640d of the set of conductive features 940 (FIG. 9) of integrated circuit 900.

Other configurations, arrangements on other layout levels or quantities of patterns in the set of conductive feature layout patterns 840 are within the scope of the present disclosure.

Set of via layout patterns 850 includes at least via layout patterns 250c, 550a, 550b, 850a, 850b, 850c, 850d or 850e.

The set of via layout patterns 850 is usable to manufacture a corresponding set of vias 950 (FIG. 9) of integrated circuit 900. In some embodiments, via layout patterns 250c, 550a, 550b, 850a, 850b, 850c, 850d or 850e of the set of via layout patterns 850 are usable to manufacture corresponding vias 350c, 650a, 650b, 950a, 950b, 950c, 950d, 950e of the set of vias 950 (FIG. 9) of integrated circuit 900.

Via layout patterns 850a, 850b replace corresponding via layout patterns 250b, 550c of FIG. 5, and similar detailed description is therefore omitted. In some embodiments, via layout patterns 850c, 850e are similar to corresponding via layout patterns 250b, 250c of FIGS. 2 & 5, and similar detailed description is therefore omitted. In some embodiments, via layout pattern 850d is similar to corresponding via layout pattern 550b of FIG. 5, and similar detailed description is therefore omitted.

Via layout pattern 850a is between conductive feature layout pattern 840a and metal over diffusion layout pattern 820f. Via layout pattern 850b is between conductive feature layout pattern 840a and metal over diffusion layout pattern 820e. Via layout pattern 850d is between conductive feature layout pattern 840a and metal over diffusion layout pattern 820c.

Via layout pattern 850c is between power rail layout pattern 242a and metal over diffusion layout pattern 820a. Via layout pattern 850e is between power rail layout pattern 242b and metal over diffusion layout pattern 820d.

Other configurations, arrangements on other layout levels or quantities of patterns in the set of via layout patterns 850 are within the scope of the present disclosure.

Integrated Circuit

FIG. 9 is a perspective view of a diagram of an integrated circuit 900, in accordance with some embodiments.

Integrated circuit 900 is a variation of integrated circuit 600 (FIG. 6). For example, in some embodiments, integrated circuit 900 includes a region 901 combined with portions of integrated circuit 600. For example, in some embodiments, contact 920e replaces contact 620b of FIG. 6, contact 920f replaces contact 320b of FIG. 6, via 950a replaces via 650b of FIG. 6, and via 950b replaces via 650c of FIG. 6, and similar detailed description is therefore omitted.

Integrated circuit 900 is manufactured by layout design 800. Integrated circuit 900 is an embodiment of a portion of integrated circuit 700.

Structural relationships including alignment, lengths and widths, as well as configurations of integrated circuit 900 are similar to the structural relationships and configurations of layout design 800 of FIG. 8, and similar detailed description will not be described in FIG. 9 for brevity.

Integrated circuit 900 includes a substrate (not shown), the set of active regions 902, the set of gates 904, the set of contacts 910, the set of insulating layers 614, the set of contacts 920, the set of conductive features 940, the set of power rails 342 and the set of vias 950. However, for ease of illustration, integrated circuit 900 does not show at least one of the members in the set of gates 904, the set of contacts 910, the set of contacts 920, the set of conductive features 940, the set of power rails 342 or the set of vias 950.

In comparison with integrated circuit 600 of FIG. 6, set of active regions 902 replaces set of active regions 602, set of gates 904 replaces set of gates 604, set of contacts 910 replaces set of contacts 610, set of contacts 920 replaces set of contacts 620, set of conductive features 940 replaces set of conductive features 640 and set of vias 950 replaces the set of vias 650.

The set of active regions 902 are similar to the set of active regions 602, the set of gates 904 are similar to the set of gates 604, the set of contacts 910 are similar to the set of contacts 610, the set of contacts 920 are similar to the set of contacts 620, the set of conductive features 940 are similar to the set of conductive features 640 and the set of vias 950 are similar to the set of vias 650, and similar detailed description is therefore omitted.

Set of gates 904 includes gate 304a (not shown), 304b, 604c, 904d, 904e and 904f (not shown). Gates 904d, 904e are similar to gate 304b, and similar detailed description is therefore omitted. Gate 304b of the set of gates 904 corresponds to the gate terminal of PMOS transistor P7-1 and the gate terminal of NMOS transistor N7-1 of FIG. 7. Gate 604c of the set of gates 904 corresponds to the gate terminal of PMOS transistor P7-2 and the gate terminal of NMOS transistor N7-2, of FIG. 7. Gate 904d of the set of gates 904 corresponds to the gate terminal of PMOS transistor P7-3 and the gate terminal of NMOS transistor N7-3 of FIG. 7. Gate 904d of the set of gates 904 corresponds to the gate terminal of PMOS transistor P7-4 and the gate terminal of NMOS transistor N7-4 of FIG. 7.

The set of active regions 902 includes active regions 302a1, 302a2, 302b1, 302b2, 602a3, 602b3, 902a4 (not labelled), 902b4 (not labelled), 902a5 and 902b5 within the substrate (not shown).

In some embodiments, active region 302a1 corresponds to the drain of NMOS transistor N7-1 or the source of NMOS transistor N7-2. In some embodiments, active region 302b1 corresponds to the drain of PMOS transistor P7-1 or the drain of PMOS transistor P7-2. In some embodiments, active region 302a2 corresponds to the source of NMOS transistor N7-1, and active region 302b2 corresponds to the source of PMOS transistor P7-1. In some embodiments, active region 602a3 corresponds to the drain of NMOS transistor N7-2 or the drain of NMOS transistor N7-3, and active region 602b3 corresponds to the source of PMOS transistor P7-2 or the drain of PMOS transistor P7-3. In some embodiments, active region 902a4 (not labelled) corresponds to the source of NMOS transistor N7-3 or the drain of NMOS transistor N7-4, and active region 902b4 (not labelled) corresponds to the source of PMOS transistor P7-3 or the source of PMOS transistor P7-4. In some embodiments, active region 902a5 corresponds to the source of NMOS transistor N7-4, and active region 902b5 corresponds to the drain of PMOS transistor P7-4. Other configurations or arrangements in the set of active regions 902 are within the scope of the present disclosure.

The set of contacts 910 includes set of contacts 610 and contacts 910a, 910b, 910c, 910d. Contacts 910a, 910b, 910c, 910d of the set of contacts 910 extend in the second direction Y, and overlap corresponding active regions 902b4 (not labelled), 902a4 (not labelled), 902b5, 902a5 of the set of active regions 902. Contacts 910a, 910b, 910c, 910d of the set of contacts 910 are electrically coupled to corresponding active regions 902b4 (not labelled), 902a4 (not labelled), 902b5, 902a5 of the set of active regions 902. Other configurations or arrangements of the set of contacts 910 are within the scope of the present disclosure.

The set of contacts 920 includes contacts 320c, 620a, 620c, 920a, 920b, 920c, 920d, 920e, and 920f. Contact 920e replaces contact 620b of FIG. 6, and contact 920f replaces contact 320b of FIG. 6, and similar detailed description is therefore omitted. In some embodiments, at least contacts 920a, 920b, 920c or 920d is similar to contact 620c, and similar detailed description is therefore omitted.

Contacts 920a, 920b, 920c and 920d of the set of contacts 920 extend in the second direction Y. Contact 920a overlaps and is electrically coupled with contact 910a. Contact 920b is over and electrically coupled with contact 910b. Contact 920c is over and electrically coupled with contact 910c. Contact 920d overlaps and is electrically coupled with contact 910d. Other configurations or arrangements of the set of contacts 920 are within the scope of the present disclosure.

The set of conductive features 940 includes conductive features 940a, 340b (not shown), 340c (not shown) and 640d. Conductive feature 940a replaces conductive feature 640a (not shown) of FIG. 6, and similar detailed description is therefore omitted. Conductive feature 940a is electrically coupled to contact 920f by a via 950a, electrically coupled to contact 920e by a via 950b, and electrically coupled to contact 920c by a via 950d. In some embodiments, conductive feature 940a electrically couples active regions 302b2, 602b3 and 902b5 together. Other configurations or arrangements of the set of conductive features 940 are within the scope of the present disclosure.

The set of vias 950 includes vias 350c, 650a, 650b, 950a, 950b, 950c, 950d and 950e.

Via 950a replaces via 650b of FIG. 6, and via 950b replaces via 650c of FIG. 6, and similar detailed description is therefore omitted. Via 950a is between conductive feature 940a and contact 920f. Via 950b is between conductive feature 940a and contact 920e. Via 950d is between conductive feature 940a and contact 920c.

Via 950c is in a similar configuration as via 650c of FIG. 6, and similar detailed description is therefore omitted. Via 950e is in a similar configuration as via 350c of FIGS. 3 & 6, and similar detailed description is therefore omitted. Via 950c is between power rail 342a and contact 920a, and thereby provides an electrical connection between power rail 342a and contact 920a. Via 950e is between power rail 342b and contact 920d, and thereby provides an electrical connection between power rail 342b and contact 920d.

In some embodiments, the active region (not labelled) 902b4 (e.g., source of PMOS transistor P7-3 or P7-4) is electrically coupled to the voltage supply VDD. For example, in some embodiments, active region 902b4 (not labelled) is electrically coupled to contact 910a, contact 910a is electrically coupled to contact 920a, contact 920a is electrically coupled to power rail 342a by via 950c, and power rail 342a is coupled to voltage supply VDD.

In some embodiments, the active region 902a5 (e.g., source of NMOS transistor N7-4) is electrically coupled to the reference voltage supply VSS. For example, in some embodiments, active region 902a5 is electrically coupled to contact 910d, contact 910d is electrically coupled to contact 920d, contact 920d is electrically coupled to power rail 342b by via 950e, and power rail 342b is coupled to reference voltage supply VSS.

In some embodiments, the active region 302b2 (e.g., source of PMOS transistor P7-1), the active region 602b3 (e.g., source of PMOS transistor P7-2 or drain of PMOS transistor P7-3) and the active region 902b5 (e.g., drain of PMOS transistor P7-4) are electrically coupled to each other by at least conductive feature 940a. For example, in some embodiments, active region 302b2 is electrically coupled to contact 310b, contact 310b is electrically coupled to contact 920f, contact 920f is electrically coupled to conductive feature 940a. In some embodiments, conductive feature 940a is also electrically coupled to contact 920e by via 950b, contact 920e is electrically coupled to contact 610c, contact 610c is electrically coupled to active region 602b3. In some embodiments, conductive feature 940a is also electrically coupled to contact 920c by via 950d, contact 920c is electrically coupled to contact 910c, contact 910c is electrically coupled to active region 902b5.

In some embodiments, at least one via of the set of vias 950 has a same height in the third direction Z as at least one other via in the set of vias 950. Other configurations or arrangements of the set of vias 950 are within the scope of the present disclosure.

Other configurations or variations of integrated circuit 900 are within the scope of the present disclosure. In some embodiments, one or more of the set of contacts 910, the set of insulating layers 614, the set of contacts 920 or the set of conductive features 940 can be configured in a manner similar to conductive feature 640d, via 650a, contacts 620a and insulating layer 614a in order to electrically couple one or more active regions of the set of active regions 902 with one or more gates of the set of gates 904 in integrated circuit 900.

In some embodiments, by positioning insulating layer 614a on contact 610b, contact 620a in the MD2 layer can be positioned on insulating layer 614a and extends in the second direction Y to overlap contact 610a thereby providing an electrical connection between active regions 602a3 and 302b1 of the set of active regions 902, and providing routing resources below other metallization levels (e.g., M0, M1, etc.) for integrated circuit 900. By providing routing resources below other metallization levels (e.g., M0, M1, etc.), the use of the other metallization levels (e.g., M0, M1, etc.) can be reduced or the other metallization levels (e.g., M0, M1, etc.) can be utilized as additional routing resources resulting in integrated circuit 900 having a smaller area and standard cell than other approaches.

Integrated Circuit

Figure 10A:
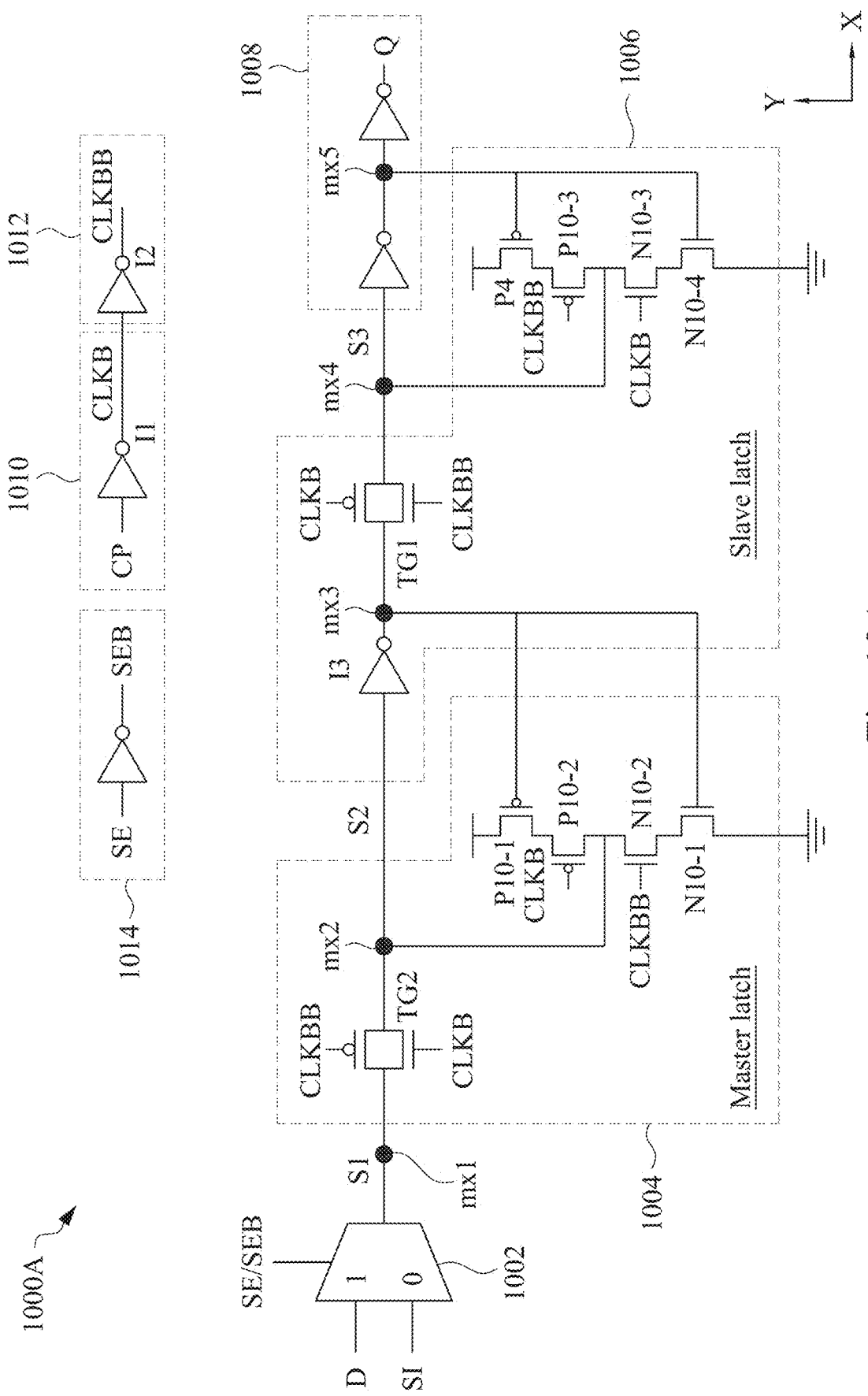
FIG. 10A is a circuit diagram of an integrated circuit, in accordance with some embodiments.

FIG. 10A is a circuit diagram of an integrated circuit 1000A, in accordance with some embodiments.

In some embodiments, integrated circuit 1000A is a flip-flop circuit. Integrated circuit 1000A is configured to receive at least a first signal D or a second signal SI, and is configured to output an output signal Q. In some embodiments, the first signal D is a data input signal. In some embodiments, the second signal SI is a scan input signal. In some embodiments, the output signal Q is a stored state of at least the first signal D or the second signal SI. A flip-flop circuit is used for illustration, other types of circuits are within the scope of the present disclosure.

Integrated circuit 1000A includes a multiplexer 1002, a latch 1004, a latch 1006, an output circuit 1008, an inverter I1, an inverter I2 and an inverter 1014.

Multiplexer 1002 includes a first input terminal configured to receive the first signal D, a second input terminal configured to receive the second signal SI, and a third input terminal configured to receive a selection signal SE or an inverted selection signal SEB. An output terminal of multiplexer 1002 is coupled to an input terminal of latch 1004 at node mx1. Multiplexer 1002 is configured to output a multiplexed signal S1 to latch 1004. In some embodiments, the multiplexed signal S1 corresponds to the first signal D or the second signal SI responsive to the selection signal SE or the inverted selection signal SEB. In some embodiments, the third input terminal of multiplexer 1004 is coupled to inverter 1014 to receive at least selection signal SE or inverted selection signal SEB.

Latch 1004 is coupled to multiplexer 1002 and latch 1006. The input terminal of latch 1004 is configured to receive the multiplexed signal S1 from multiplexer 1002. An output terminal of latch 1004 is coupled to an input terminal of latch 1006 at a node mx2. Latch 1004 is configured to output a signal S2 to latch 1006 by the output terminal. In some embodiments, signal S2 is a latched version of signal S1. In some embodiments, latch 1004 is coupled to inverter I1, and is configured to receive signal CLKB. In some embodiments, latch 1004 is coupled to inverter I2, and is configured to receive signal CLKBB.

Latch 1006 is coupled to latch 1004 and output circuit 1008. The input terminal of latch 1006 is configured to receive signal S2 from latch 1004. An output terminal of latch 1006 is coupled to an input terminal of output circuit 1008 at a node mx4. Latch 1006 is configured to output a signal S3 to output circuit 1008 by the output terminal. In some embodiments, signal S3 is a latched version of signal S1 or S2. In some embodiments, latch 1006 is coupled to inverter I1, and is configured to receive signal CLKB. In some embodiments, latch 1006 is coupled to inverter I2, and is configured to receive signal CLKBB.

Output circuit 1008 is coupled to latch 1006. The input terminal of output circuit 1008 is configured to receive signal S3 from latch 1006. An output terminal of output circuit 1008 is configured to output the output signal Q. In some embodiments, signal S3 is a latched version of signal S1 or S2.

Latch 1004 includes a transmission gate TG2, NMOS transistors N10-1 and N10-2 and PMOS transistors P10-1 and P10-2.

Transmission gate TG2 is coupled between node mx1 and node mx2. Transmission gate TG2 is configured to receive signal S1, signal CLKB and signal CLKBB. Transmission gate TG2 is configured to output signal S2 to inverter I3, PMOS transistor P10-2 and NMOS transistor N10-2. Transmission gate TG2 includes an NMOS transistor (not labelled) and a PMOS transistor (not labelled) that are coupled together.

A gate terminal of PMOS transistor P10-1 and a gate terminal of NMOS transistor N10-1 are coupled together, and are further coupled to at least node mx3.

A source terminal of PMOS transistor P10-1 is coupled to the voltage supply VDD. A drain terminal of PMOS transistor P10-1 is coupled to a source terminal of PMOS transistor P10-2.

A gate terminal of PMOS transistor P10-2 is configured to receive signal CLKB. In some embodiments, the gate terminal of PMOS transistor P10-2 is coupled to at least an output terminal of inverter I1. Each of a drain terminal of PMOS transistor P10-2 and a drain terminal of NMOS transistor N10-2 are coupled to each other, and are further coupled to at least node mx2.

A gate terminal of NMOS transistor N10-2 is configured to receive signal CLKBB. In some embodiments, the gate terminal of NMOS transistor N10-2 is coupled to at least an output terminal of inverter I2.

A source terminal of NMOS transistor N10-2 is coupled to a drain terminal of NMOS transistor N10-1. A source terminal of transistor N10-1 is coupled to the reference voltage supply VSS.

Latch 1006 includes an inverter I3, a transmission gate TG1, NMOS transistors N10-3 and N10-4 and PMOS transistors P10-3 and P10-4.

An input terminal of inverter I3 is coupled to at least node mx2, and is configured to receive signal S2. An output terminal of inverter I3 is coupled to at least node mx3, and is configured to output an inverted signal (not labeled) to at least the gate of PMOS transistor P10-1 and the gate of NMOS transistors N10-1.

Transmission gate TG1 is coupled between node mx3 and node mx4. Transmission gate TG1 is configured to receive an inverted signal (not labelled), signal CLKB and signal CLKBB. Transmission gate TG1 is configured to output signal S3 to inverter I4, PMOS transistor P10-3 and NMOS transistor N10-3. Transmission gate TG1 includes an NMOS transistor (not labelled) and a PMOS transistor (not labelled) that are coupled together.

A gate terminal of PMOS transistor P10-4 and a gate terminal of NMOS transistor N10-4 are coupled together, and are further coupled to at least node mx5.

A source terminal of PMOS transistor P10-4 is coupled to the voltage supply VDD. A drain terminal of PMOS transistor P10-4 is coupled to a source terminal of PMOS transistor P10-3.

A gate terminal of PMOS transistor P10-3 is configured to receive signal CLKBB. In some embodiments, the gate terminal of PMOS transistor P10-3 is coupled to at least an output terminal of inverter I2. Each of a drain terminal of PMOS transistor P10-3 and a drain terminal of NMOS transistor N10-3 are coupled to each other, and are further coupled to at least node mx4.

A gate terminal of NMOS transistor N10-3 is configured to receive signal CLKB. In some embodiments, the gate terminal of NMOS transistor N10-3 is coupled to at least an output terminal of inverter I1.

A source terminal of NMOS transistor N10-3 is coupled to a drain terminal of NMOS transistor N10-4. A source terminal of transistor N10-4 is coupled to the reference voltage supply VSS.

Output circuit 1008 includes an inverter I4 coupled to an inverter I5.

An input terminal of inverter I4 is coupled to at least node mx4, and is configured to receive signal S3. An output terminal of inverter I4 is coupled to and configured to output an inverted signal (not labeled) to at least an input terminal of inverter I5, the gate of PMOS transistor P10-4, the gate of NMOS transistor N10-4 or node mx5.

An input terminal of inverter I5 is coupled to at least node mx5, and is configured to receive the inverted signal from inverter I4. An output terminal of inverter I5 is configured to output the output signal Q.

An input terminal of inverter I1 is configured to receive a signal CP. An output terminal of inverter I1 is configured to output the signal CLKB to at least an input terminal of inverter I2. In some embodiments, the output terminal of inverter I1 is coupled to at least the gate terminal of PMOS transistor P10-2, the gate terminal of NMOS transistor N10-3, the gate terminal of the PMOS transistor of transmission gate TG1 or the gate terminal of the NMOS transistor of transmission gate TG2.

An input terminal of inverter I2 is configured to receive signal CLKB, and an output terminal of inverter I2 is configured to output the signal CLKBB. In some embodiments, the output terminal of inverter I2 is coupled to and outputs the signal CLKBB to at least the gate terminal of PMOS transistor P10-3, the gate terminal of NMOS transistor N10-2, the gate terminal of the PMOS transistor of transmission gate TG2 or the gate terminal of the NMOS transistor of transmission gate TG1.

An input terminal of inverter 1014 is configured to receive the selection signal SE. In some embodiments, the input terminal of inverter 1014 is coupled to the third input terminal of multiplexer 1002. An output terminal of inverter 1014 is configured to output the inverted selection signal SEB. In some embodiments, the output terminal of inverter 1014 is coupled to the third input terminal of multiplexer 1002.

Figure 10B:
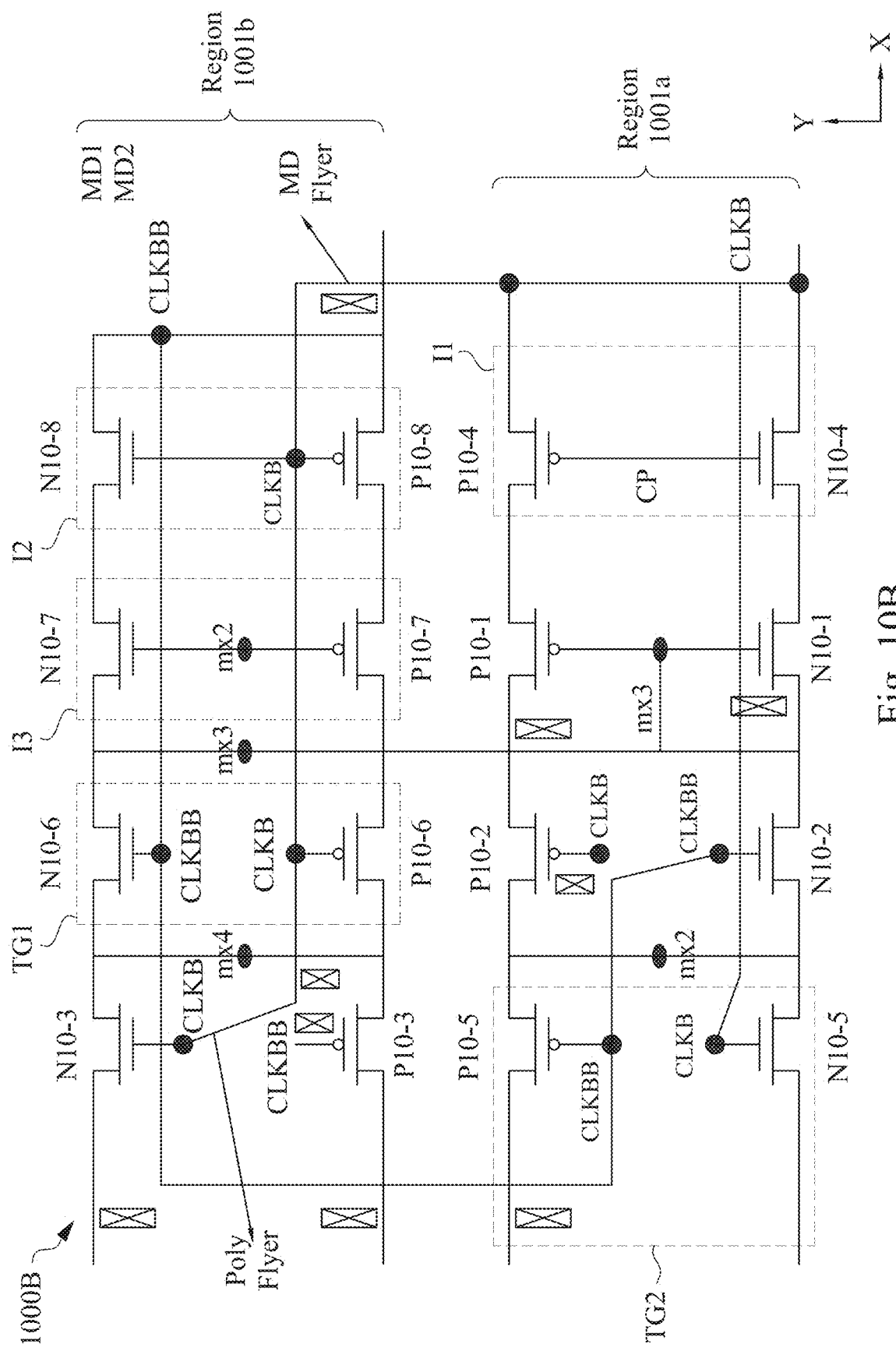
FIG. 10B is a circuit diagram of an integrated circuit, in accordance with some embodiments.

FIG. 10B is a circuit diagram of an integrated circuit 1000B, in accordance with some embodiments.

In some embodiments, integrated circuit 1000B is an embodiment of a portion of integrated circuit 1000A of FIG. 10A.

For example, integrated circuit 1000B includes portions of latch 1004, latch 1006, inverter I1 and inverter I2 from FIG. 10A.

Integrated circuit 1000B includes transmission gates TG1 and TG2, NMOS transistors N10-1, N10-2 and N10-3, PMOS transistors P10-1, P10-2 and P10-3, and inverters I1, I2 and I3 from FIG. 10A.

Transmission gate TG1 includes a PMOS transistor P10-6 and an NMOS transistor P10-6. Transmission gate TG2 includes a PMOS transistor P10-5 and an NMOS transistor P10-5. Inverter I1 includes a PMOS transistor P10-4 and an NMOS transistor P10-4. Inverter I2 includes a PMOS transistor P10-8 and an NMOS transistor P10-8. Inverter I3 includes a PMOS transistor P10-7 and an NMOS transistor P10-7.

Layout Design of an Integrated Circuit

FIGS. 11A-11F are diagrams of a layout design 1100A of an integrated circuit, in accordance with some embodiments. FIG. 11G is a diagram of a layout design 1100G of an integrated circuit, in accordance with some embodiments. Layout design 1100A or 1100G is a layout diagram of integrated circuit 1000B of FIG. 10B or a portion of integrated circuit 1000A of FIG. 10A.

Layout design 1100A or 1100G is usable to manufacture an integrated circuit similar to at least integrated circuit 1000B of FIG. 10B or a portion of integrated circuit 1000A of FIG. 10A. In some embodiments, layout design 1100A is useable to manufacture an integrated circuit similar to integrated circuit 1200 of FIGS. 12A-12B. In some embodiments, layout design 1100G is useable to manufacture an integrated circuit similar to integrated circuit 1200' of FIGS. 12C-12D.

Figure 11A:
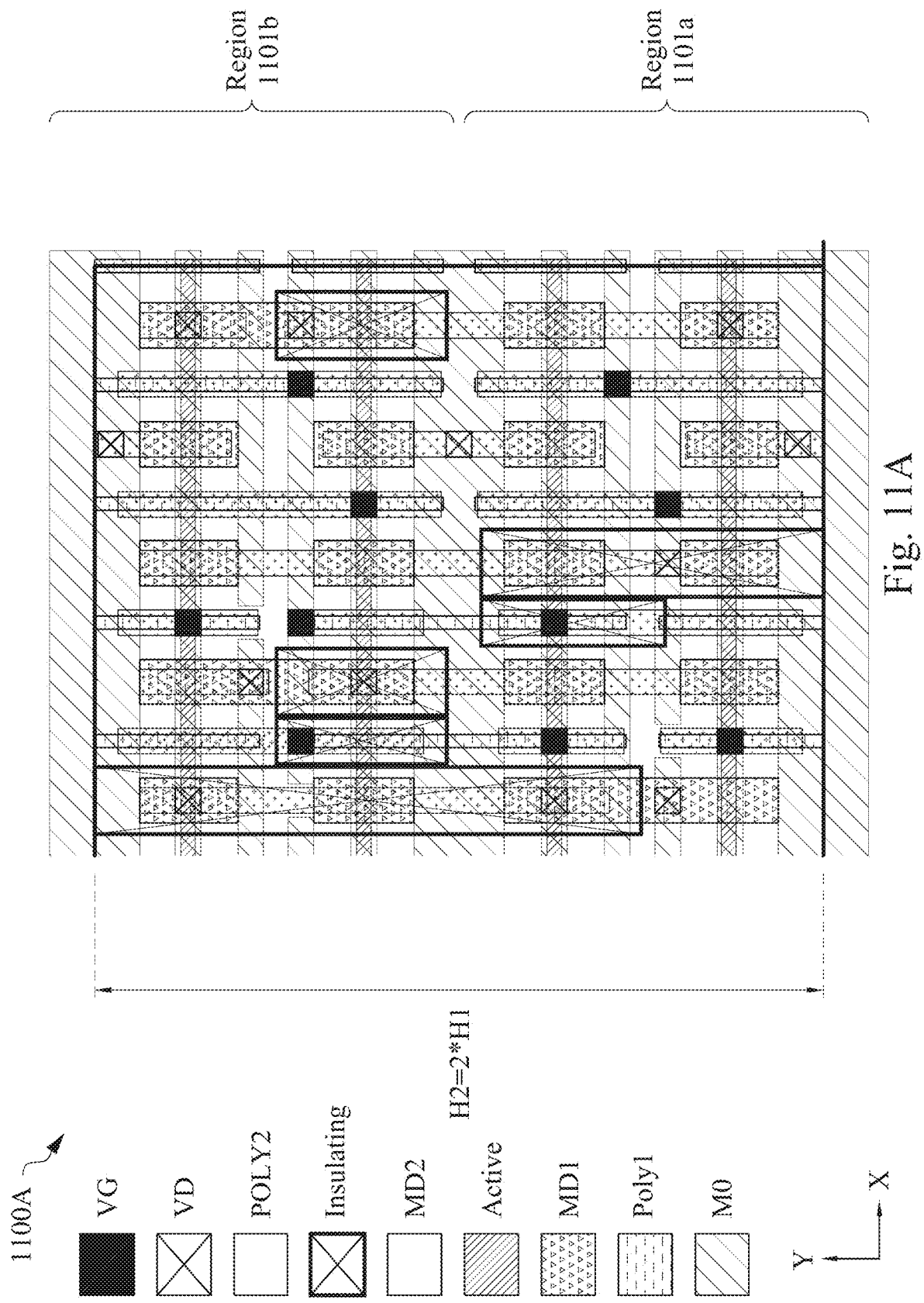
FIGS. 11A-11F are diagrams of a layout design of an integrated circuit, in accordance with some embodiments.
Figure 11B:
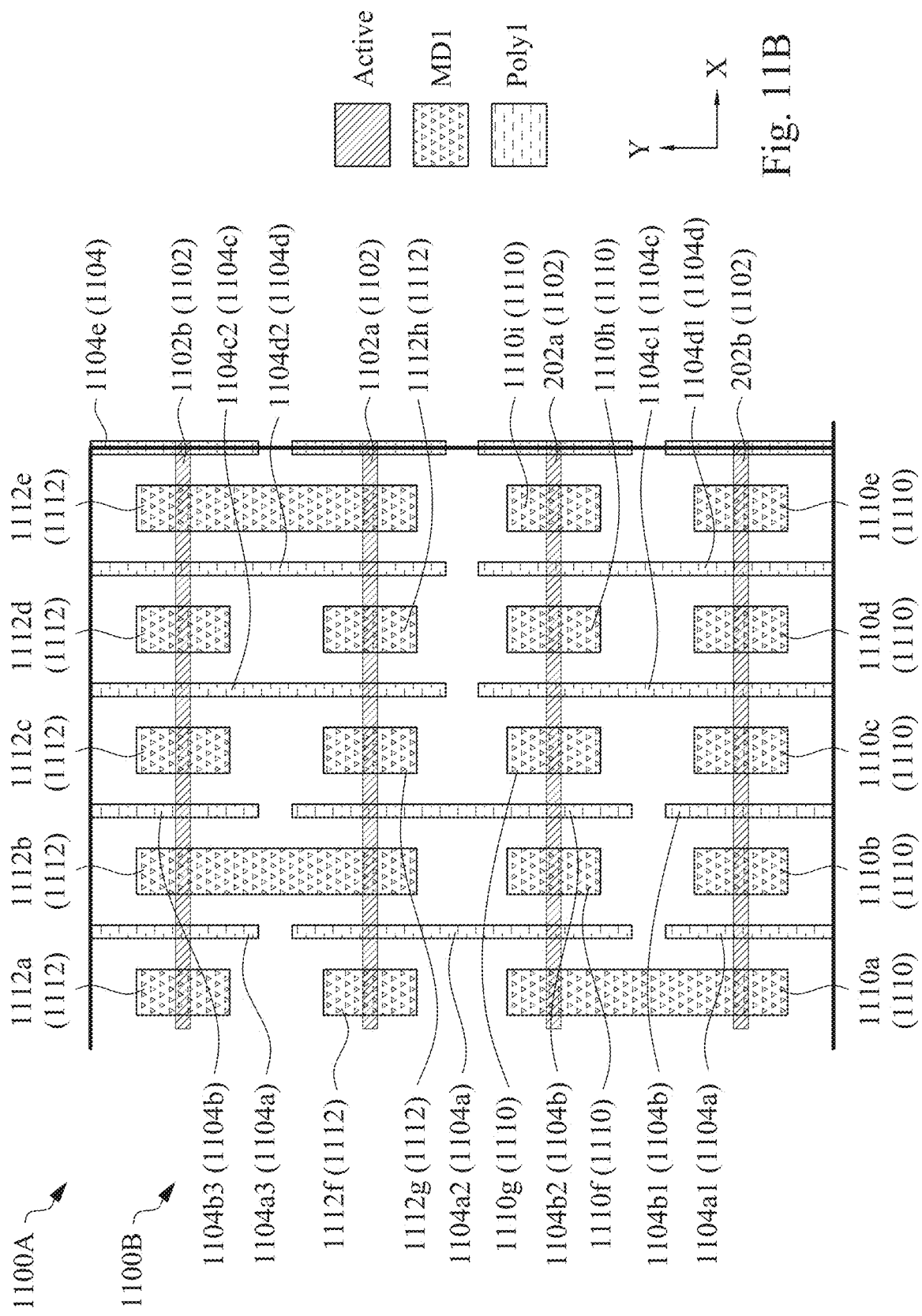
Figure 11C:
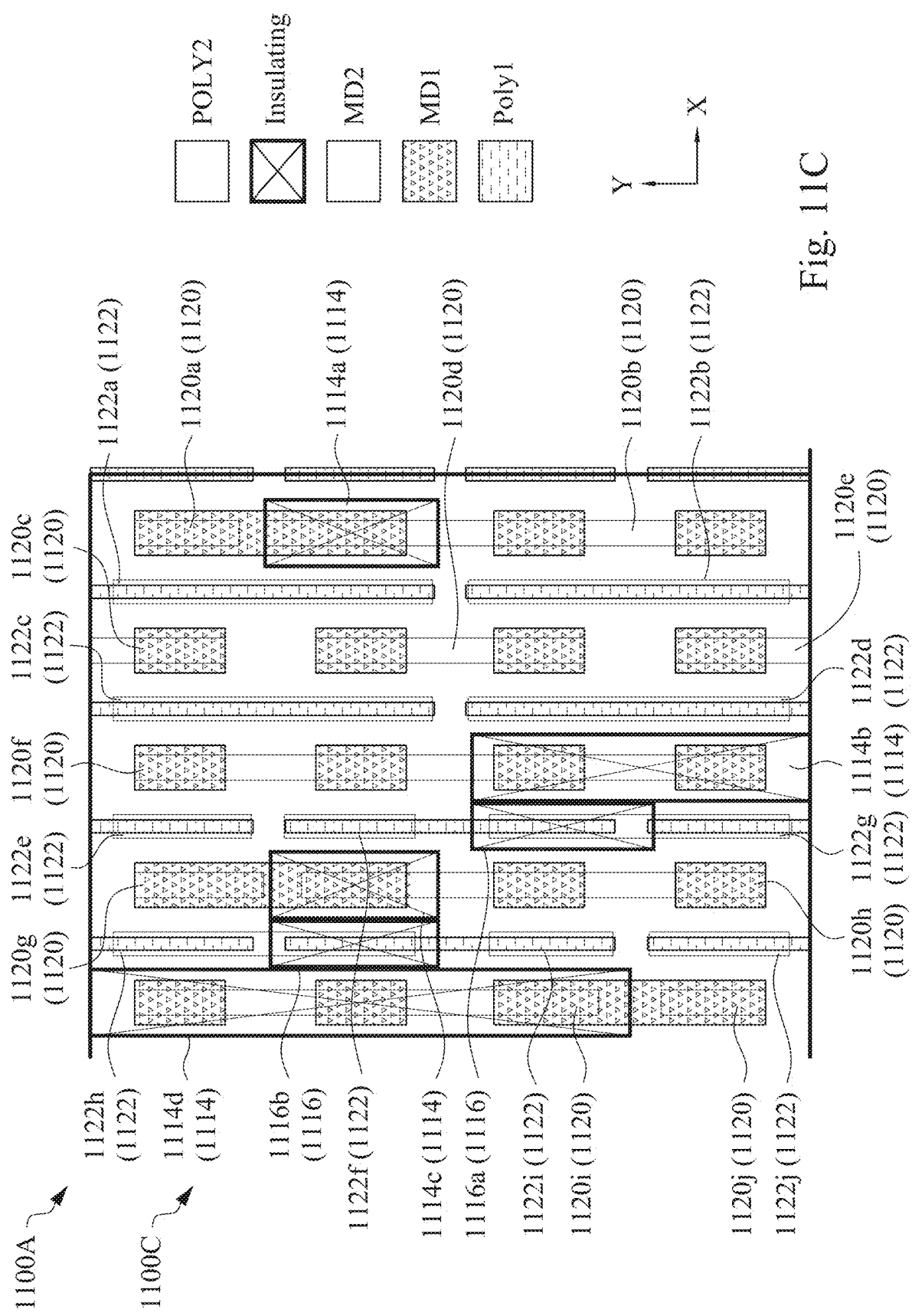
Figure 11D:
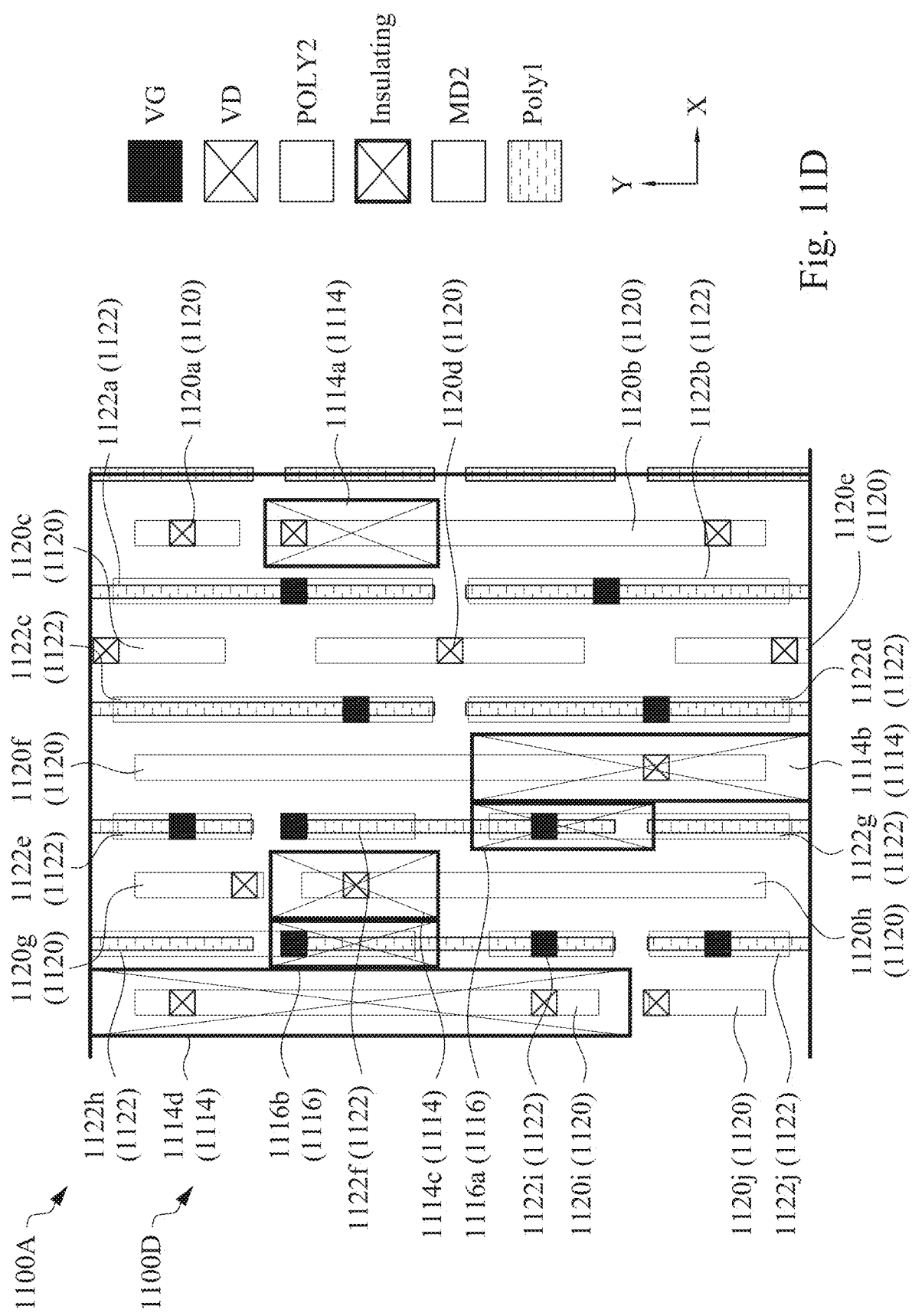
Figure 11E:
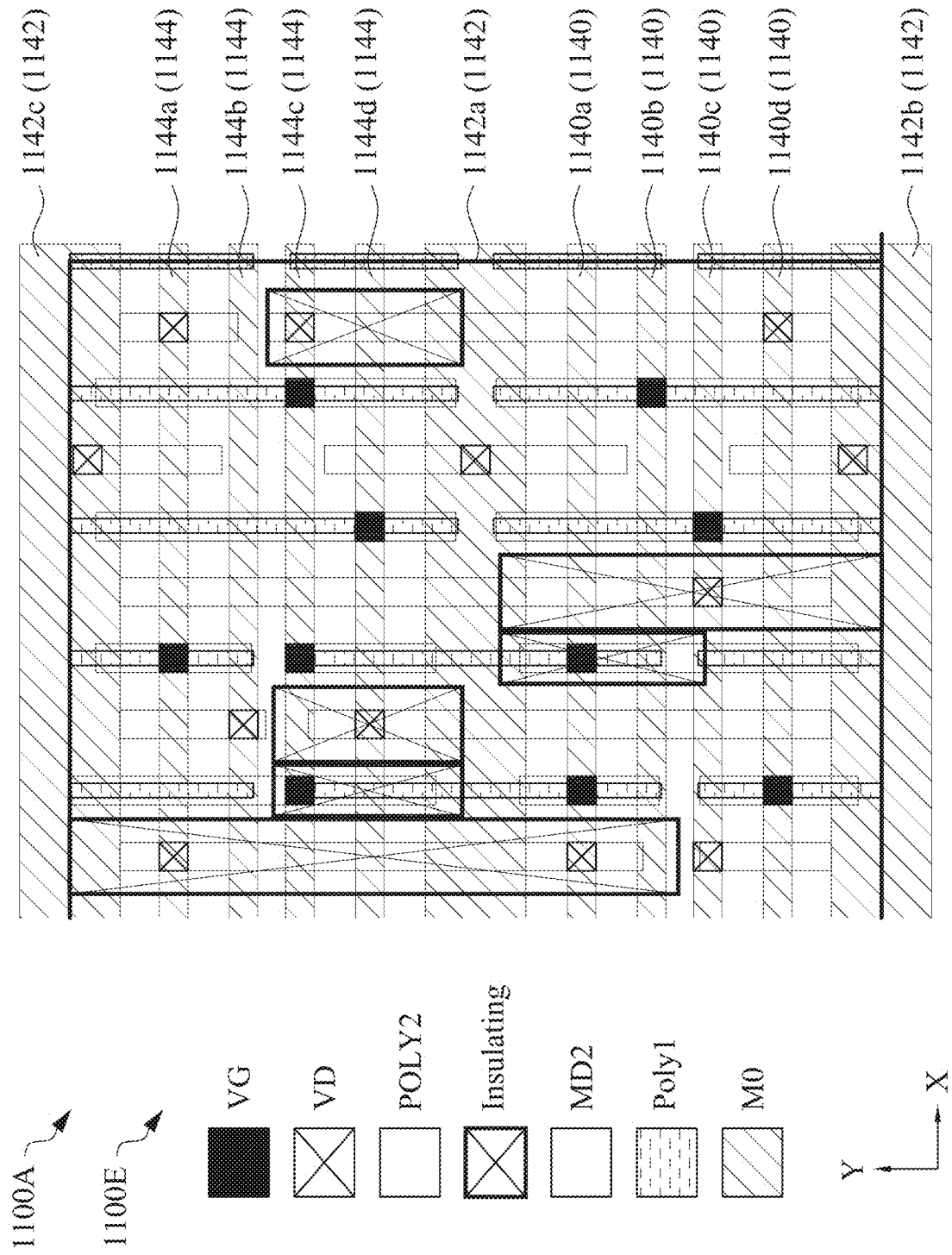
Figure 11F:
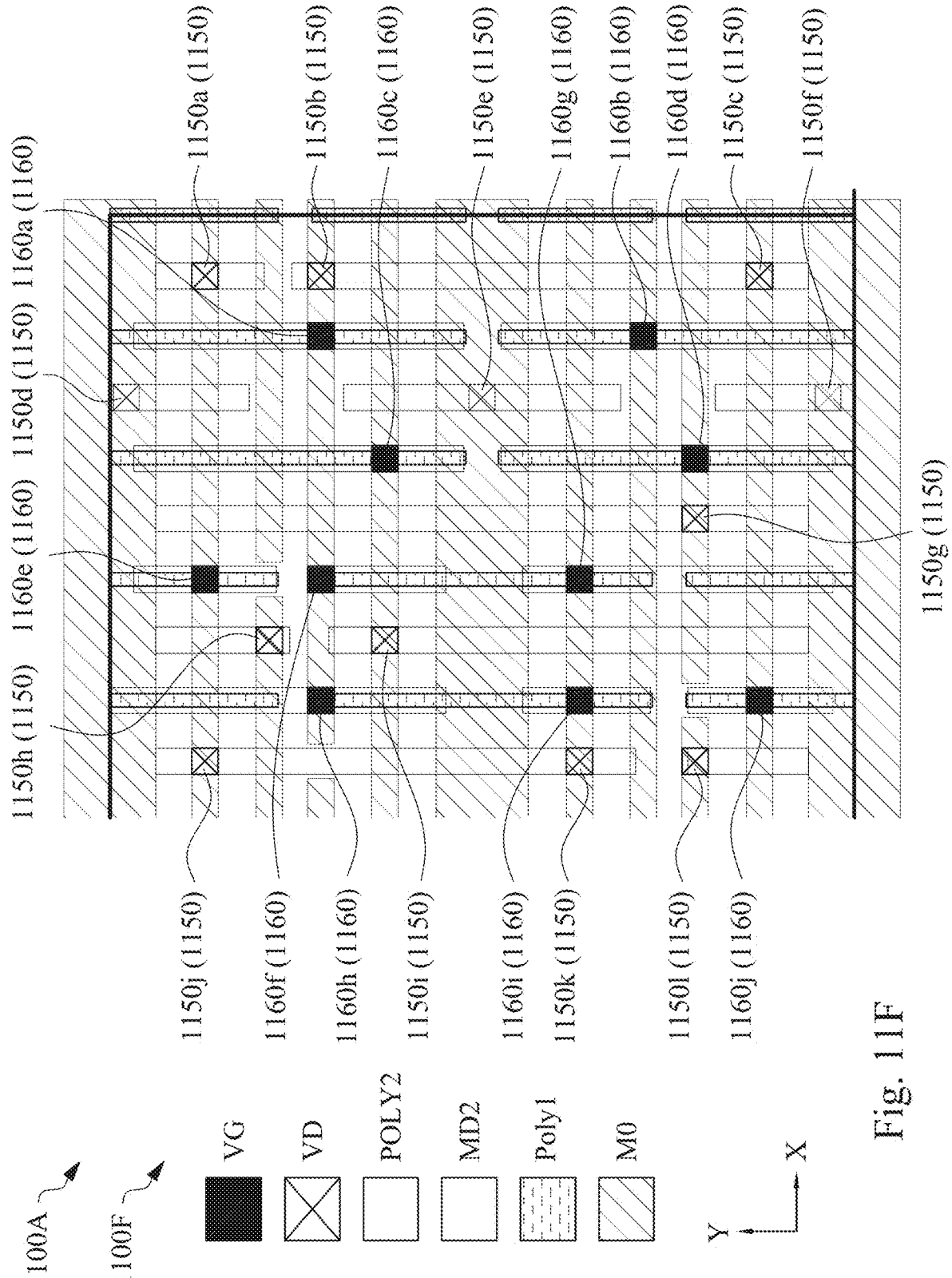
Figure 11G:
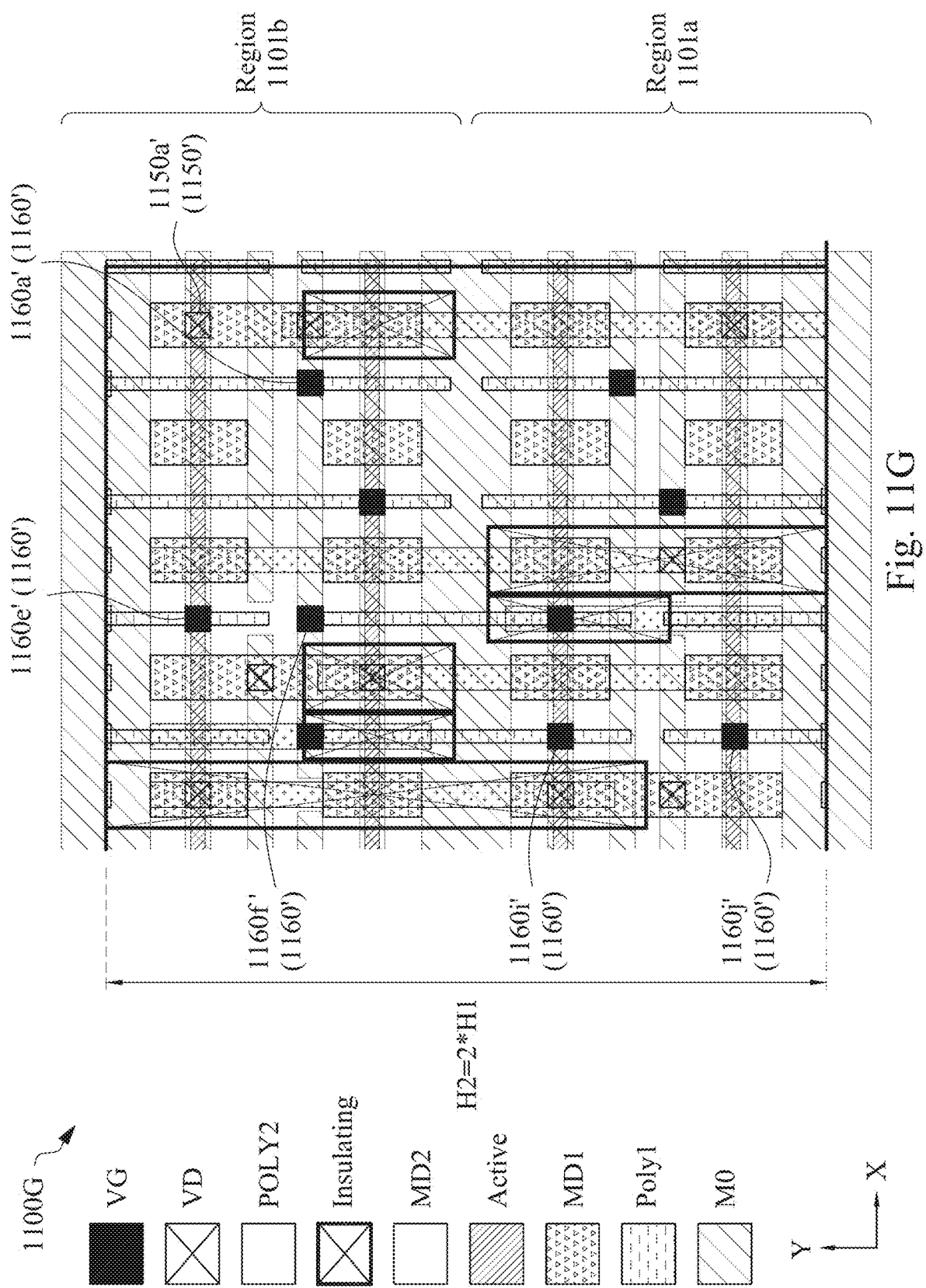
FIG. 11G is a diagram of a layout design of an integrated circuit, in accordance with some embodiments.

FIG. 11A is a diagram of a layout design 1100A. For ease of illustration, some of the labeled elements of FIGS. 11B-11F are not labelled in FIG. 11A. In some embodiments, FIGS. 11A-11F include additional elements not shown in FIGS. 11A-11F. FIG. 11G is a diagram of a layout design 1100G. Layout design 1100G is a variation of layout design 1100A, and does not include some of the elements of layout design 1100A. For ease of illustration, some of the labeled elements of FIGS. 11B-11F are not labelled in FIG. 11G. In some embodiments, FIG. 11G includes additional elements not shown in FIG. 11G.

FIGS. 11B-11F are diagrams of a corresponding portion 1100B-1100F of layout design 1100A of FIG. 11A, simplified for ease of illustration. Portion 1100B includes one or more features of layout design 1100A of FIG. 11A of the active (OD) level, the POLY1 level and the MD1 level of layout design 1100A. Portion 1100C includes one or more features of layout design 1100A of FIG. 11A between the POLY1 level, MD1 level, POLY2 level and the MD2 level of layout design 1100A. Portion 1100D includes one or more features of layout design 1100A of FIG. 11A between the POLY1 level, the POLY2 level, the MD2 level, the VG level and the VD level of layout design 1100A. Portion 1100E includes one or more features of layout design 1100A of FIG. 11A between the POLY1 level, the POLY2 level, the MD2 level, the VG level, the VD level and the M0 level of layout design 1100A. Portion 1100F includes one or more features of layout design 1100A of FIG. 11A of the POLY1 level, the POLY2 level, the MD2 level, the VG level, the VD level and the M0 level of layout design 1100A.

In some embodiments, layout design 1100A includes a region 1101a that is similar to portions of layout design 800 of FIG. 8, and similar detailed description is therefore omitted for brevity, and labelling of some similar elements in region 1101a is also omitted for ease of illustration.

Layout design 1100A has a height H2 in the second direction Y. In some embodiments, the height H2 is different from the height H1 of at least layout design 200, 500 or 800 (FIGS. 2, 5 or 8). In some embodiments, the height H2 is equal to two times the height H1. In some embodiments, the height H2 of layout design 1100 is referred to as a double height standard cell.

Layout design 1100A includes a set of active region layout patterns 1102, a set of gate layout patterns 1104, a set of metal over diffusion layout patterns 1110 and 1112, a set of insulating layer layout patterns 1114 and 1116, a set of metal over diffusion layout patterns 1120, a set of gate layout patterns 1122, a set of rail layout patterns 1142, a set of conductive feature layout patterns 1140 and 1144, and a set of via layout patterns 1150 and 1160.

Layout design 1100A is a variation of layout design 800 (FIG. 8). For example, in some embodiments, layout design 1100A includes elements that are similar to elements in layout design 800, and similar detailed description is therefore omitted.

In comparison with layout design 800 of FIG. 8, set of active region layout patterns 1102 replaces set of active region layout patterns 902, set of gate layout patterns 1104 replaces set of gate layout patterns 804, set of metal over diffusion layout patterns 1110 replaces set of metal over diffusion layout patterns 810, set of insulating layer layout patterns 1114 replaces set of insulating layer layout patterns 514, set of metal over diffusion layout patterns 1120 replaces set of metal over diffusion layout patterns 820, set of conductive feature layout patterns 1140 replaces set of conductive feature layout patterns 840 and set of via layout patterns 1150 replaces set of via layout patterns 850.

The set of active region layout patterns 1102 is similar to the set of active region layout patterns 902, the set of gate layout patterns 1104 or 1122 is similar to the set of gate layout patterns 804, the set of metal over diffusion layout patterns 1110 is similar to the set of metal over diffusion layout patterns 810, the set of insulating layer layout patterns 1114 or 1116 is similar to the set of insulating layer layout patterns 514, the set of metal over diffusion layout patterns 1120 is similar to the set of metal over diffusion layout patterns 820, the set of conductive feature layout patterns 1140 is similar to the set of conductive feature layout patterns 840, and the set of via layout patterns 1150 or 1160 is similar to the set of via layout patterns 850, and similar detailed description is therefore omitted.

In comparison with layout design 800 of FIG. 8, layout design 1100A further includes set of metal over diffusion layout patterns 1112, set of insulating layer layout patterns 1116, a set of gate layout patterns 1122, a set of conductive feature layout patterns 1144, and set of via layout patterns 1160.

In some embodiments, items in region 1101*b* are similar to corresponding items in region 1101*a*, and similar detailed description is therefore omitted. For example, in some embodiments, the set of metal over diffusion layout patterns 1112 in region 1101*b* is similar to the set of metal over diffusion layout patterns 810 in region 1101*a*, and the set of conductive feature layout patterns 1144 in region 1101*b* is similar to the set of conductive feature layout patterns 1140 in region 1101*a*, and similar detailed description is therefore omitted.

Set of active region layout patterns 1102 includes active region layout patterns 202*a*, 202*b*, 1102*a* and 1102*b*. The set of active region layout patterns 1102 is usable to manufacture a corresponding set of active regions 1202 (FIG. 9) of integrated circuit 900.

Active region layout patterns 1102*a*, 1102*b* of the set of active region layout patterns 1102 are similar to corresponding active region layout patterns 202*a*, 202*b* of the set of active region layout patterns 1102, and similar detailed description is therefore omitted.

In some embodiments, active region layout pattern 1102*a*, 1102*b* of the set of active region layout patterns 1102 is usable to manufacture corresponding active regions 1202*a*, 1202*b* of the set of active regions 1202 (FIGS. 12A-12D) of integrated circuit 1200-1200'.

In some embodiments, active region layout pattern 202*a* of the set of active region layout patterns 1102 is usable to manufacture source and drain regions of the PMOS transistors of region 1001*a* of integrated circuit 1000B (FIG. 10B), active region layout pattern 202*b* of the set of active region layout patterns 1102 is usable to manufacture source and drain regions of the NMOS transistors of region 1001*a* of integrated circuit 1000B (FIG. 10B), active region layout pattern 1102*b* of the set of active region layout patterns 1102 is usable to manufacture source and drain regions of the NMOS transistors of region 1001*b* of integrated circuit 1000B (FIG. 10B), and active region layout pattern 1102*a* of the set of active region layout patterns 1102 is usable to manufacture source and drain regions of the PMOS transistors of region 1001*b* of integrated circuit 1000B (FIG. 10B).

Set of gate layout patterns 1104 includes gate layout patterns 1104*a*, 1104*b*, 1104*c*, 1104*d* and 1104*e*. The set of gate layout patterns 1104 of layout design 1100A and integrated circuit 1200-1200' have a CPP of 20. For example, region 1001*a* has a CPP of 10 and region 1001*b* has a CPP of 10 resulting in layout design 1100A or 1100G having a total CPP of 20. The set of gate layout patterns 1104 is usable to manufacture a corresponding set of gates 1204 (FIGS. 12A-12D) of integrated circuit 1200-1200'. In some embodiments, gate layout patterns 1104*a*, 1104*b*, 1104*c*, 1104*d*, 1104*e* of the set of gate layout patterns 1104 are usable to manufacture corresponding gates 1204*a*, 1204*b*, 1204*c* (not labelled), 1204*d*, 1204*e* (not shown) of the set of gates 1204 (FIGS. 12A-12D) of integrated circuit 1200-1200'. Gate layout patterns 1104*a*, 1104*b*, 1104*c*, 1104*d*, 1104*e* are similar to gate layout patterns 504*b*, 504*c*, 504*d*, 804*e*, 804*f*, and similar detailed description is therefore omitted.

In some embodiments, gate layout pattern 1104*a* includes gate layout patterns 1104*a*1, 1104*a*2 and 1104*a*3. In some embodiments, gate layout pattern 1104*b* includes gate layout patterns 1104*b*1, 1104*b*2 and 1104*b*3. In some embodiments, gate layout pattern 1104*c* includes gate layout patterns 1104*c*1 and 1104*c*2. In some embodiments, gate layout pattern 1104*d* includes gate layout patterns 1104*d*1 and 1104*d*2.

In some embodiments, gate layout patterns 1104*a*1, 1104*a*2, 1104*a*3, 1104*b*1, 1104*b*2, 1104*b*3, 1104*c*1, 1104*c*2, 1104*d*1 and 1104*d*2 of the set of gate layout patterns 1104 are usable to manufacture corresponding gates 1204*a*1, 1204*a*2, 1204*a*3, 1204*b*1, 1204*b*2, 1204*b*3, 1204*c*1, 1204*c*2, 1204*d*1 and 1204*d*2 of the set of gates 1204 of integrated circuit 1200A-1200D.

In some embodiments, although layout design 1100A shows each of gate layout patterns 1104*a*, 1104*b*, 1104*c*, 1104*d* and 1104*e* as having discrete portions, each of gate layout patterns 1104*a*, 1104*b*, 1104*c*, 1104*d* and 1104*e* are continuous in the second direction Y, and the discontinuous portion represents cut poly layout patterns (not shown or described for brevity) that identify corresponding gate portions of the set of gates 1204 that are removed during manufacturing of the set of gates 1204 of integrated circuit 1200-1200' (FIGS. 12A-12D).

In some embodiments, gate layout pattern 1104*a* is usable to manufacture the gate terminals of PMOS transistor P10-5, NMOS transistor N10-5, NMOS transistor N10-3 and PMOS transistor P10-3 of FIG. 10B, gate layout pattern 1104*b* is usable to manufacture the gate terminal of PMOS transistor P10-6, NMOS transistor N10-6, NMOS transistor N10-2 and PMOS transistor P10-2 of FIG. 10B, gate layout pattern 1104*c* is usable to manufacture the gate terminals of PMOS transistor P10-7, NMOS transistor N10-7, NMOS transistor N10-1 and PMOS transistor P10-1 of FIG. 10B, gate layout pattern 1104*d* is usable to manufacture the gate terminals of PMOS transistor P10-4, NMOS transistor N10-4, PMOS transistor P10-8 and NMOS transistor N10-8 of FIG. 10B. Other configurations, arrangements on other layout levels or quantities of patterns in the set of gate layout patterns 1104 are within the scope of the present disclosure.

The set of metal over diffusion layout patterns 1110 or 1112 is usable to manufacture a corresponding set of contacts 1210 or 1212 (FIGS. 12A-12D) of integrated circuit 1200-1200'.

Set of metal over diffusion layout patterns 1110 includes metal over diffusion layout patterns 1110*a*, . . . , 1110*i*. In some embodiments, metal over diffusion layout patterns 1110*a*, . . . , 1110*i* of the set of metal over diffusion layout patterns 1110 are usable to manufacture corresponding contacts 1210*a*, . . . , 1210*i* of the set of contacts 1210 (FIGS. 12A-12D) of integrated circuit 1200-1200'.

Set of metal over diffusion layout patterns 1112 includes metal over diffusion layout patterns 1112*a*, ..., 1112*h*.

In some embodiments, metal over diffusion layout patterns 1112*a*, ..., 1112*h* of the set of metal over diffusion layout patterns 1112 are usable to manufacture corresponding contacts 1212*a*, ..., 1212*h* of the set of contacts 1212 (FIGS. 12A-12D) of integrated circuit 1200-1200'.

In some embodiments, at least one metal over diffusion layout pattern 1110*a*, ..., 1110*i* of the set of metal over diffusion layout patterns 1110 or at least one metal over diffusion layout pattern 1112*a*, ..., 1112*h* of the set of metal over diffusion layout patterns 1112 are similar to at least one corresponding metal over diffusion layout pattern of the set of metal over diffusion layout patterns 810 of FIG. 8, and similar detailed description is therefore omitted.

In comparison with FIG. 8, metal over diffusion layout pattern 1110*a* extends across active region layout patterns 202*a* and 202*b*. Similarly, each of metal over diffusion layout patterns 1112*b* and 1112*e* extend across active region layout patterns 1102*a* and 1102*b*.

In some embodiments, metal over diffusion layout patterns 1110*b*, ..., 1110*i* of the set of metal over diffusion layout patterns 1110 have a regular layout pattern. In some embodiments, metal over diffusion layout patterns 1112*b*, 1112*c*, 1112*d*, 1112*f*, 1112*g* and 1112*h* of the set of metal over diffusion layout patterns 1112 have a regular layout pattern.

Other configurations, arrangements on other layout levels or quantities of patterns in the set of metal over diffusion layout patterns 1110 and 1112 are within the scope of the present disclosure.

The set of insulating layer layout patterns 1114 includes at least insulating layer layout pattern 1114*a*, 1114*b*, 1114*c* or 1114*d*. The set of insulating layer layout patterns 1114 is usable to manufacture a corresponding set of insulating layers 1214 (FIGS. 12A-12D) of integrated circuit 1200-1200'. In some embodiments, insulating layer layout patterns 1114*a*, 1114*b*, 1114*c*, 1114*d* of the set of insulating layer layout patterns 1114 are usable to manufacture corresponding insulating layers 1214*a*, 1214*b*, 1214*c*, 1214*d* of the set of insulating layers 1214 (FIGS. 12A-12D) of integrated circuit 1200-1200'.

In some embodiments, at least insulating layer layout pattern 1114*a*, 1114*b*, 1114*c* or 1114*d* are variations of insulating layer layout pattern 514*a* of the set of insulating layer layout patterns 514 of FIG. 5 or 8, and similar detailed description is therefore omitted.

In some embodiments, insulating layer layout pattern 1114*a* overlaps a portion of metal over diffusion layout pattern 1112*e* and active region layout pattern 1102*a*. In some embodiments, insulating layer layout pattern 1114*a* is positioned below a portion of metal over diffusion layout pattern 1120*b*. In some embodiments, insulating layer layout pattern 1114*a* is positioned where a portion of metal over diffusion layout pattern 1120*b* overlaps a portion of metal over diffusion layout pattern 1112*e*.

In some embodiments, insulating layer layout pattern 1114*b* overlaps metal over diffusion layout patterns 1110*d* and 1110*h* and active region layout patterns 202*a* and 202*b*. In some embodiments, insulating layer layout pattern 1114*b* is positioned below a portion of metal over diffusion layout pattern 1120*f*. In some embodiments, insulating layer layout pattern 1114*b* is positioned where a portion of metal over diffusion layout pattern 1120*f* overlaps metal over diffusion layout patterns 1110*d* and 1110*h*.

In some embodiments, insulating layer layout pattern 1114*c* overlaps a portion of metal over diffusion layout pattern 1112*b* and active region layout pattern 1102*a*. In some embodiments, insulating layer layout pattern 1114*c* is positioned below a portion of metal over diffusion layout pattern 1120*h*. In some embodiments, insulating layer layout pattern 1114*c* is positioned where a portion of metal over diffusion layout pattern 1120*h* overlaps a portion of metal over diffusion layout pattern 1112*b*.

In some embodiments, insulating layer layout pattern 1114*d* overlaps metal over diffusion layout patterns 1112*a*, 1112*f* and 1110*a* and active region layout patterns 202*a*, 1202*a*, and 1202*b*. In some embodiments, insulating layer layout pattern 1114*d* is positioned below a portion of metal over diffusion layout pattern 1120*i*. In some embodiments, insulating layer layout pattern 1114*d* is positioned where a portion of metal over diffusion layout pattern 1120*i* overlaps metal over diffusion layout patterns 1112*a*, 1112*f* and 1110*a*.

Other configurations, arrangements on other layout levels or quantities of patterns in the set of insulating layer layout patterns 1114 are within the scope of the present disclosure.

The set of insulating layer layout patterns 1116 includes at least insulating layer layout pattern 1116*a* or 1116*b*. The set of insulating layer layout patterns 1116 extends in the second direction Y. The layout patterns of the set of insulating layer layout patterns 1116 are separated from an adjacent layout pattern of the set of insulating layer layout patterns 1116 in at least the first direction X or the second direction Y.

At least one of the layout patterns of the set of insulating layer layout patterns 1116 overlaps the set of gate layout patterns 1104. In some embodiments, at least one of the layout patterns of the set of insulating layer layout patterns 1116 overlaps the set of gate layout patterns 1104 and the set of active region layout patterns 1102. In some embodiments, at least one of the layout patterns of the set of insulating layer layout patterns 1116 is over at least one of the layout patterns of the set of gate layout patterns 1104. In some embodiments, at least one of the layout patterns of the set of insulating layer layout patterns 1116 is below at least one of the layout patterns of the set of gate layout patterns 1122.

In some embodiments, the set of insulating layer layout patterns 1116 is located between the first portion of the second layout level and the third layout level. In some embodiments, the third layout level corresponds to a POLY2 level of one or more of layout designs 200, 500, 800, 1100A or 1100G (FIGS. 2A-2C, 5, 8 or 11A-11G) or integrated circuit 300, 600, 900, 1200-1200' (FIGS. 3, 6A, 9 or 12A-12D). In some embodiments, the set of insulating layer layout patterns 1116 is located between the POLY2 level and the POLY1 level. In some embodiments, the POLY2 level is above the POLY1 level or the MD1 level. In some embodiments, the set of insulating layer layout patterns 1116 is located between a POLY2 portion and the POLY1 portion.

The set of insulating layer layout patterns 1116 is usable to manufacture a corresponding set of insulating layers 1216 (FIGS. 12A-12D) of integrated circuit 1200-1200'. In some embodiments, insulating layer layout patterns 1116*a*, 1116*b* of the set of insulating layer layout patterns 1116 are usable to manufacture corresponding insulating layers 1216*a*, 1216*b* of the set of insulating layers 1216 (FIGS. 12A-12D) of integrated circuit 1200-1200'.

In some embodiments, even though the set of insulating layer layout patterns 1116 are positioned over the set of gate layout patterns 1104, and the set of insulating layer layout patterns 1114 are positioned over the set of metal over diffusion layout patterns 1110, one or more of the insulating layer layout patterns of the set of insulating layer layout patterns 1116 is similar to one or more of the insulating layer layout patterns of the set of insulating layer layout patterns 514 or 1114 of FIGS. 5, 8 or 11, and similar detailed description is therefore omitted.

In some embodiments, insulating layer layout pattern 1116a overlaps a portion of gate layout pattern 1104b (e.g., gate layout pattern 1104b2). In some embodiments, insulating layer layout pattern 1116a is positioned below a portion of gate layout pattern 1122g. In some embodiments, insulating layer layout pattern 1116a is positioned where a portion of gate layout pattern 1122g overlaps gate layout pattern 1104b2.

In some embodiments, insulating layer layout pattern 1116b overlaps a portion of gate layout pattern 1104a (e.g., gate layout pattern 1104a2). In some embodiments, insulating layer layout pattern 1116b is positioned below a portion of gate layout pattern 1122h. In some embodiments, insulating layer layout pattern 1116b is positioned where a portion of gate layout pattern 1122h overlaps gate layout pattern 1104a2.

Other configurations, arrangements on other layout levels or quantities of patterns in the set of insulating layer layout patterns 1116 are within the scope of the present disclosure.

Set of metal over diffusion layout patterns 1120 includes at least metal over diffusion layout pattern 1120a, 1120b, . . . , 1120i or 1120j.

The set of metal over diffusion layout patterns 1120 is usable to manufacture a corresponding set of contacts 1220 (FIGS. 12A-12D) of integrated circuit 1200-1200'.

In some embodiments, the set of metal over diffusion layout patterns 1120 are below the set of conductive feature layout patterns 1140 or 1144. In some embodiments the set of metal over diffusion layout patterns 1120 are above the set of metal over diffusion layout patterns 1110 or the set of insulating layer layout patterns 1114.

In some embodiments, metal over diffusion layout patterns 1120a, 1120b, . . . , 1120j of the set of metal over diffusion layout patterns 1120 are usable to manufacture corresponding contacts 1220a, 1220b, . . . , 1220j of the set of contacts 1220 (FIGS. 12A-12D) of integrated circuit 1200-1200'. Contacts 1220b, 1220i of the set of contacts 1220 are shown in FIGS. 12A-12B, and the remaining contacts in the set of contacts 1220 are not shown for ease of illustration. In some embodiments, metal over diffusion layout patterns 1120b, 1120f and 1120i of the set of metal over diffusion layout patterns or other layout patterns similar to metal over diffusion layout patterns 1120b, 1120f and 1120i are referred to as "MD flyer layout patterns" as these layout patterns overlap or extend over at least a pair of metal over diffusion layout patterns in the MD1 level. For example, metal over diffusion layout pattern 1120b overlaps metal over diffusion layout patterns 1110e, 1110i and 1112e. Similarly, metal over diffusion layout pattern 1120f of the set of metal over diffusion layout patterns 1120 overlaps metal over diffusion layout patterns 1110c, 1110g, 1112c and 1112g, and insulating layer layout pattern 1114b. Similarly, metal over diffusion layout pattern 1120i of the set of metal over diffusion layout patterns 1120 overlaps metal over diffusion layout patterns 1110a, 1112a and 1112f. In some embodiments, the set of metal over diffusion layout patterns 1120 are configured to provide additional routing resources between region 1101a and region 1101b. In some embodiments, the set of metal over diffusion layout patterns 1120 overlap the central portion (not labelled) of layout design 1100A. In some embodiments, metal over diffusion layout patterns 1120b and 1120i overlap the central portion (not labelled) of layout design 1100A. In some embodiments, metal over diffusion layout patterns 1120b and 1120i extend between region 1101a and region 1101b.

In some embodiments, one or more of metal over diffusion layout patterns of the set of metal over diffusion layout patterns 1120 is similar to metal over diffusion layout pattern 220c, 520a, 820a, 820d of FIG. 5 or 8, and similar detailed description is therefore omitted.

In some embodiments, metal over diffusion layout pattern 1120b overlaps active region layout patterns 202a, 202b and 1102a and overlaps metal over diffusion layout patterns 1110e, 1110i and 1112e. In some embodiments, a portion of metal over diffusion layout patterns 1120b overlaps insulating layer layout pattern 1114a.

In some embodiments, metal over diffusion layout pattern 1120i overlaps active region layout patterns 202b, 1102b and 1102a and overlaps metal over diffusion layout patterns 1110a, 1112a and 1112f. In some embodiments, a portion of metal over diffusion layout patterns 1120i overlaps insulating layer layout pattern 1114d.

In some embodiments, metal over diffusion layout pattern 1120f overlaps active region layout patterns 202a, 202b, 1102b and 1102a and overlaps metal over diffusion layout patterns 1110c, 1110g, 1112c and 1112g. In some embodiments, a portion of metal over diffusion layout patterns 1120i overlaps insulating layer layout pattern 1114b.

In some embodiments, metal over diffusion layout pattern 1120h overlaps active region layout patterns 202a, 202b and 1102a and overlaps metal over diffusion layout patterns 1110b, 1110f and 1112b. In some embodiments, a portion of metal over diffusion layout patterns 1120i overlaps insulating layer layout pattern 1114c.

In some embodiments, at least metal over diffusion layout pattern 1110i or a portion of metal over diffusion layout pattern 1120b is usable to manufacture the drain terminal of PMOS transistor P10-4 of FIG. 10B. In some embodiments, at least metal over diffusion layout pattern 1110e or a portion of metal over diffusion layout pattern 1120b is usable to manufacture the drain terminal of NMOS transistor N10-4 of FIG. 10B.

In some embodiments, at least metal over diffusion layout pattern 1110h is usable to manufacture the source terminal of PMOS transistor P10-4 or the source terminal of PMOS transistor P10-1 of FIG. 10B. In some embodiments, at least metal over diffusion layout pattern 1110d is usable to manufacture the source terminal of NMOS transistor N10-4 or the source terminal of NMOS transistor N10-1 of FIG. 10B.

In some embodiments, at least metal over diffusion layout pattern 1110g is usable to manufacture the source terminal of PMOS transistor P10-2 or the drain terminal of PMOS transistor P10-1 of FIG. 10B. In some embodiments, at least metal over diffusion layout pattern 1110c is usable to manufacture the source terminal of NMOS transistor N10-2 or the drain terminal of NMOS transistor N10-1 of FIG. 10B.

In some embodiments, at least metal over diffusion layout pattern 1110f is usable to manufacture the drain terminal of PMOS transistor P10-2 or the drain terminal of PMOS transistor P10-5 of FIG. 10B. In some embodiments, at least metal over diffusion layout pattern 1110b is usable to manufacture the drain terminal of NMOS transistor N10-2 or the drain terminal of NMOS transistor N10-5 of FIG. 10B.

In some embodiments, at least metal over diffusion layout pattern 1110a is usable to manufacture the source terminal of PMOS transistor P10-5 and the source terminal of NMOS transistor N10-5 of FIG. 10B.

In some embodiments, at least metal over diffusion layout pattern 1112f is usable to manufacture the source terminal of PMOS transistor P10-3 of FIG. 10B. In some embodiments, at least metal over diffusion layout pattern 1112*a* is usable to manufacture the source terminal of NMOS transistor N10-3 of FIG. 10B.

In some embodiments, at least metal over diffusion layout pattern 1112*b* is usable to manufacture at least the drain terminal of PMOS transistor P10-6, the drain terminal of PMOS transistor P10-3, the drain terminal of NMOS transistor N10-6 or the drain terminal of NMOS transistor N10-3 of FIG. 10B.

In some embodiments, at least metal over diffusion layout pattern 1112*g* is usable to manufacture the source terminal of PMOS transistor P10-6 or the source terminal of PMOS transistor P10-7 of FIG. 10B. In some embodiments, at least metal over diffusion layout pattern 1112*c* is usable to manufacture the source terminal of NMOS transistor N10-6 or the source terminal of NMOS transistor N10-7 of FIG. 10B.

In some embodiments, at least metal over diffusion layout pattern 1112*h* is usable to manufacture the drain terminal of PMOS transistor P10-8 or the drain terminal of PMOS transistor P10-7 of FIG. 10B. In some embodiments, at least metal over diffusion layout pattern 1112*d* is usable to manufacture the drain terminal of NMOS transistor N10-8 or the drain terminal of NMOS transistor N10-7 of FIG. 10B.

In some embodiments, at least metal over diffusion layout pattern 1112*e* is usable to manufacture the source terminal of PMOS transistor P10-8 and the source terminal of NMOS transistor N10-8 of FIG. 10B.

Other configurations, arrangements on other layout levels or quantities of patterns in the set of metal over diffusion layout patterns 1120 are within the scope of the present disclosure.

The set of gate layout patterns 1122 extends in the second direction Y. In some embodiments, at least one of the set of gate layout patterns 1122 overlaps a portion of the set of gate layout patterns 1104, the set of active region layout patterns 1102 or the set of insulating layer layout patterns 1116. The layout patterns of the set of gate layout patterns 1122 are separated from an adjacent layout pattern of the set of gate layout patterns 1122 in at least the first direction X or the second direction Y.

In some embodiments, the set of gate layout patterns 1122 is located on at least the set of gate layout patterns 1104 or the set of insulating layer layout patterns 1116. The set of gate layout patterns 1122 is located on the third layout level. In some embodiments, the third layout level corresponds to a second poly (POLY2) level of one or more of layout designs 200, 500, 800, 1100A or 1100G (FIG. 2A-2C, 5, 8 or 11A-11G) or integrated circuit 300, 600, 900, 1200-1200' (FIG. 3, 6A, 9 or 12A-12D). In some embodiments, the POLY2 level is above the POLY1 level or the MD1 level. In some embodiments, the third layout level is above the first portion (POLY1) of the second layout level or the second portion (MD1) of the second layout level. In some embodiments, the POLY2 level is on a same level as the MD2 level.

In some embodiments, the set of gate layout patterns 1122 are below the set of conductive feature layout patterns 1140 or 1144. In some embodiments the set of gate layout patterns 1122 are above the set of gate layout patterns 1104 or the set of insulating layer layout patterns 1116.

The set of gate layout patterns 1122 includes at least gate layout pattern 1122*a*, 1122*b*, . . . , 1122*i* or 1122*j*.

The set of gate layout patterns 1122 is usable to manufacture a corresponding set of gates 1222 (FIGS. 12A-12D) of integrated circuit 1200-1200'.

In some embodiments, gate layout patterns 1122*a*, 1122*b*, . . . , 1122*j* of the set of gate layout patterns 1122 are usable to manufacture corresponding gates 1222*a*, 1222*b*, . . . , 1222*j* of the set of gates 1222 (FIGS. 12A-12D) of integrated circuit 1200-1200'.

In some embodiments, gate layout patterns 1122*g* and 1122*h* of the set of gate layout patterns or other layout patterns similar to gate layout patterns 1122*g* and 1122*h* are referred to as "Poly flyer layout patterns" as these layout patterns overlap or extend over at least a portion of a gate layout pattern of a set of gate layout patterns 1104 and a portion of an insulating layer layout pattern of the set of insulating layer layout patterns 1116. For example, gate layout pattern 1122*g* overlaps insulating layer layout pattern 1116*a* and portions of gate layout pattern 1104*b* (e.g., gate layout pattern 1104*b*1 and portions of gate layout pattern 1104*b*2). Similarly, gate layout pattern 1122*h* overlaps insulating layer layout pattern 1116*b* and portions of gate layout pattern 1104*a* (e.g., gate layout pattern 1104*a*2 and portions of gate layout pattern 1104*a*3).

In some embodiments, even though the set of gate layout patterns 1122 are positioned over the set of gate layout patterns 1104, and the set of metal over diffusion layout patterns 1120 are positioned over the set of metal over diffusion layout patterns 1110, one or more of the gate layout patterns of the set of gate layout patterns 1122 is similar to one or more of the metal over diffusion layout patterns 220, 520, 820, 1120 of FIG. 2, 5, 8 or 11A-11G, and similar detailed description is therefore omitted.

In some embodiments, gate layout pattern 1122*g* overlaps active region layout patterns 202*a* and 202*b*, and is overlapped by the set of conductive feature layout patterns 1140. In some embodiments, gate layout pattern 1122*h* overlaps active region layout patterns 1102*a* and 1102*b*, and is overlapped by the set of conductive feature layout patterns 1144.

In some embodiments, by positioning the set of gate layout patterns 1122 to overlap the set of gate layout patterns 1104 and the set of insulating layer layout patterns 1116, the set of gate layout patterns 1122 provide additional routing resources in the second direction Y and located below upper metallization layers (e.g., M0, M1, etc.) in layout design 1100. By providing routing resources below upper metallization levels (e.g., M0, M1, etc.), the use of the upper metallization levels (e.g., M0, M1, etc.) can be reduced or the upper metallization levels (e.g., M0, M1, etc.) can be utilized as additional routing resources resulting in layout design 1100A or 1100G having a smaller area and standard cell than other approaches.

Other configurations, arrangements on other layout levels or quantities of patterns in the set of gate layout patterns 1122 are within the scope of the present disclosure.

The set of power rail layout patterns 1142 is usable to manufacture a corresponding set of power rails 1242 (FIGS. 12A-12D) of integrated circuit 1200-1200'. Set of power rails 1242 includes at least power rail layout pattern 1142*a*, 1142*b* or 1142*c*.

In comparison with layout design of FIG. 8, power rail layout patterns 1142*a*, 1142*b* replace corresponding power rail layout patterns 242*a*, 242*b* of the set of power rail layout patterns 242 of FIG. 8, and similar detailed description is therefore omitted. Similarly, power rail layout pattern 1142*c* is similar to power rail layout patterns 242*b* of the set of power rail layout patterns 242 of FIG. 8, and similar detailed description is therefore omitted.

Power rail layout pattern 1142*a* extends in the first direction X across a middle portion of layout design 1100A or 1100G. Power rail layout patterns 1142b and 1142c extend in the first direction X along opposite edges of layout design 1100A or 1100G.

In some embodiments, power rail layout pattern 1142a, 1142b, 1142c of the set of power rail layout patterns 1142 are usable to manufacture corresponding power rails 1242a (not shown), 1242b (not shown), 1242c (not shown) of the set of power rails 1242 (FIGS. 12A-12D) of integrated circuit 1200-1200'.

Other configurations, arrangements on other layout levels or quantities of patterns in the set of rail layout patterns 1142 are within the scope of the present disclosure.

The set of conductive feature layout patterns 1140 or 1144 is usable to manufacture a corresponding set of conductive features 1240 or 1244 (FIGS. 12A-12D) of integrated circuit 1200-1200'.

Set of conductive feature layout patterns 1140 includes at least conductive feature layout patterns 1140a, 1140b, 1140c or 1140d. In comparison with layout design of FIG. 8, conductive feature layout patterns 1140a, 1140b, 1140c, 1140d replace corresponding conductive feature layout patterns 840a, 840b 840c, 540d of the set of conductive feature layout patterns 840 of FIG. 8, and similar detailed description is therefore omitted.

In some embodiments, conductive feature layout patterns 1140a, 1140b, 1140c, 1140d of the set of conductive feature layout patterns 1140 are usable to manufacture corresponding conductive features 1240a, 1240b (not shown), 1240c (not shown), 1240d of the set of conductive features 1240 (FIGS. 12A-12D) of integrated circuit 1200-1200'.

Set of conductive feature layout patterns 1144 includes at least conductive feature layout patterns 1144a, 1144b, 1144c or 1144d. In comparison with layout design of FIG. 8, conductive feature layout patterns 1144a, 1144b, 1144c, 1144d replace corresponding conductive feature layout patterns 840a, 840b 840c, 540d of the set of conductive feature layout patterns 840 of FIG. 8, and similar detailed description is therefore omitted.

In some embodiments, conductive feature layout patterns 1144a, 1144b, 1144c, 1144d of the set of conductive feature layout patterns 1144 are usable to manufacture corresponding conductive features 1244a, 1244b (not shown), 1244c, 1244d (not shown) of the set of conductive features 1244 (FIGS. 12A-12D) of integrated circuit 1200-1200'.

Other configurations, arrangements on other layout levels or quantities of patterns in the set of conductive feature layout patterns 1140 or 1144 are within the scope of the present disclosure.

Set of via layout patterns 1150 includes at least via layout patterns 1150a, . . . , 1150l. In some embodiments, the set of via layout patterns 1150 is positioned in the VD level. In some embodiments, at least one via layout pattern of the set of via layout patterns 1150 is positioned in the VDT level. The set of via layout patterns 1150 is usable to manufacture a corresponding set of vias 1250 (FIGS. 12A-12D) of integrated circuit 1200-1200'. In some embodiments, the set of via layout patterns 1150 are between the set of conductive feature layout patterns 1140 or 1144 and either the set of metal over diffusion layout patterns 1110 or the set of metal over diffusion layout patterns 1120.

In some embodiments, via layout patterns 1150a, . . . , 1150l of the set of via layout patterns 1150 are usable to manufacture corresponding vias 1250a, . . . , 1250l of the set of vias 1250 (FIGS. 12A-12D) of integrated circuit 1200-1200'. Vias 1250a, 1250b, 1250c, 1250j, 1250k of the set of vias 1250 are shown in FIGS. 12A-12D, and the remaining vias in the set of vias 1250 are not shown for ease of illustration.

In comparison with layout design 800 of FIG. 8, via layout patterns 1150e, 1150f replace corresponding via layout patterns 850c, 850e of FIG. 8, and similar detailed description is therefore omitted. In comparison with layout design 800 of FIG. 8, via layout pattern 1150d is similar to via layout pattern 850e of FIG. 8, and similar detailed description is therefore omitted.

In comparison with layout design 800 of FIG. 8, via layout patterns 1150a, 1150b, 1150c, 1150g, . . . , 1150l are similar to at least via layout patterns 850a of FIG. 8, and similar detailed description is therefore omitted.

Via layout pattern 1150a is between conductive feature layout pattern 1144a and metal over diffusion layout pattern 1120a. Via layout pattern 1150b is between conductive feature layout pattern 1144c and metal over diffusion layout pattern 1120b. Via layout pattern 1150c is between conductive feature layout pattern 1140d and metal over diffusion layout pattern 1120b. Via layout pattern 1150j is between conductive feature layout pattern 1144a and metal over diffusion layout pattern 1120i. Via layout pattern 1150k is between conductive feature layout pattern 1140a and metal over diffusion layout pattern 1120i. The positioning of each of the remaining via layout patterns in the set of via layout patterns 1150 are not described for brevity.

Other configurations, arrangements on other layout levels or quantities of patterns in the set of via layout patterns 1150 are within the scope of the present disclosure.

Set of via layout patterns 1160 includes at least via layout patterns 1160a, . . . , 1160j. The set of via layout patterns 1160 is usable to manufacture a corresponding set of vias 1260 (FIGS. 12A-12D) of integrated circuit 1200-1200'. In some embodiments, the set of via layout patterns 1160 are between the set of conductive feature layout patterns 1140 or 1144 and either the set of gate layout patterns 1104 or the set of gate layout patterns 1122.

Set of via layout patterns 1160 are positioned at a via over gate (VG) level or a tall via over gate (VGT) level of one or more of layout designs 200, 500, 800, 1100A or 1100G (FIGS. 2A-2C, 5, 8 or 11A-11G) or integrated circuit 300, 600, 900, 1200-1200' (FIGS. 3, 6A, 9 or 12A-12D). In some embodiments, the VG level is between the M0 level and the POLY2 level. In some embodiments, the VGT level is between the M0 level and the POLY1 level. In some embodiments, the POLY2 level is above the POLY1 level or the MD1 level. In some embodiments, the VGT level is between the fourth layout level and the first portion of the second layout level (POLY1). In some embodiments, the VG level is between the fourth layout level and the third layout level (POLY2). Other layout levels are within the scope of the present disclosure.

In some embodiments, via layout patterns 1160a, . . . , 1160j of the set of via layout patterns 1160 are usable to manufacture corresponding vias 1260a, . . . , 1260j of the set of vias 1260 (FIGS. 12A-12D) of integrated circuit 1200-1200'. Vias 1260a, 1260e, 1260f, 1260g, 1260h, 1260i, 1260j of the set of vias 1260 are shown in FIGS. 12A-12D, and the remaining vias in the set of vias 1260 are not shown for ease of illustration.

Via layout pattern 1160a is between conductive feature layout pattern 1144c and gate layout pattern 1122d. Via layout pattern 1160e is between conductive feature layout pattern 1144a and gate layout pattern 1122e. Via layout pattern 1160f is between conductive feature layout pattern 1140a and gate layout pattern 1122f. Via layout pattern 1160g is between conductive feature layout pattern 1144a and gate layout pattern 1122g. Via layout pattern 1160h is between conductive feature layout pattern 1140a and gate layout pattern 1122h. Via layout pattern 1160i is between conductive feature layout pattern 1144a and gate layout pattern 1122i. Via layout pattern 1160j is between conductive feature layout pattern 1140d and gate layout pattern 1122j. The positioning of each of the remaining via layout patterns in the set of via layout patterns 1160 are not described for brevity.

Other configurations, arrangements on other layout levels or quantities of patterns in the set of via layout patterns 1160 are within the scope of the present disclosure.

FIG. 11G is a diagram of a layout design 1100G of an integrated circuit, in accordance with some embodiments.

Layout design 1100G of FIG. 11G is a variation of layout design 1100A (FIGS. 11A-11F). In comparison with layout design 1100A of FIGS. 11A-11F, layout design 1100G of FIG. 11G includes at least via layout patterns positioned on the VGT, VDT, VG or VD level.

In comparison with layout design 1100A of FIGS. 11A-11F, set of metal over diffusion layout patterns 1120' of layout design 1100G replaces set of metal over diffusion layout patterns 1120, set of gate layout patterns 1122' of layout design 1100G replaces set of gate layout patterns 1122, set of via layout patterns 1150' of layout design 1100G replaces set of via layout patterns 1150, and set of via layout patterns 1160' replaces set of via layout patterns 1160 of layout design 1100G, and similar detailed description is therefore omitted.

In comparison with set of metal over diffusion layout patterns 1120 of FIGS. 11A-11F, set of metal over diffusion layout patterns 1120' does not include metal over diffusion layout patterns 1120a, 1120c, 1120d, 1120e, 1120g and 1120j. In some embodiments, metal over diffusion layout patterns 1120b, 1120f, 1120h, 1120i of the set of metal over diffusion layout 1120 are usable to manufacture corresponding contacts 1220b, 1220f, 1220h, 1220i of the set of contacts 1220' (FIGS. 12A-12D) of integrated circuit 1200-1200'. Other configurations or arrangements of the set of metal over diffusion layout patterns 1120' are within the scope of the present disclosure.

In comparison with set of gate layout patterns 1122 of FIGS. 11A-11F, set of gate layout patterns 1122' does not include gate layout patterns 1122a, 1122b, 1122c, 1122d, 1122e, 1122f, 1122i and 1122j. In some embodiments, gate layout patterns 1122g, 1122h of the set of gate layout patterns 1122' are usable to manufacture corresponding gates 1222g, 1222h of the set of gates 1222' (FIGS. 12A-12D) of integrated circuit 1200-1200'. Other configurations or arrangements of the set of gate layout patterns 1122' are within the scope of the present disclosure.

The set of via layout patterns 1150' includes at least via layout patterns 1150a', . . . , 1150k or 1150l. In comparison with layout design 1100A, via layout pattern 1150a' replaces via layout pattern 1150a of FIGS. 11A-11F, and similar detailed description is therefore omitted. In some embodiments, via layout patterns 1150a', . . . , 1150l of the set of via layout patterns 1150' are usable to manufacture corresponding vias 1250a', . . . , 1250l of the set of vias 1250' (FIGS. 12A-12D) of integrated circuit 1200-1200'.

Via layout pattern 1150a' is between conductive feature layout pattern 1144a and metal over diffusion layout pattern 1112e. In some embodiments, via layout pattern 1150a' is positioned at the VDT level. Other configurations or arrangements of the set of via layout patterns 1150' are within the scope of the present disclosure.

The set of via layout patterns 1160' includes at least via layout patterns 1160a', 1160b, . . . , 1160e', 1160f', 1160g, 1160h, 1160i' or 1160j'. In comparison with layout design 1100A, via layout patterns 1160a', 1160e', 1160f', 1160i', 1160j' replace corresponding via layout patterns 1160a, 1160e, 1160f, 1160i, 1160j of FIGS. 11A-11F, and similar detailed description is therefore omitted. In some embodiments, via layout patterns 1160a', 1160b, . . . , 1160e', 1160f', 1160g, 1160h, 1160i' or 1160j' of the set of via layout patterns 1160' are usable to manufacture corresponding vias 1260a', 1260b, . . . , 1260e', 1260f', 1260g, 1260h, 1260i' or 1260j' of the set of vias 1260' (FIGS. 12A-12D) of integrated circuit 1200-1200'.

Via layout pattern 1160a' is between conductive feature layout pattern 1244c and gate layout pattern 1104d2. Via layout pattern 1160e' is between conductive feature layout pattern 1144a and gate layout pattern 1104b3. Via layout pattern 1160f' is between conductive feature layout pattern 1144c and gate layout pattern 1104b2. Via layout pattern 1160i' is between conductive feature layout pattern 1140a and gate layout pattern 1104a2. Via layout pattern 1160j' is between conductive feature layout pattern 1140d and gate layout pattern 1104a1.

In some embodiments, at least via layout patterns 1160a', 1160e', 1160f', 1160i' or 1160j' is positioned at the VGT level. Other configurations or arrangements of the set of vias layout patterns 1160' are within the scope of the present disclosure.

In some embodiments, by using one or more of the set of metal over diffusion layout patterns 220, 520, 820, 1120 and 1120', the set of insulating layout patterns 514, 1114 or 1116, or the set of gate layout patterns 1122 or 1122', additional routing resources are provided in the second direction Y and positioned below other metallization levels (e.g., M0, M1, etc.) for each of layout designs 200, 500, 800, 1100A and 1100G. By providing routing resources below other metallization levels (e.g., M0, M1, etc.), the use of the other metallization levels (e.g., M0, M1, etc.) can be reduced or the other metallization levels (e.g., M0, M1, etc.) can be utilized as additional routing resources resulting in layout designs 200, 500, 800, 1100A and 1100G having a smaller area yielding a standard cell with a smaller area than other approaches.

Integrated Circuit

Figure 12C:
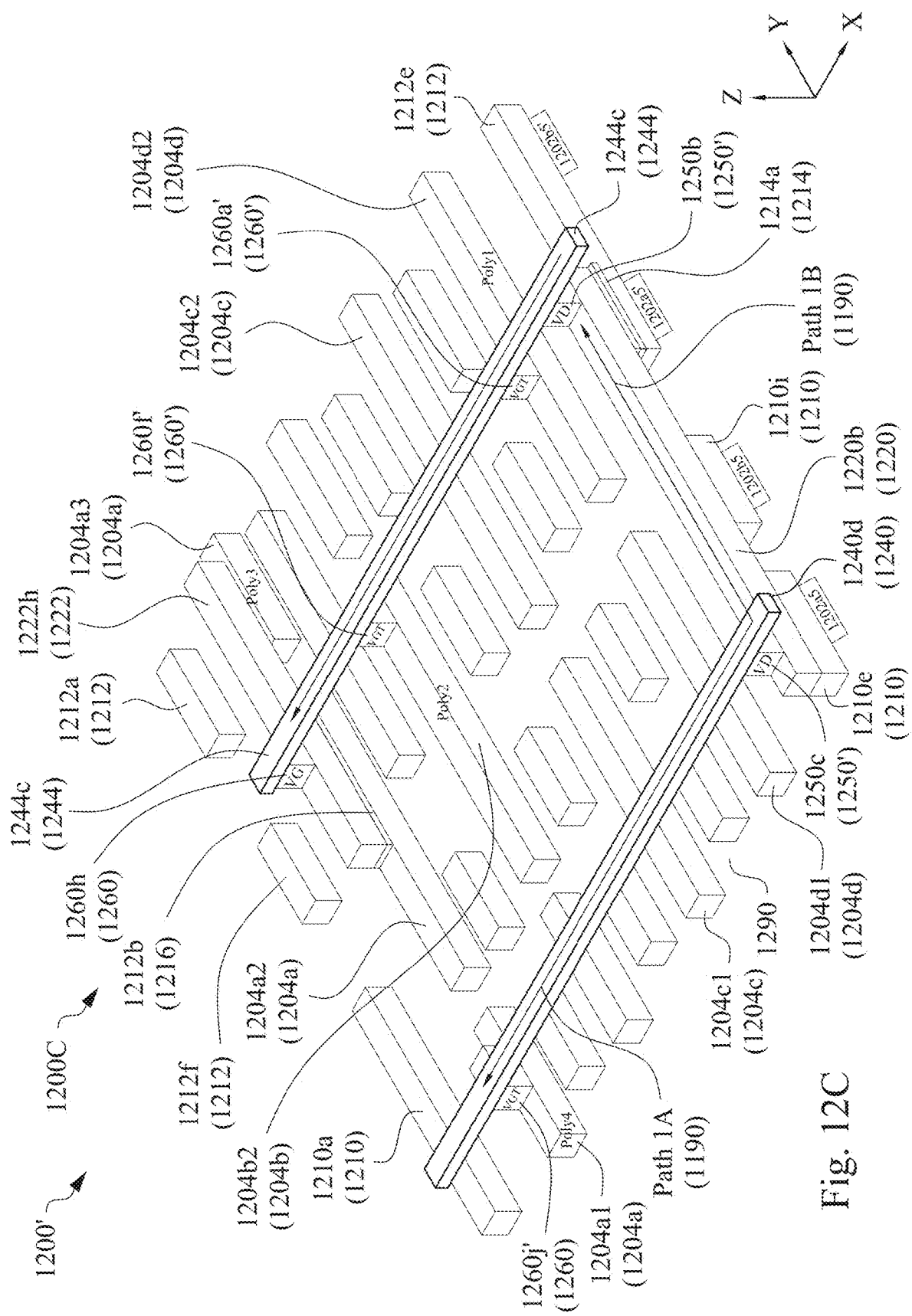
FIGS. 12C-12D are a perspective view of a diagram of an integrated circuit, in accordance with some embodiments.
Figure 12D:
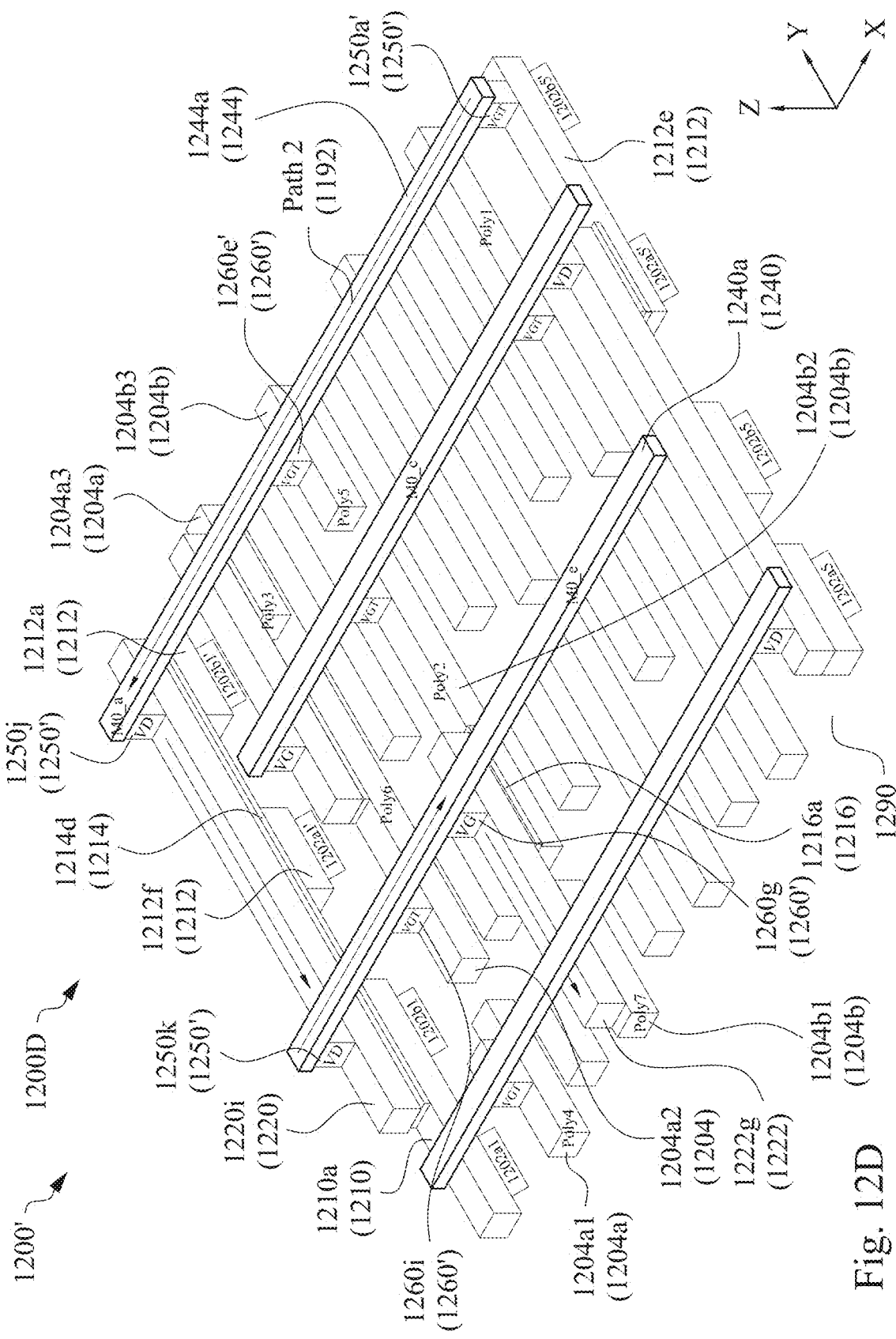

FIGS. 12A-12B are a perspective view of a diagram of an integrated circuit 1200, in accordance with some embodiments. FIGS. 12C-12D are a perspective view of a diagram of an integrated circuit 1200', in accordance with some embodiments.

In some embodiments, integrated circuit 1200 of FIGS. 12A-12B shows an embodiment where each of the vias VG or VD have a same height in the third direction Z.

Integrated circuit 1200' of FIGS. 12C-12D is a variation of integrated circuit 1200 (FIGS. 12A-12B). In comparison with integrated circuit 1200 of FIGS. 12A-12B, integrated circuit 1200' of FIGS. 12C-12D includes vias VGT or VDT with different heights in the third direction Z from vias VG or VD.

FIGS. 12A-12B are diagrams of a corresponding portion 1200A-1200B of integrated circuit 1200, simplified for ease of illustration. Portion 1200A includes one or more features of integrated circuit 1200 of the active (OD) level, the MD1 level, the POLY1 level, the POLY2 level, the MD2 level, the VG level, the VD level and the M0 level.

Portion 1200B includes one or more features of integrated circuit 1200 of the active (OD) level, the MD1 level, the POLY1 level, the POLY2 level, the MD2 level, the VG level and the VD level. In other words, portion 1200B does not show the M0 level for ease of illustration.

Integrated circuit 1200 is a variation of integrated circuit 900 (FIG. 9). For example, in some embodiments, integrated circuit 1200 illustrates an example of where an insulating layer 1216a, 1216b is positioned between corresponding gate 1204b2, 1204a2 and corresponding gate 1222g, 1222h thereby electrically insulating the corresponding gate 1204b2, 1204a2 from the corresponding gate 1222g, 1222h.

In some embodiments, integrated circuit 1200 also illustrates an example of where an insulating layer 1214a is positioned between contact 1212e and contact 1220b, thereby electrically insulating the contact 1212e from the contact 1220b. In some embodiments, integrated circuit 1200 also illustrates an example of where an insulating layer 1214b is positioned between contacts 1210c and 1210g, and contact 1220f, thereby electrically insulating contacts 1210c and 1210g, from contact 1220f. In some embodiments, integrated circuit 1200 also illustrates an example of where an insulating layer 1214c is positioned between contact 1212b and contact 1220h, thereby electrically insulating contact 1212b from contact 1220h. In some embodiments, integrated circuit 1200 also illustrates an example of where an insulating layer 1214d is positioned between contacts 1210a, 1212a, 1212f and contact 1220i, thereby electrically insulating contacts 1210a, 1212a, 1212f from the contact 1220i.

Integrated circuit 1200 is manufactured by layout design 1100A. Integrated circuit 1200 is an embodiment of a portion of integrated circuit 1000A or integrated circuit 1000B. Integrated circuit 1200' is manufactured by layout design 1100G. Integrated circuit 1200' is an embodiment of a portion of integrated circuit 1000A or integrated circuit 1000B.

Structural relationships including alignment, lengths and widths, as well as configurations of integrated circuit 1200 or 1200' are similar to the structural relationships and configurations of layout design 1100A or 1100G of FIGS. 11A-11G, and similar detailed description will not be described in FIGS. 12A-12D for brevity.

Integrated circuit 1200 includes a substrate (not shown), the set of active regions 1202, the set of gates 1204, the set of contacts 1210 and 1212, the set of insulating layers 1214 and 1216, the set of contacts 1220, the set of gates 1222, the set of power rails (not shown), the set of conductive features 1240 and 1244, and the set of vias 1250 and 1260. However, for ease of illustration, integrated circuit 1200 does not show at least one of the members in, the set of gates 1204, the set of insulating layers 1214 and 1216, the set of contacts 1220, the set of gates 1222, the set of power rails, the set of conductive features 1240 and 1244, and the set of vias 1250 and 1260. Similarly, for ease of illustration, at least one member of the set of active regions 1202 or the set of contacts 1210 and 1212 OF integrated circuit 1200 are not labelled.

In comparison with integrated circuit 900 of FIG. 9, set of active regions 1202 replaces set of active regions 902, set of gates 1204 replaces set of gates 904, set of contacts 1210 or 1212 replaces set of contacts 1210, set of insulating layers 1214 replaces set of insulating layers 614, set of contacts 1220 replaces set of contacts 920, set of conductive features 1240 or 1244 replaces set of conductive features 940 and set of vias 1250 replaces the set of vias 950.

The set of active regions 1202 are similar to the set of active regions 902, the set of gates 1204 are similar to the set of gates 904, the set of contacts 1210 or 1212 are similar to the set of contacts 1210, the set of insulating layers 1214 are similar to the set of insulating layers 614, the set of contacts 1220 are similar to the set of contacts 920, the set of conductive features 1240 or 1244 are similar to the set of conductive features 940 and the set of vias 1250 are similar to the set of vias 950, and similar detailed description is therefore omitted.

In some embodiments, even though the set of insulating layers 1216 are positioned over the set of gates 1204, and the set of insulating layers 1214 are positioned over the set of contacts 1210, one or more of the insulating layers of the set of insulating layers 1216 is similar to one or more of the insulating layers of the set of insulating layers 614 or 1214 of FIGS. 6A, 9 or 12A-12B, and similar detailed description is therefore omitted.

Set of gates 1204 includes gates 1204a, 1204b, 1204c, 1204d and 1204e (not shown). In some embodiments, gate 1204a includes gates 1204a1, 1204a2 and 1204a3. In some embodiments, gate 1204b includes gates 1204b1, 1204b2 and 1204b3. In some embodiments, gate 1204c includes gates 1204c1 and 1204c2. In some embodiments, gate 1204d includes gates 1204d1 and 1204d2. Gates 1204a, 1204b, 1204c, 1204d are similar to corresponding gates 304b, 604c, 904d 904e of FIG. 9, and similar detailed description is therefore omitted.

In some embodiments, gate 1204a is the gate terminals of PMOS transistor P10-5, NMOS transistor N10-5, NMOS transistor N10-3 and PMOS transistor P10-3 of FIG. 10B, gate 1204b is the gate terminals of PMOS transistor P10-6, NMOS transistor P10-6, NMOS transistor N10-2 and PMOS transistor P10-2 of FIG. 10B, gate 1204c is the gate terminals of PMOS transistor P10-7, NMOS transistor N10-7, NMOS transistor N10-1 and PMOS transistor P10-1 of FIG. 10B, gate 1204d is the gate terminals of PMOS transistor P10-4, NMOS transistor N10-4, PMOS transistor P10-8 and NMOS transistor N10-8 of FIG. 10B. Other configurations, arrangements on other layout levels or quantities of patterns in the set of gates 1204 are within the scope of the present disclosure.

The set of active regions 1202 includes active regions 1202a1, 1202b1, 1202a1', 1202b1', 1202a2, 1202b2, 1202a2', 1202b2', 1202a3, 1202b3, 1202a3', 1202b3', 1202a4, 1202b4, 1202a4', 1202b4', 1202a5, 1202b5, 1202a5', 1202b5'. Active regions 1202a5, 1202b5, 1202a5', 1202b5' are labelled in FIGS. 12A-12B, and the remaining active regions in the set of active regions 1202 are not labelled for ease of illustration.

In some embodiments, active region 1202a5 is the drain of PMOS transistor P10-4 of FIG. 10B, and active region 1202b5 is the drain terminal of NMOS transistor N10-4 of FIG. 10B.

In some embodiments, active region 1202a4 is the source terminal of PMOS transistor P10-4 or the source terminal of PMOS transistor P10-1 of FIG. 10B. In some embodiments, active region 1202b4 is the source terminal of NMOS transistor N10-4 or the source terminal of NMOS transistor N10-1 of FIG. 10B.

In some embodiments, active region 1202a3 is the source terminal of PMOS transistor P10-2 or the drain terminal of PMOS transistor P10-1 of FIG. 10B. In some embodiments, active region 1202b3 is the source terminal of NMOS transistor N10-2 or the drain terminal of NMOS transistor N10-1 of FIG. 10B.

In some embodiments, active region 1202a2 is the drain terminal of PMOS transistor P10-2 or the drain terminal of PMOS transistor P10-5 of FIG. 10B. In some embodiments, active region 1202b2 is the drain terminal of NMOS transistor N10-2 or the drain terminal of NMOS transistor N10-5 of FIG. 10B.

In some embodiments, active region 1202a1 is the source terminal of PMOS transistor P10-5, active region 1202b1 is the source terminal of NMOS transistor N10-5 of FIG. 10B.

In some embodiments, active region 1202a1' is the source terminal of PMOS transistor P10-3 of FIG. 10B. In some embodiments, active region 1202b 1 ' is the source terminal of NMOS transistor N10-3 of FIG. 10B.

In some embodiments, active region 1202a2' is usable to manufacture at least the drain terminal of PMOS transistor P10-6 or the drain terminal of PMOS transistor P10-3. In some embodiments, active region 1202b2' is the drain terminal of NMOS transistor N10-6 or the drain terminal of NMOS transistor N10-3 of FIG. 10B.

In some embodiments, active region 1202a3' is the source terminal of PMOS transistor P10-6 or the source terminal of PMOS transistor P10-7 of FIG. 10B. In some embodiments, active region 1202b3' is the source terminal of NMOS transistor N10-6 or the source terminal of NMOS transistor N10-7 of FIG. 10B.

In some embodiments, active region 1202a4' is the drain terminal of PMOS transistor P10-8 or the drain terminal of PMOS transistor P10-7 of FIG. 10B. In some embodiments, active region 1202b4' is the drain terminal of NMOS transistor N10-8 or the drain terminal of NMOS transistor N10-7 of FIG. 10B.

In some embodiments, active region 1202a5' is the source terminal of PMOS transistor P10-8, and active region 1202b5' is the source terminal of NMOS transistor N10-8 of FIG. 10B.

Other configurations or arrangements in the set of active regions 1202 are within the scope of the present disclosure.

The set of contacts 1210 includes at least contacts 1210a, . . . , 1210h or 1210i. The set of contacts 1212 includes at least contacts 1212a, . . . , 1212g or 1212h. In some embodiments, at least one contact 1210a, . . . , 1210i of the set of contacts 1210 or at least one contact 1212a, . . . , 1212h of the set of contacts 1212 are similar to at least one corresponding contact of the set of contacts 910 of FIG. 9, and similar detailed description is therefore omitted.

The set of contacts 1210 or 1212 overlap and are electrically coupled to the set of active regions 1202. Contacts 1210e, 1210i, 1212f, 1212a overlap and are electrically coupled to corresponding active regions 1202a5, 1202b5, 1202a1', 1202b1'. Contacts 1212e overlaps and is electrically coupled to each of active regions 1202a5' and 1202b5'. Contacts 1210a overlaps and is electrically coupled to each of active regions 1202a1 and 1202b1.

The positioning or connections of the remaining contacts with respect to the corresponding active regions of the set of active regions 1202 are not described for brevity, but are in similar corresponding positions as set of metal over diffusion layout patterns 1110 or 1112.

Other configurations or arrangements of the set of contacts 1210 or 1212 are within the scope of the present disclosure.

The set of insulating layers 1214 includes at least insulating layers 1214a, 1214b, 1214c or 1214d. The set of insulating layers 1214 is similar to the set of insulating layers 614 (FIGS. 6A-6B & 9) of integrated circuit 600 & 900. Insulating layers 1214b and 1214c are not shown in FIGS. 12C-12D for ease of illustration, but are in similar corresponding positions as that shown in integrated circuit 1200 of FIGS. 12A-12B.

In some embodiments, at least insulating layer 1214a, 1214b, 1214c or 1214d are variations of insulating layer 514a of the set of insulating layers 514 of FIG. 5 or 8, and similar detailed description is therefore omitted.

In some embodiments, insulating layer 1214a overlaps a portion of contact 1212e and active region 1202a5'. In some embodiments, insulating layer 1214a is positioned below a portion of contact 1220b. In some embodiments, insulating layer 1214a is positioned where a portion of contact 1220b overlaps a portion of contact 1212e.

In some embodiments, insulating layer 1214b overlaps a portion of contact 1210c and contact 1210g, and active regions 1202a3 and 1202b3. In some embodiments, insulating layer 1214b is positioned below a portion of contact 1220f. In some embodiments, insulating layer 1214b is positioned where portion of contact 1220f overlaps a portion of contact 1210c and contact 1210g, thereby electrically insulating contacts 1210c and 1210g, from contact 1220f.

In some embodiments, insulating layer 1214c overlaps a portion of contact 1212b and active region 1202a2'. In some embodiments, insulating layer 1214c is positioned below a portion of contact 1220h. In some embodiments, insulating layer 1214c is positioned where a portion of contact 1220h overlaps a portion of contact 1212b, thereby electrically insulating contact 1212b from contact 1220h.

In some embodiments, insulating layer 1214d overlaps contacts 1212a, 1212f and 1210a and active region layout patterns 1202b1, 1202a1' and 1202b1'. In some embodiments, insulating layer 1214d is positioned below contact 1220i. In some embodiments, insulating layer 1214d is positioned where contact 1220i overlaps contact 1212a, 1212f and 1210a.

Other configurations, arrangements on other layout levels or quantities of patterns in the set of insulating layer layout patterns 1214 are within the scope of the present disclosure.

The set of insulating layers 1216 includes at least insulating layers 1216a or 1216b. The set of insulating layers 1216 extend in the second direction Y. The set of insulating layers 1216 are between the set of gates 1204 and the set of gates 1222. The set of insulating layers 1216 is over the set of gates 1204, thereby electrically isolating the set of gates 1204 from overlying layers (e.g., set of gates 1222).

In some embodiments, the set of insulating layers 1216 are over other gates of the set of gates 1204 different from gate 1204a2 or 1204b2, and the set of insulating layers 1216 electrically isolate the corresponding one or more other gates from other overlying layers (e.g., set of gates 1222).

In some embodiments, even though the set of insulating layers 1216 are positioned over the set of gates 1204, and the set of insulating layers 1214 are positioned over the set of contacts 1210 or 1212, one or more of the insulating layers of the set of insulating layers 1216 is similar to one or more of the insulating layers of the set of insulating layers 614 or 1214 of FIGS. 6A, 9 or 12A-12B, and similar detailed description is therefore omitted. In some embodiments, at least insulating layer 1216a or 1216b are variations of insulating layer 514a of the set of insulating layers 514 of FIG. 5 or 8 or the set of insulating layers 1214, and similar detailed description is therefore omitted.

In some embodiments, at least one insulating layer in the set of insulating layers 1216 includes one or more layers of a dielectric material. In some embodiments, the dielectric material includes SiOCN, SiO$_2$, SiOC, or the like or combinations thereof.

In some embodiments, at least one insulating layer in the set of insulating layers 1216 has a thickness $T_{IL'}$ in the third direction Z that ranges from about 0.05 $T_P$ to about 0.15 $T_P$, where thickness $T_P$ corresponds to a thickness in the third direction Z of one or more gates in the set of gates 304, 604, 904, 1204 (FIGS. 3, 6, 9 & 12A-12B) in the POLY1 layer. In some instances, if the thickness $T_{IL'}$ is less than 0.05 $T_P$, then the insulating layer 1216a or 1216b may not effectively electrically isolate the contact from the corresponding gate resulting in electrical short circuits. In some instances, if the thickness $T_{IL'}$ is greater than 0.15 $T_P$, then the area of the insulating layer 1216a or 1216b may increase the area of the integrated circuit 1200 or decrease the area of gates in the set of gates 1204 affecting yield.

In some embodiments, insulating layer 1216a overlaps a portion of gate 1204b (e.g., gate layout pattern 1204b2). In some embodiments, insulating layer 1216a is positioned below a portion of gate 1222g. In some embodiments, insulating layer 1216a is positioned where a portion of gate 1222g overlaps gate 1204b2, and thereby electrically isolates gate 1222g from gate 1204b2.

In some embodiments, insulating layer 1216b overlaps a portion of gate 1204a (e.g., gate 1204a2). In some embodiments, insulating layer 1216b is positioned below a portion of gate 1222h. In some embodiments, insulating layer 1216b is positioned where a portion of gate 1222h overlaps gate 1204a2 and thereby electrically isolates gate 1222h from gate 1204a2.

Other configurations, arrangements on other layout levels or quantities of patterns in the set of insulating layer layout patterns 1216 are within the scope of the present disclosure.

The set of contacts 1220 includes contacts 1220a, . . . , 1220i or 1220j. In some embodiments, at least one of contacts 1220a, . . . , 1220j is similar to contact 620a or 320c of set of contacts 920 of FIG. 9, and similar detailed description is therefore omitted.

In some embodiments, contacts 1220b, 1220f and 1220i of the set of contacts or other contacts similar to contacts 1220b, 1220f and 1220i are referred to as "MD flyer portions" as these contacts overlap or extend over at least a pair of contacts in the MD1 level. Contact 1220b overlaps contacts 1210e, 1210i and 1212e and insulating layer 1214a. Contact 1220b is electrically coupled with contacts 1210e and 1210i. Contact 1220b is electrically insulated from contact 1212e by insulating layer 1214a.

Contact 1220i overlaps contacts 1210a, 1212a and 1212f and insulating layer 1214d. Contact 1220i is electrically insulated from contacts 1210a, 1212a and 1212f by insulating layer 1214d. The positioning or connections of the remaining contacts of the set of contacts 1220 with respect to the contacts of the set of contacts 1210 or 1212 are not described for brevity, but are in similar corresponding positions as set of metal over diffusion layout patterns 1120 of FIGS. 11A-11G.

Other configurations or arrangements of the set of contacts 1220 are within the scope of the present disclosure.

The set of gates 1222 includes gates 1222a, . . . , 1222i or 1222j. In some embodiments, at least one of gates 1222a, . . . , 1222j is similar to contact 620a or 320c of set of contacts 920 of FIG. 9, and similar detailed description is therefore omitted.

In some embodiments, at least one gate in the set of gates 1222 or the set of contacts 1220 includes one or more layers of a conductive material. In some embodiments, the conductive material includes Tungsten, Cobalt, Ruthenium, Copper, or the like or combinations thereof.

Gates 1222a, 1222b, 1222c, 1222d, 1222e, 1222f, 1222i, 1222j are directly over and electrically coupled with corresponding gates 1204d2, 1204d1, 1204c2, 1204c1, 1204b3, 1204b2, 1204a2, 1204a1.

Gate 1222h overlaps gates 1204a2 and 1204a3 and insulating layer 1216b. Gate 1222h is electrically coupled with gate 1204a3. Gate 1222h is electrically insulated from gate 1204a2 by insulating layer 1216b.

Gate 1222g overlaps gates 1204b1 and 1204b2 and insulating layer 1216a. Gate 1222g is electrically coupled with gate 1204b1. Gate 1222g is electrically insulated from gate 1204b2 by insulating layer 1216a.

In some embodiments, gate 1222g or 1222h or other gates similar to gate 1222g or 1222h are referred to as "Poly flyer" portions or gate portions as these gates overlap or extend over at least a portion of a gate of the set of gates 1204 and a portion of the insulating layer of the set of insulating layers 1216 in the POLY1 level. For example, gate 1222g overlaps insulating layer 1216a and portions of gate 1204b (e.g., gate 1204b1 and portions of gate 1204b2). Similarly, gate 1222h overlaps insulating layer 1216b and portions of gate 1204a (e.g., gate 1204a2 and portions of gate 1204a3). The positioning or connections of the remaining gates of the set of gates 1222 with respect to the gates of the set of gates 1204 are not described for brevity, but are in similar corresponding positions as set of gate layout patterns 1122 of FIGS. 11A-11G.

In some embodiments, the set of gates 1222 is manufactured by a same process as the set of metal contacts 320, 620, 920 and 1220 (FIGS. 3, 6A-6B, 9 and 12A-12B).

In some embodiments, by positioning gate 1222g on insulating layer 1216a and overlapping gates 1204b1 and 1204b2, gate 1222g thereby provides additional routing resources extending in the second direction Y and positioned below other metallization levels (e.g., M0, M1, etc.) for integrated circuit 1200. In some embodiments, by positioning gate 1222h on insulating layer 1216b and overlapping gates 1204a2 and 1204a3, gate 1222h thereby provides additional routing resources extending in the second direction Y and positioned below other metallization levels (e.g., M0, M1, etc.) for integrated circuit 1200.

By providing routing resources below other metallization levels (e.g., M0, M1, etc.), the use of the other metallization levels (e.g., M0, M1, etc.) can be reduced or the other metallization levels (e.g., M0, M1, etc.) can be utilized as additional routing resources resulting in integrated circuit 1200 having a smaller area and standard cell than other approaches.

Other configurations or arrangements of the set of gates 1222 are within the scope of the present disclosure.

The set of conductive features 1240 includes at least conductive features 1240a, 1240b (not shown), 1240c (not shown), 1240d.

In comparison with integrated circuit 900, conductive feature 1240a, 1240d replace corresponding conductive features 940a, 640d of FIG. 9, and similar detailed description is therefore omitted.

Conductive feature 1240a is electrically coupled to contact 1220i by a via 1250k, is electrically coupled to gate 1222g by a via 1260g, and is electrically coupled to gate 1204a2 by a via 1260i and gate 1222i.

Conductive feature 1240d is electrically coupled to contact 1220b by a via 1250c, and is electrically coupled to gate 1204a1 by a via 1260j and a gate 1222j. In some embodiments, conductive feature 1240d electrically couples at least active region 1202a5 to gate 1204a1.

Other configurations or arrangements of the set of conductive features 1240 are within the scope of the present disclosure.

The set of conductive features 1244 includes at least conductive features 1244a, 1244b (not shown), 1244c, 1244d (not shown).

In comparison with integrated circuit 900, at least conductive feature 1244a or 1244c are similar to at least conductive feature 940a or 640d of FIG. 9, and similar detailed description is therefore omitted.

Conductive feature 1244a is electrically coupled to contact 1212e by a via 1250a and contact 1220a, is electrically coupled to contact 1220i by a via 1250j, and is electrically coupled to gate 1204b3 by a via 1260e and gate 1222e.

Conductive feature 1244c is electrically coupled to contact 1220b by a via 1250b, is electrically coupled to gate 1222h by a via 1260h, is electrically coupled to gate 1204d2 by a via 1260a and gate 1222a, and is electrically coupled to gate 1204b2 by a via 1260f and gate 1222f. In some embodiments, conductive feature 1240d electrically couples at least gate 1204b2 to gate 1204d2.

Other configurations or arrangements of the set of conductive features 1244 are within the scope of the present disclosure.

The set of vias 1250 includes at least vias 1250a, . . . , 1250k or 1250l. In comparison with integrated circuit 900, vias 1250a, 1250b, 1250c, 1250j, 1250k are in a similar configuration as at least via 650a, 650b or 950d of FIG. 6 or 9, and similar detailed description is therefore omitted.

Via 1250a is between conductive feature 1244a and contact 1220a and thereby provides an electrical connection between conductive feature 1244a and contact 1220a. Via 1250b is between conductive feature 1244c and contact 1220b, and thereby provides an electrical connection between conductive feature 1244c and contact 1220b. Via 1250c is between conductive feature 1240d and contact 1220b, and thereby provides an electrical connection between conductive feature 1240d and contact 1220b. Via 1250j is between conductive feature 1244a and contact 1220i, and thereby provides an electrical connection between conductive feature 1244a and contact 1220i. Via 1250k is between conductive feature 1240a and contact 1220i, and thereby provides an electrical connection between conductive feature 1240a and contact 1220i. The positioning or connections of the remaining vias of the set of vias 1250 with respect to at least a contact of the set of contacts 1210, 1212 or 1220 or with respect to at least a conductive feature of the set of conductive features 1240 or 1244 are not described for brevity, but are in similar corresponding positions as set of via layout patterns 1150 of FIGS. 11A-11G. In some embodiments, at least one via of the set of vias 1250 has a same height in a third direction Z as at least another via in the set of vias 1250 or the set of vias 1260.

The set of vias 1260 includes at least vias 1260a, . . . , 1260k or 1260l. The set of vias 1260 are between the set of conductive features 1240 or 1244 and the set of gates 1222. In some embodiments, the set of vias 1260 are between the set of conductive features 1240 or 1244 and the set of gates 1222 or the set of gates 1204 (see FIGS. 12C-12D). In comparison with integrated circuit 900, vias 1260a, 1260e, 1260f, 1260g, 1260h, 1260i, 1260j are variations of at least via 650a, 650b or 950d of FIG. 6 or 9, and similar detailed description is therefore omitted.

Via 1260a is between conductive feature 1244c and gate 1222a and thereby provides an electrical connection between conductive feature 1244c and gate 1204d2. Via 1260e is between conductive feature 1244a and gate 1222e and thereby provides an electrical connection between conductive feature 1244a and gate 1204b3. Via 1260f is between conductive feature 1244c and gate 1222f and thereby provides an electrical connection between conductive feature 1244c and gate 1204b2. Via 1260g is between conductive feature 1240a and gate 1222g and thereby provides an electrical connection between conductive feature 1240a and gate 1222g. Via 1260h is between conductive feature 1244c and gate 1222h and thereby provides an electrical connection between conductive feature 1244c and gate 1222h. Via 1260i is between conductive feature 1240a and gate 1222i and thereby provides an electrical connection between conductive feature 1240a and gate 1204a2. Via 1260j is between conductive feature 1240d and gate 1222j and thereby provides an electrical connection between conductive feature 1240d and gate 1204a1. The positioning or connections of the remaining vias of the set of vias 1260 with respect to at least a gate of the set of gates 1204 or 1222, or with respect to at least a conductive feature of the set of conductive features 1240 or 1244 are not described for brevity, but are in similar corresponding positions as set of via layout patterns 1160 of FIGS. 11A-11G.

In some embodiments, at least one via of the set of vias 1260 has a same height in a third direction Z as at least another via in the set of vias 1260 or 1250. In some embodiments, at least one via of the set of vias 1250 has a same height in a third direction Z as at least one via in the set of vias 1260.

Other configurations or arrangements of the set of vias 1250 or 1260 are within the scope of the present disclosure.

In some embodiments, gates 1204a3, 1204b2, 1204d2, 1204a1 and active regions 1202a5 and 1202b5 are coupled to each other by at least contact 1220b, conductive feature 1240d, conductive feature 1244c or gate 1222h.

For example, in some embodiments, active region 1202a5 is electrically coupled to contact 1210e, contact 1210e is electrically coupled to contact 1220b, contact 1220b is electrically coupled to contact 1210i, and contact 1210i is electrically coupled to active region 1202b5.

In some embodiments, for integrated circuit 1200, contact 1220b is electrically coupled to conductive feature 1240d by via 1250c, conductive feature 1240d is electrically coupled to gate 1222j, gate 1222j is electrically coupled to gate 1204a1 by via 1260j. In some embodiments, contact 1220b is electrically coupled to conductive feature 1244c by via 1250b, but is electrically isolated from contact 1212e by insulating layer 1214a. In some embodiments, for integrated circuit 1200, conductive feature 1244c is also electrically coupled to gate 1222a, gate 1222a is electrically coupled to gate 1204d2 by via 1260a. In some embodiments, for integrated circuit 1200, conductive feature 1244c is also electrically coupled to gate 1222f, gate 1222f is electrically coupled to gate 1204b2 by via 1260f. In some embodiments, conductive feature 1244c is also electrically coupled to gate 1222h by via 1260h, but is electrically isolated from gate 1204a2 by insulating layer 1216b. In some embodiments, gate 1222h is electrically coupled to gate 1204a3. Thus, gates 1204a3, 1204b2, 1204d2, 1204a1 and active regions 1202a5 and 1202b5 are coupled to each other, and is similar to a path 1290 described below in FIG. 12C.

In some embodiments, gates 1204b3, 1204a2 and 1204b1 and active regions 1202a5' and 1202b5' are coupled to each other by at least conductive feature 1244a, contact 1220i, conductive feature 1240a or gate 1222g.

For example, for integrated circuit 1200, in some embodiments, active region 1202a5' is electrically coupled to contact 1212e, contact 1212e is electrically coupled to active region 1202b5', is electrically isolated from contact 1220b by insulating layer 1214a. In some embodiments, for integrated circuit 1200', contact 1212e is electrically coupled to contact 1220a, contact 1220a is electrically coupled to conductive feature 1244a by via 1250a, conductive feature 1244a is electrically coupled to gate 1222e, gate 1222e is electrically coupled to gate 1204b3 by via 1260e. In some embodiments, conductive feature 1244a is electrically coupled to contact 1220i by via 1250j, but is electrically isolated from contacts 1212a, 1212f and 1210a by insulating layer 1214d. In some embodiments, for integrated circuit 1200', contact 1220i is also electrically coupled to conductive feature 1240a by via 1250k, and conductive feature 1240a is electrically coupled to gate 1222i, gate 1222i is electrically coupled to gate 1204a2 by via 1260i. In some embodiments, conductive feature 1240a is also electrically coupled to gate 1222g by via 1260g, but is electrically isolated from gate 1204b2 by insulating layer 1216a. In some embodiments, gate 1222g is also electrically coupled to gate 1204b1. Thus, gates 1204a2, 1204b1, 1204b3 and active regions 1202a5' and 1202b5' are coupled to each other, and is similar to a path 1292 described below in FIG. 12D.

FIGS. 12C-12D are diagrams of a corresponding portion 1200C-1200D of integrated circuit 1200', simplified for ease of illustration. Integrated circuit 1200' is manufactured by layout design 1100G.

Integrated circuit 1200' of FIGS. 12C-12D is a variation of integrated circuit 1200 (FIGS. 12A-12B). In comparison with integrated circuit 1200 of FIGS. 12A-12B, integrated circuit 1200' of FIGS. 12C-12D includes at least vias VGT or VDT with different heights from at least vias VG or VD.

Portion 1200C includes one or more features of integrated circuit 1200' of the active (OD) level, the MD1 level, the POLY1 level, the POLY2 level, the MD2 level, the VG level, the VD level and the M0 level. In some embodiments, portion 1200C of FIG. 12C illustrates a path 1290 of signal CLKB provided to integrated circuit 1200' (e.g., integrated circuit 1000A-1000B). Path 1290 includes a path 1290a and a path 1290b.

Portion 1200D includes one or more features of integrated circuit 1200' of the active (OD) level, the MD1 level, the POLY1 level, the POLY2 level, the MD2 level, the VG level and the VD level. In some embodiments, portion 1200D of FIG. 12D illustrates a path 1292 of signal CLKBB provided to integrated circuit 1200 (e.g., integrated circuit 1000A-1000B).

Integrated circuit 1200' of FIGS. 12C-12D is a variation of integrated circuit 1200 (FIGS. 12A-12B). In comparison with integrated circuit 1200 of FIGS. 12A-12B, set of contacts 1220' of integrated circuit 1200' replaces set of contacts 1220, set of gates 1222' replaces set of gates 1222 of integrated circuit 1200', set of vias 1250' of integrated circuit 1200' replaces set of vias 1250, and set of vias 1260' replaces set of vias 1260 of integrated circuit 1200', and similar detailed description is therefore omitted.

In comparison with set of contacts 1220 of FIGS. 12A-12B, set of contacts 1220' does not include contacts 1220a, 1220c, 1220d, 1220e, 1220g and 1220j. Contact 1220f is not shown in FIGS. 12C-12D, and contact 1220i is not shown in FIG. 12D, for ease of illustration.

In comparison with set of gates 1222 of FIGS. 12A-12B, set of gates 1222' does not include gates 1222a, 1222b, 1222c, 1222d, 1222e, 1222f, 1222i and 1222j. Gate 1222g is not shown in FIG. 12C for ease of illustration.

The set of vias 1250' includes at least vias 1250a', . . . , 1250k or 1250l. In comparison with integrated circuit 1200, via 1250a' replaces via 1250a of FIGS. 12A-12B, and similar detailed description is therefore omitted. Via 1250a' is between conductive feature 1244a and contact 1212e, and thereby provides an electrical connection between conductive feature 1244a and contact 1212e. In some embodiments, via 1250a' is positioned at the VDT level. In some embodiments, via 1250a' has a height in the third direction Z greater than another via of the set of vias 1250' or 1250. Other configurations or arrangements of the set of vias 1250' are within the scope of the present disclosure. For example, in some embodiments, other vias of the set of vias 1250' has a same height as via 1250a'.

The set of vias 1260' includes at least vias 1260a', 1260b, . . . , 1260e', 1260f', 1260g, 1260h, 1260i' or 1260j'. In comparison with integrated circuit 1200, via 1260a', 1260e', 1260f', 1260i', 1260j' replaces corresponding via 1260a, 1260e, 1260f, 1260i, 1260j of FIGS. 12A-12B, and similar detailed description is therefore omitted.

Via 1260a' is between conductive feature 1244c and gate 1204d2 and thereby provides an electrical connection between conductive feature 1244c and gate 1204d2. Via 1260e' is between conductive feature 1244a and gate 1204b3 and thereby provides an electrical connection between conductive feature 1244a and gate 1204b3. Via 1260f' is between conductive feature 1244c and gate 1204b2 and thereby provides an electrical connection between conductive feature 1244c and gate 1204b2. Via 1260i' is between conductive feature 1240a and gate 1204a2 and thereby provides an electrical connection between conductive feature 1240a and gate 1204a2. Via 1260j' is between conductive feature 1240d and gate 1204a1 and thereby provides an electrical connection between conductive feature 1240d and gate 1204a1.

In some embodiments, at least via 1260a', 1260e', 1260f', 1260i' or 1260j' is positioned at the VGT level. In some embodiments, at least via 1260a', 1260e', 1260f', 1260i' or 1260j' has a same height in the third direction Z as another of via 1260a', 1260e', 1260f', 1260i' or 1260j'. In some embodiments, at least via 1260a', 1260e', 1260f', 1260i' or 1260j' has a same height in the third direction Z as via 1250a'. In some embodiments, at least via 1260a', 1260e', 1260f', 1260i' or 1260j' has a height in the third direction Z greater than another via of the set of vias 1260' or 1260.

Other configurations or arrangements of the set of vias 1260' are within the scope of the present disclosure. For example, in some embodiments, other vias of the set of vias 1260' has a same height as at least via 1260a', 1260e', 1260f', 1260i' or 1260j'.

Other configurations or arrangements of at least integrated circuit 1200A-1200B or layout design 1100A and 1100G are within the scope of the present disclosure. For example, in some embodiments, integrated circuits 1200A-1200B have been described by including at least set of contacts 1220 or set of insulating layer 1214, but in some embodiments, at least the set of contacts 1220 or set of insulating layer 1214 are omitted. For example, in some embodiments, layout designs 1100A and 1100G have been described by including at least set of metal over diffusion layout patterns 1120 or set of insulating layer layout patterns 1114, but in some embodiments, at least the set of metal over diffusion layout patterns 1120 or set of insulating layer layout patterns 1114 are omitted.

In some embodiments, portion 1200C of FIG. 12C illustrates a path 1190 of signal CLKB provided to integrated circuit 1200' (e.g., integrated circuit 1000A-1000B). Path 1190 includes a path 1190a and a path 1190b. In some embodiments, active region 1202a5 (e.g., source of NMOS transistor N10-4) and active region 1202b5 (e.g., source of PMOS transistor P10-4) and gate 1204a1 (e.g., NMOS transistor N10-5) are coupled to each other by path 1190a. For example, in some embodiments, active region 1202a5 (e.g., source of NMOS transistor N10-4) and active region 1202b5 (e.g., source of PMOS transistor P10-4), gate 1204d2 (e.g., NMOS transistor N10-8 and PMOS transistor P10-8), gate 1204b2 (e.g., PMOS transistor N10-6 and PMOS transistor P10-2), gate 1204a3 (e.g., NMOS transistor N10-3) are coupled to each other by path 1190b.

In some embodiments, gates 1204a3, 1204b2, 1204d2, 1204a1 and active regions 1202a5 and 1202b5 are coupled to each other by at least contact 1220b, conductive feature 1240d, conductive feature 1244c or gate 1222h. For example, for portion 1200C of integrated circuit 1200', in some embodiments, active region 1202a5 is electrically coupled to contact 1210e, contact 1210e is electrically coupled to contact 1220b, contact 1220b is electrically coupled to contact 1210i, and contact 1210i is electrically coupled to active region 1202b5. In some embodiments, for portion 1200C of integrated circuit 1200', contact 1220b is electrically coupled to conductive feature 1240d by via 1250c, conductive feature 1240d is electrically coupled to gate 1204a1 by via 1260j. In some embodiments, for portion 1200C of integrated circuit 1200', contact 1220b is electrically coupled to conductive feature 1244c by via 1250b, but is electrically isolated from contact 1212e by insulating layer 1214a. In some embodiments, for portion 1200C of integrated circuit 1200', conductive feature 1244c is also electrically coupled to gate 1204d2 by via 1260a'. In some embodiments, for portion 1200C of integrated circuit 1200', conductive feature 1244c is also electrically coupled to gate 1204b2 by via 1260f. In some embodiments, for portion 1200C of integrated circuit 1200', conductive feature 1244c is also electrically coupled to gate 1222h by via 1260h, but is electrically isolated from gate 1204a2 by insulating layer 1216b. In some embodiments, for portion 1200C of integrated circuit 1200', gate 1222h is electrically coupled to gate 1204a3. Thus, gates 1204a3, 1204b2, 1204d2, 1204a1 and active regions 1202a5 and 1202b5 are coupled to each other, and configured to receive signal CLKB by path 1290.

In some embodiments, portion 1200D of FIG. 12D illustrates a path 1192 of signal CLKBB provided to integrated circuit 1200' (e.g., integrated circuit 1000A-1000B). In some embodiments, active region 1202a5' (e.g., source of NMOS transistor N10-8), active region 1202b5' (e.g., source of PMOS transistor P10-8), gate 1204b3 (e.g., NMOS transistor N10-6), gate 1204a2 (e.g., PMOS transistor P10-5) and gate 1204b1 (e.g., NMOS transistor N10-2) are coupled to each other by path 1192.

In some embodiments, gates 1204b3, 1204a2 and 1204b1 and active regions 1202a5' and 1202b5' are coupled to each other by at least conductive feature 1244a, contact 1220i, conductive feature 1240a or gate 1222g. For example, for portion 1200D of integrated circuit 1200', in some embodiments, active region 1202a5' is electrically coupled to contact 1212e, contact 1212e is electrically coupled to active region 1202b5', is electrically isolated from contact 1220b by insulating layer 1214a. In some embodiments, for portion 1200D of integrated circuit 1200', contact 1212e is electrically coupled to conductive feature 1244a by via 1250a', conductive feature 1244a is electrically coupled to gate 1204b3 by via 1260e'. In some embodiments, for portion 1200D of integrated circuit 1200', conductive feature 1244a is electrically coupled to contact 1220i by via 1250j, but is electrically isolated from contacts 1212a, 1212f and 1210a by insulating layer 1214d. In some embodiments, for portion 1200D of integrated circuit 1200', contact 1220i is also electrically coupled to conductive feature 1240a by via 1250k, and conductive feature 1240a is electrically coupled to gate 1204a2 by via 1260i'. In some embodiments, for portion 1200D of integrated circuit 1200', conductive feature 1240a is also electrically coupled to gate 1222g by via 1260g, but is electrically isolated from gate 1204b2 by insulating layer 1216a. In some embodiments, for portion 1200D of integrated circuit 1200', gate 1222g is also electrically coupled to gate 1204b1. Thus, gates 1204a2, 1204b1, 1204b3 and active regions 1202a5' and 1202b5' are coupled to each other, and configured to receive signal CLKBB by path 1292.

While integrated circuit 1200 or 1200' illustrates connections between gates, sources and drains of several transistors, other configurations or variations of integrated circuit 1200 or 1200' are within the scope of the present disclosure. For example, in some embodiments, a gate, source or drain of at least one transistor can be electrically coupled to at least the gate, source or drain of at least another transistor or the same transistor by the use of one or more of the set of insulating layers 1214, the set of insulating layers 1216, the set of contacts 1220 or the set of gates 1222 consistent with the descriptions provided herein.

In some embodiments, by positioning gate 1222g on insulating layer 1216a and overlapping gates 1204b1 and 1204b2, or by positioning contact 1220i on insulating layer 1214d and overlapping contacts 1210a, 1212f and 1212a, thereby provides an electrical connection between gates 1204a2, 1204b1, 1204b3 and active regions 1202a5' and 1202b5', and thereby provides additional routing resources extending in the second direction Y and positioned below other metallization levels (e.g., M0, M1, etc.) for integrated circuit 1200 or 1200'.

In some embodiments, by positioning gate 1222h on insulating layer 1216b and overlapping gates 1204a2 and 1204a3, or by positioning contact 1220b on insulating layer 1214a and overlapping contacts 1210e, 1210i and 1212e, thereby provides an electrical connection between gates 1204a3, 1204b2, 1204d2, 1204a1 and active regions 1202a5 and 1202b5, and thereby provides additional routing resources extending in the second direction Y and positioned below other metallization levels (e.g., M0, M1, etc.) for integrated circuit 1200 or 1200'.

By providing routing resources below other metallization levels (e.g., M0, M1, etc.), the use of the other metallization levels (e.g., M0, M1, etc.) can be reduced or the other metallization levels (e.g., M0, M1, etc.) can be utilized as additional routing resources resulting in integrated circuit 1200 or 1200' having a smaller area and standard cell than other approaches.

In some embodiments, by using one or more of the set of metal over diffusion layout patterns 220, 520, 820, 1120 and 1120', the set of insulating layout patterns 514, 1114 or 1116, or the set of gate layout patterns 1122 or 1122', additional routing resources are provided in the second direction Y and positioned below other metallization levels (e.g., M0, M1, etc.) for each of layout designs 200, 500, 800, 1100A and 1100G. By providing routing resources below other metallization levels (e.g., M0, M1, etc.), the use of the other metallization levels (e.g., M0, M1, etc.) can be reduced or the other metallization levels (e.g., M0, M1, etc.) can be utilized as additional routing resources resulting in layout designs 200, 500, 800, 1100A and 1100G having a smaller area yielding a standard cell with a smaller area than other approaches.

FIG. 13 is a flowchart of a method 1300 of forming or manufacturing an integrated circuit in accordance with some embodiments. It is understood that additional operations may be performed before, during, and/or after the method 1300 depicted in FIG. 13, and that some other operations may only be briefly described herein. In some embodiments, the method 1300 is usable to form integrated circuits, such as integrated circuit 100 (FIG. 1), 300 (FIG. 3), 400 (FIG. 4), 600 (FIGS. 6A-6B), 700 (FIG. 7), 900 (FIG. 9), 1000A-1000B (FIGS. 10A-10B) or 1200-1200' (FIGS. 12A-12D). In some embodiments, the method 1300 is usable to form integrated circuits having similar structural relationships as one or more of layout design 200 (FIG. 2), 500 (FIG. 5), 800 (FIG. 8), 1100A (FIGS. 1100A-1100F) or 1100G (FIG. 11G).

In operation 1302 of method 1300, a layout design of an integrated circuit is generated. Operation 1302 is performed by a processing device (e.g., processor 1502 (FIG. 15)) configured to execute instructions for generating a layout design. In some embodiments, the layout design of method 1300 includes one or more of layout design 200, 500, 800 or 1100A-1100G. In some embodiments, the layout design of the present application is in a graphic database system (GDSII) file format.

In operation 1304 of method 1300, the integrated circuit is manufactured based on the layout design. In some embodiments, operation 1304 of method 1300 comprises manufacturing at least one mask based on the layout design, and manufacturing the integrated circuit based on the at least one mask.

Figure 14:
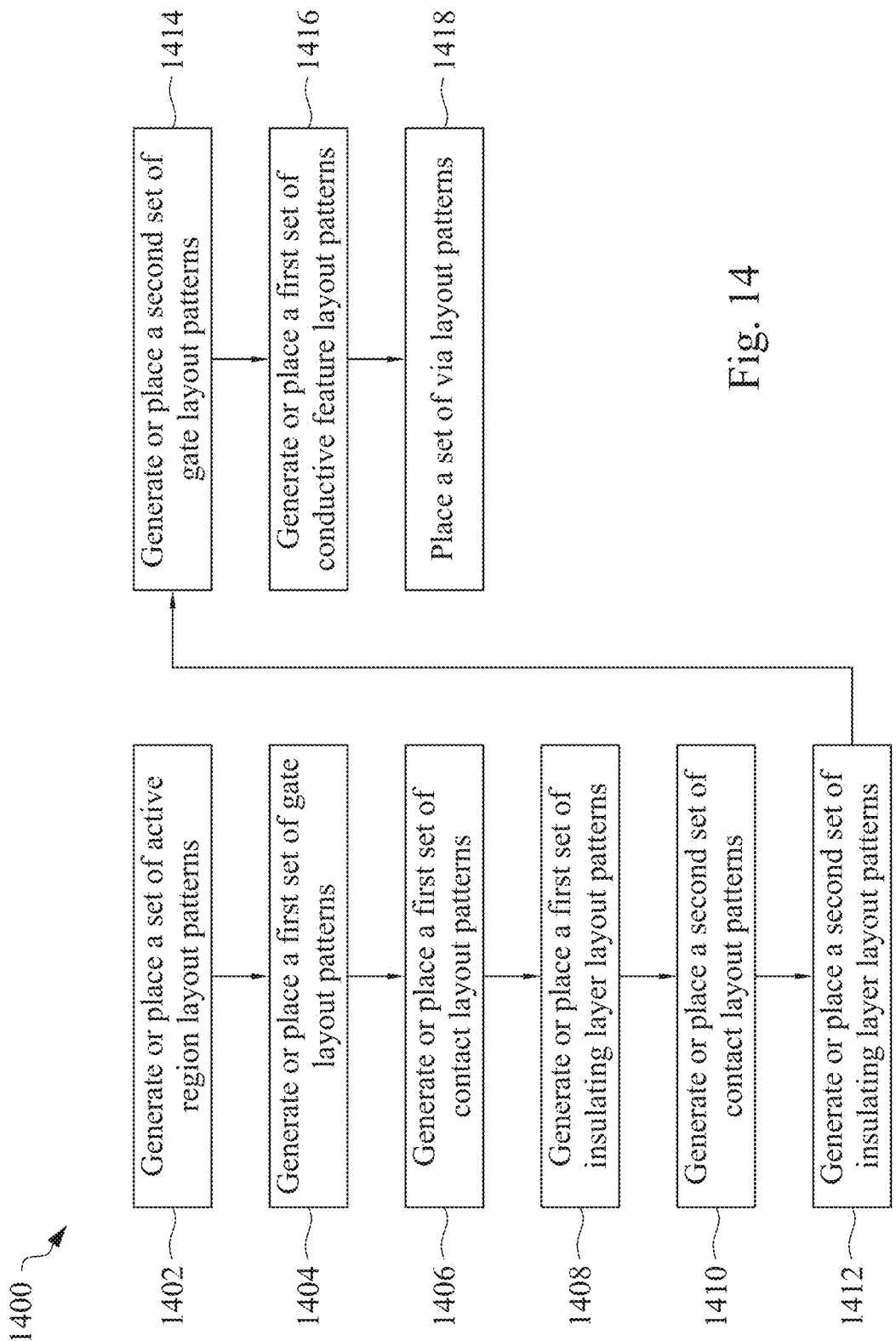
FIG. 14 is a flowchart of a method of generating a layout design of an integrated circuit, in accordance with some embodiments.

FIG. 14 is a flowchart of a method 1400 of generating a layout design of an integrated circuit in accordance with some embodiments. It is understood that additional operations may be performed before, during, and/or after the method 1400 depicted in FIG. 14, and that some other processes may only be briefly described herein. In some embodiments, method 1400 is an embodiment of operation 1302 of method 1300. In some embodiments, the method 1400 is usable to generate one or more layout patterns of layout design 200, 500, 800, 1100A or 1100G of an integrated circuit (e.g., integrated circuit 100, 300, 400, 600, 700, 900, 1000A-1000B or 1200-1200').

In operation 1402 of method 1400, a set of active region layout patterns is generated or placed on layout design 200, 500, 800, 1100A or 1100G. In some embodiments, the set of active region layout patterns of method 1400 includes at least portions of one or more layout patterns of the set of active region layout patterns 202 or 1102.

In some embodiments, operation 1402 includes generating or placing a first active region layout pattern corresponding to fabricating a first active region of the integrated circuit, and generating or placing a second active region layout pattern corresponding to fabricating a second active region of the integrated circuit. In some embodiments, the first active region layout pattern or the second active region layout pattern of operation 1402 includes at least portions of one or more layout patterns of the set of active region layout patterns 202 or 1102. In some embodiments, the first active region or the second active region of operation 1402 includes at least portions of one or more active regions of the set of active regions 302, 602, 902 or 1202.

In operation 1404 of method 1400, a first set of gate layout patterns is generated or placed on layout design 200, 500, 800, 1100A or 1100G. In some embodiments, the first set of gate layout patterns of method 1400 includes at least portions of one or more layout patterns of the set of gate layout patterns 204, 504, 804, 1104 or 1122.

In some embodiments, operation 1404 includes at least generating or placing a first gate layout pattern corresponding to fabricating a first gate or generating or placing a second gate layout pattern corresponding to fabricating a second gate. In some embodiments, the first gate layout pattern or the second gate layout pattern of operation 1404 includes at least portions of one or more layout patterns of the set of gate layout patterns 204, 504, 804, 1104 or 1122. In some embodiments, the first gate or the second gate of operation 1404 includes at least portions of one or more gates of the set of gates 304, 604, 904, 1204 or 1222.

In operation 1406 of method 1400, a first set of contact layout patterns is generated or placed on layout design 200, 500, 800, 1100A or 1100G. In some embodiments, the first set of contact layout patterns of method 1400 includes at least portions of one or more layout patterns of the set of metal over diffusion layout patterns 210, 510, 810, 1110 or 1112 or set of metal over diffusion layout patterns 220, 520, 820 or 1120.

In some embodiments, operation 1406 includes at least generating or placing a first contact layout pattern corresponding to fabricating a first contact or generating or placing a second contact layout pattern corresponding to fabricating a second contact. In some embodiments, the first contact layout pattern or the second contact layout pattern of operation 1406 includes at least portions of one or more layout patterns of the set of metal over diffusion layout patterns 210, 510, 810, 1110 or 1112 or set of metal over diffusion layout patterns 220, 520, 820 or 1120. In some embodiments, the first contact or the second contact of operation 1406 includes at least portions of one or more contacts of the set of contacts 310, 610, 910, 1210 or 1212 or set of contacts 320, 620, 920 or 1220.

In operation 1408 of method 1400, a first set of insulating layer layout patterns is generated or placed on layout design 200, 500, 800, 1100A or 1100G. In some embodiments, the first set of insulating layer layout patterns of method 1400 includes at least portions of one or more layout patterns of the set of insulating layer layout patterns 514, 814, 1114 or 1116.

In some embodiments, operation 1408 includes generating or placing a first insulating layer layout pattern corresponding to fabricating a first insulating layer. In some embodiments, the first insulating layer layout pattern of operation 1408 includes at least portions of one or more layout patterns of the set of insulating layer layout patterns 514, 814, 1114 or 1116. In some embodiments, the first insulating layer of operation 1408 includes at least portions of one or more insulating layers of the set of insulating layers 614, 914, 1214 or 1216.

In operation 1410 of method 1400, a second set of contact layout patterns is generated or placed on layout design 200, 500, 800, 1100A or 1100G. In some embodiments, the second set of contact layout patterns of method 1400 includes at least portions of one or more layout patterns of the set of metal over diffusion layout patterns 220, 520, 820, 1120 or 1120' or set of metal over diffusion layout patterns 210, 510, 810, 1110 or 1112.

In some embodiments, operation 1410 includes at least generating or placing a third contact layout pattern corresponding to fabricating a third contact or generating or placing a fourth contact layout pattern corresponding to fabricating a fourth contact. In some embodiments, the third or fourth contact layout pattern of operation 1410 includes at least portions of one or more layout patterns of the set of metal over diffusion layout patterns 220, 520, 820, 1120 or 1120' or set of metal over diffusion layout patterns 210, 510, 810, 1110 or 1112. In some embodiments, the third or fourth contact of operation 1410 includes at least portions of one or more contacts of the set of contacts 320, 620, 920, 1220 or 1220' or set of contacts 310, 610, 910, 1210 or 1212.

In operation 1412 of method 1400, a second set of insulating layer layout patterns is generated or placed on layout design 200, 500, 800, 1100A or 1100G. In some embodiments, the second set of insulating layer layout patterns of method 1400 includes at least portions of one or more layout patterns of the set of insulating layer layout patterns 514, 814, 1114 or 1116.

In some embodiments, operation 1412 includes generating or placing a second insulating layer layout pattern corresponding to fabricating a second insulating layer. In some embodiments, the second insulating layer layout pattern of operation 1412 includes at least portions of one or more layout patterns of the set of insulating layer layout patterns 514, 814, 1114 or 1116. In some embodiments, the second insulating layer of operation 1412 includes at least portions of one or more insulating layers of the set of insulating layers 614, 914, 1214 or 1216.

In operation 1414 of method 1400, a second set of gate layout patterns is generated or placed on layout design 200, 500, 800, 1100A or 1100G. In some embodiments, the second set of gate layout patterns of method 1400 includes at least portions of one or more layout patterns of the set of gate layout patterns 1122 or 1122' or set of gate layout patterns 204, 504, 804 or 1104.

In some embodiments, operation 1414 includes at least generating or placing a third gate layout pattern corresponding to fabricating a third gate or generating or placing a fourth gate layout pattern corresponding to fabricating a fourth gate. In some embodiments, the third gate layout pattern or the fourth gate layout pattern of operation 1414 includes at least portions of one or more layout patterns of the set of gate layout patterns 1122 or 1122' or set of gate layout patterns 204, 504, 804 or 1104. In some embodiments, the third gate or the fourth gate of operation 1414 includes at least portions of one or more gates of the set of gates 1222 or 1222' or set of gates 304, 604, 904 or 1204.

In operation 1416 of method 1400, a first set of conductive feature layout patterns is generated or placed on layout design 200, 500, 800, 1100A or 1100G. In some embodiments, the first set of conductive feature layout patterns of method 1400 includes at least portions of one or more layout patterns of the set of conductive feature layout patterns 240, 540, 840, 1140 or 1144, or the set of power rail layout patterns 242.

In some embodiments, operation 1416 includes generating or placing a first conductive structure layout pattern corresponding to fabricating a first conductive structure. In some embodiments, the first conductive structure layout pattern of operation 1416 includes at least portions of one or more layout patterns of the set of conductive structure layout patterns 240, 540, 840, 1140 or 1144, or the set of power rail layout patterns 242. In some embodiments, the first conductive structure of operation 1416 includes at least portions of one or more conductive structures of the set of conductive structures 340, 640, 940, 1240 or 1244, or the set of power rails 342.

In operation 1418 of method 1400, a set of via layout patterns is generated or placed on layout design 200, 500, 800, 1100A or 1100G. In some embodiments, the set of via layout patterns of method 1400 includes at least portions of one or more layout patterns of the set of via layout patterns 250, 550, 850, 1150, 1150', 1160 or 1160'.

In some embodiments, operation 1418 includes generating or placing a via layout pattern corresponding to a first via or generating or placing a second via layout pattern corresponding to a second via. In some embodiments, the first or the second via layout pattern of operation 1418 includes at least portions of one or more layout patterns of the set of via layout patterns 250, 550, 560, 850, 1150, 1150', 1160 or 1160'. In some embodiments, the first or the second via of operation 1418 includes at least portions of one or more vias of the set of vias 350, 650, 660, 950, 1250, 1250', 1260 or 1260'.

In some embodiments, one or more of operations 1402, 1404, 1406, 1408, 1410, 1412, 1414, 1416 or 1418 is not performed. One or more of the operations of methods 1300-1400 is performed by a processing device configured to execute instructions for manufacturing an integrated circuit, such as integrated circuit 100, 300, 400, 600, 700, 900, 1000A-1000B, 1200 or 1200'. In some embodiments, one or more operations of methods 1300-1400 is performed using a same processing device as that used in a different one or more operations of methods 1300-1400. In some embodiments, a different processing device is used to perform one or more operations of methods 1300-1400 from that used to perform a different one or more operations of methods 1300-1400.

Figure 15:
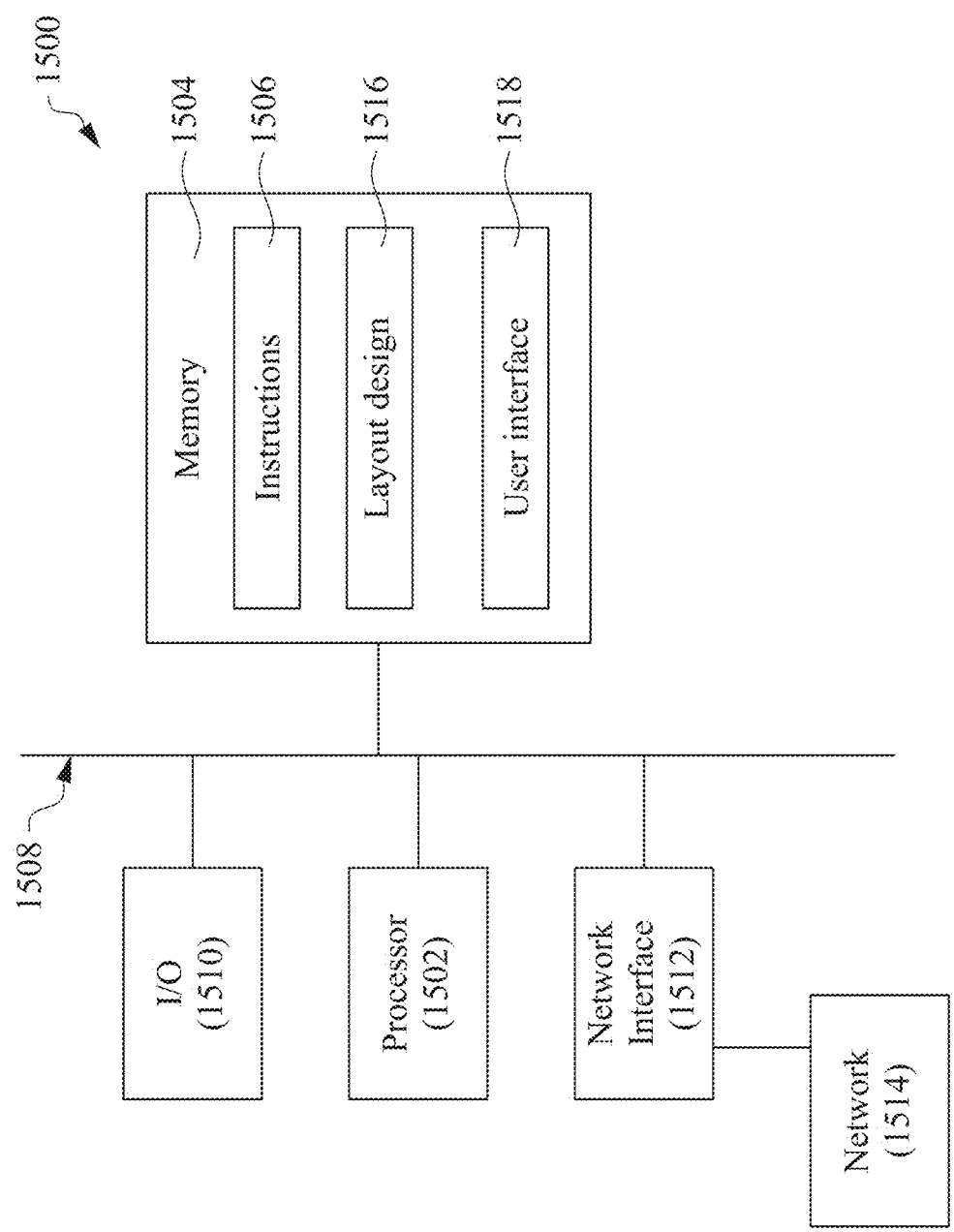
FIG. 15 is a block diagram of a system of designing an IC layout design, in accordance with some embodiments.

FIG. 15 is a schematic view of a system 1500 for designing and manufacturing an IC layout design in accordance with some embodiments. In some embodiments, system 1500 generates or places one or more IC layout designs described herein. In some embodiments, system 1500 manufactures one or more ICs based on the one or more IC layout designs described herein. System 1500 includes a hardware processor 1502 and a non-transitory, computer readable storage medium 1504 encoded with, i.e., storing, the computer program code 1506, i.e., a set of executable instructions. Computer readable storage medium 1504 is configured for interfacing with manufacturing machines for producing the integrated circuit. The processor 1502 is electrically coupled to the computer readable storage medium 1504 by a bus 1508. The processor 1502 is also electrically coupled to an I/O interface 1510 by bus 1508. A network interface 1512 is also electrically connected to the processor 1502 by bus 1508. Network interface 1512 is connected to a network 1514, so that processor 1502 and computer readable storage medium 1504 are capable of connecting to external elements via network 1514. The processor 1502 is configured to execute the computer program code 1506 encoded in the computer readable storage medium 1504 in order to cause system 1500 to be usable for performing a portion or all of the operations as described in method 1300 or 1400.

In some embodiments, the processor 1502 is a central processing unit (CPU), a multi-processor, a distributed processing system, an application specific integrated circuit (ASIC), and/or a suitable processing unit.

In some embodiments, the computer readable storage medium 1504 is an electronic, magnetic, optical, electromagnetic, infrared, and/or a semiconductor system (or apparatus or device). For example, the computer readable storage medium 1504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1504 includes a compact disk-read only memory (CD-ROM), a compact disk-read/write (CD-R/W), and/or a digital video disc (DVD).

In some embodiments, the storage medium 1504 stores the computer program code 1506 configured to cause system 1500 to perform method 1300 or 1400. In some embodiments, the storage medium 1504 also stores information needed for performing method 1300 or 1400 as well as information generated during performance of method 1300 or 1400, such as layout design 1516 and user interface 1518 and fabrication unit 1520, and/or a set of executable instructions to perform the operation of method 1300 or 1400. In some embodiments, layout design 1516 comprises one or more layout patterns of layout design 200, 500, 800, 1100A or 1100G.

In some embodiments, the storage medium 1504 stores instructions (e.g., computer program code 1506) for interfacing with manufacturing machines. The instructions (e.g., computer program code 1506) enable processor 1502 to generate manufacturing instructions readable by the manufacturing machines to effectively implement method 1300 or 1400 during a manufacturing process.

System 1500 includes I/O interface 1510. I/O interface 1510 is coupled to external circuitry. In some embodiments, I/O interface 1510 includes a keyboard, keypad, mouse, trackball, trackpad, and/or cursor direction keys for communicating information and commands to processor 1502.

System 1500 also includes network interface 1512 coupled to the processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interface such as ETHERNET, USB, or IEEE-13154. In some embodiments, method 1300 or 1400 is implemented in two or more systems 1500, and information such as layout design, user interface and fabrication unit are exchanged between different systems 1500 by network 1514.

System 1500 is configured to receive information related to a layout design through I/O interface 1510 or network interface 1512. The information is transferred to processor 1502 by bus 1508 to determine a layout design for producing an IC (e.g., integrated circuit 100, 300, 400, 600, 700, 900, 1000A-1000B or 1200-1200'). The layout design is then stored in computer readable medium 1504 as layout design 1516. System 1500 is configured to receive information related to a user interface through I/O interface 1510 or network interface 1512. The information is stored in computer readable medium 1504 as user interface 1518. System 1500 is configured to receive information related to a fabrication unit through I/O interface 1510 or network interface 1512. The information is stored in computer readable medium 1504 as fabrication unit 1520. In some embodiments, the fabrication unit 1520 includes fabrication information utilized by system 1500.

In some embodiments, method 1300 or 1400 is implemented as a standalone software application for execution by a processor. In some embodiments, method 1300 or 1400 is implemented as a software application that is a part of an additional software application. In some embodiments, method 1300 or 1400 is implemented as a plug-in to a software application. In some embodiments, method 1300 or 1400 is implemented as a software application that is a portion of an EDA tool. In some embodiments, method 1300 or 1400 is implemented as a software application that is used by an EDA tool. In some embodiments, the EDA tool is used to generate a layout design of the integrated circuit device.

In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 1300 or 1400 is implemented by a manufacturing device to manufacture an integrated circuit using a set of masks manufactured based on one or more layout designs generated by system 1500. In some embodiments, system 1500 is a manufacturing device to manufacture an integrated circuit using a set of masks manufactured based on one or more layout designs of the present disclosure. In some embodiments, system 1500 of FIG. 15 generates layout designs of an IC that are smaller than other approaches. In some embodiments, system 1500 of FIG. 15 generates layout designs of an IC (e.g., integrated circuit 100, 300, 400, 600, 700, 900, 1000A-1000B or 1200-1200') that occupy less area than other approaches.

Figure 16:
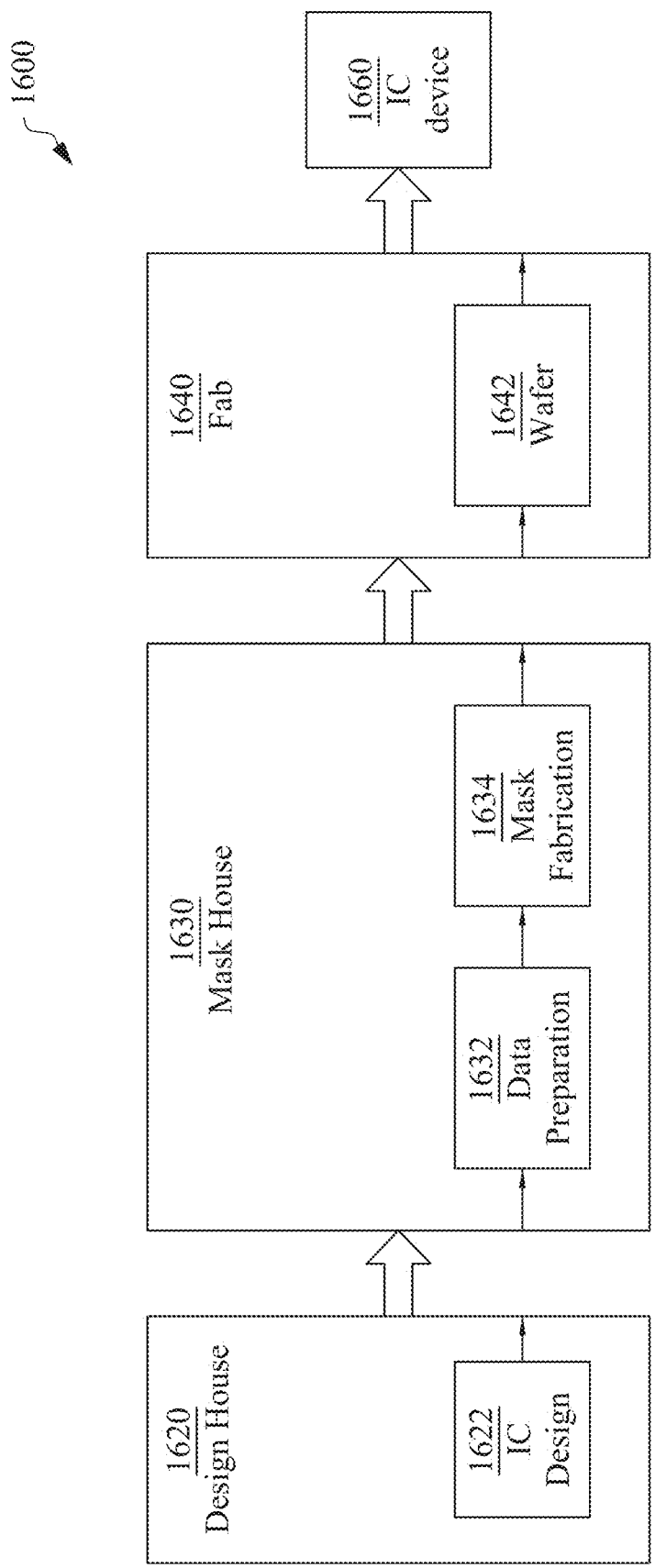
FIG. 16 is a block diagram of an IC manufacturing system, and an IC manufacturing flow associated therewith, in accordance with at least one embodiment of the present disclosure.

FIG. 16 is a block diagram of an integrated circuit (IC) manufacturing system 1600, and an IC manufacturing flow associated therewith, in accordance with at least one embodiment of the present disclosure.

In FIG. 16, IC manufacturing system 1600 includes entities, such as a design house 1620, a mask house 1630, and an IC manufacturer/fabricator ("fab") 1640, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1640 is owned by a single larger company. In some embodiments, two or more of design house 1620, mask house 1630, and IC fab 1640 coexist in a common facility and use common resources.

Design house (or design team) 1620 generates an IC design layout 1622. IC design layout 1622 includes various geometrical patterns designed for an IC device 1660. The geometrical patterns correspond to patterns of metal, oxide, or semiconductor layers that make up the various components of IC device 1660 to be fabricated. The various layers combine to form various IC features. For example, a portion of IC design layout 1622 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1620 implements a proper design procedure to form IC design layout 1622. The design procedure includes one or more of logic design, physical design or place and route. IC design layout 1622 is presented in one or more data files having information of the geometrical patterns. For example, IC design layout 1622 can be expressed in a GDSII file format or DFII file format.

Mask house 1630 includes data preparation 1632 and mask fabrication 1634. Mask house 1630 uses IC design layout 1622 to manufacture one or more masks to be used for fabricating the various layers of IC device 1660 according to IC design layout 1622. Mask house 1630 performs mask data preparation 1632, where IC design layout 1622 is translated into a representative data file ("RDF"). Mask data preparation 1632 provides the RDF to mask fabrication 1634. Mask fabrication 1634 includes a mask writer. A mask writer converts the RDF to an image on a substrate, such as a mask (reticle) or a semiconductor wafer. The design layout is manipulated by mask data preparation 1632 to comply with particular characteristics of the mask writer and/or requirements of IC fab 1640. In FIG. 16, mask data preparation 1632 and mask fabrication 1634 are illustrated as separate elements. In some embodiments, mask data preparation 1632 and mask fabrication 1634 can be collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1634, which may undo part of the modifications performed by OPC in order to meet mask creation rules.

In some embodiments, mask data preparation 1632 includes lithography process checking (LPC) that simulates processing that will be implemented by IC fab 1640 to fabricate IC device 1660. LPC simulates this processing based on IC design layout 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1622.

It should be understood that the above description of mask data preparation 1632 has been simplified for the purposes of clarity. In some embodiments, data preparation 1632 includes additional features such as a logic operation (LOP) to modify the IC design layout according to manufacturing rules. Additionally, the processes applied to IC design layout 1622 during data preparation 1632 may be executed in a variety of different orders.

After mask data preparation 1632 and during mask fabrication 1634, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1634 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1640 is an IC fabrication entity that includes one or more manufacturing facilities for the fabrication of a variety of different IC products. In some embodiments, IC Fab 1640 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1640 uses the mask (or masks) fabricated by mask house 1630 to fabricate IC device 1660. Thus, IC fab 1640 at least indirectly uses IC design layout 1622 to fabricate IC device 1660. In some embodiments, a semiconductor wafer 1642 is fabricated by IC fab 1640 using the mask (or masks) to form IC device 1660. Semiconductor wafer 1642 includes a silicon substrate or other proper substrate having material layers formed thereon. Semiconductor wafer further includes one or more of various doped regions, dielectric features, multilevel interconnects, and the like (formed at subsequent manufacturing steps).

System 1600 is shown as having design house 1620, mask house 1630 or IC fab 1640 as separate components or entities. However, it is understood that one or more of design house 1620, mask house 1630 or IC fab 1640 are part of the same component or entity.

Details regarding an integrated circuit (IC) manufacturing system (e.g., system 1600 of FIG. 16), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a first active region in a substrate, extending in a first direction, and being located on a first level; a second active region in the substrate, extending in the first direction, being located on the first level, and being separated from the first active region in a second direction different from the first direction; a first contact coupled to the first active region, extending in the second direction, being located on a second level different from the first level, and overlapping the first active region, a second contact coupled to the second active region, extending in the second direction, being located on the second level, overlapping the second active region, and being separated from the first contact in at least the second direction, and a third contact extending in the second direction, overlapping the first contact and the second contact, being located on a third level different from the first level and the second level, and being coupled to the first active region and the first contact.

Another aspect of this description relates to an integrated circuit. In some embodiments, the integrated circuit includes a first gate extending in the first direction, being located on a first level; a second gate extending in the first direction; being located on the first level; and being separated from the first gate in a second direction different from the first direction; a first gate portion extending in the second direction; overlapping the first gate and the second gate; being located on a second level different from the first level; and being coupled to at least the first gate; and a first insulating layer extending in the second direction; overlapping the second gate; and being between the second gate and the first gate portion.

Still another aspect of this description relates to a method of forming an integrated circuit. The method includes generating, by a processor, a layout design of the integrated circuit and manufacturing the integrated circuit based on the layout design. In some embodiments, generating the layout design includes generating a first active region layout pattern corresponding to fabricating a first active region of the integrated circuit; the first active region layout pattern extending in a first direction; and being located on a first level; generating a second active region layout pattern corresponding to fabricating a second active region of the integrated circuit; the second active region layout pattern extending in the first direction; being located on the first level; and being separated from the first active region layout pattern in a second direction different from the first direction; generating a first contact layout pattern corresponding to fabricating a first contact; the first contact layout pattern extending in the second direction; overlapping the first active region layout pattern; being located on a second level different from the first level; and the first contact being electrically coupled to the first active region; generating a second contact layout pattern corresponding to fabricating a second contact; the second contact layout pattern extending in the second direction; overlapping the second active region layout pattern, being located on the second level, and being separated from the first contact layout pattern in the second direction, and the second contact being electrically coupled to the second active region; and generating a third contact layout pattern corresponding to fabricating a third contact, the third contact layout pattern extending in the second direction, overlapping the second active region layout pattern, being located on a third level different from the first level and the second level, and overlapping the first active region layout pattern and the second active region layout pattern, and the third contact being coupled to at least the first contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first active region in a substrate, extending in a first direction, and being located on a first level;
   a second active region in the substrate, extending in the first direction, being located on the first level, and being separated from the first active region in a second direction different from the first direction;
   a first contact coupled to the first active region, extending in the second direction, being located on a second level different from the first level, and overlapping the first active region;
   a second contact coupled to the second active region, extending in the second direction, being located on the second level, overlapping the second active region, and being separated from the first contact in at least the second direction; and
   a third contact extending in the second direction, overlapping the first contact and the second contact, being located on a third level different from the first level and the second level, and being coupled to the first active region and the first contact.

2. The integrated circuit of claim 1, wherein the third contact is further coupled to the second contact and the second active region.

3. The integrated circuit of claim 2, wherein the integrated circuit is part of an inverter circuit.

4. The integrated circuit of claim 1, further comprising:
   a first conductive structure extending in the first direction, being located on a fourth level different from the first level, the second level and the third level, and overlapping the second contact and the third contact;
   a first via between the third contact and the first conductive structure, and the first via coupling the third contact to the first conductive structure; and
   an insulating layer extending in the second direction, and being between the second contact and the third contact.

5. The integrated circuit of claim 4, further comprising:
   a third active region in the substrate, extending in the first direction, being located on the first level, and being separated from the second active region in the first direction;
   a first gate extending in the second direction, being between the third active region and the second active region, and being located on the second level;
   a fourth contact coupled to the third active region, extending in the second direction, being located on the second level, overlapping the third active region, and being separated from the second contact in the first direction;
   a fifth contact extending in the second direction, being over the fourth contact, being located on the third level, and being coupled to the third active region; and
   a second via between the fifth contact and the first conductive structure, and the second via coupling the fifth contact to the first conductive structure.

6. The integrated circuit of claim 5, wherein the integrated circuit is part of a NAND logic gate circuit.

7. The integrated circuit of claim 5, wherein the fourth level is a metal zero (M0) layer of the integrated circuit.

8. The integrated circuit of claim 5, further comprising:
a fourth active region in the substrate, extending in the first direction, being located on the first level, being separated from the first active region in the first direction, and being separated from the third active region in the second direction;
a sixth contact coupled to the fourth active region, extending in the second direction, being located on the second level, overlapping the fourth active region, and being separated from the first contact in the first direction;
a seventh contact extending in the second direction, being over the sixth contact, being located on the third level, and being coupled to the fourth active region;
a second conductive structure extending in the first direction, being located on the fourth level, and overlapping the sixth contact and the seventh contact; and
a third via between the seventh contact and the second conductive structure, and the third via coupling the seventh contact to the second conductive structure.

9. The integrated circuit of claim 8, further comprising:
a fifth active region in the substrate, extending in the first direction, being located on the first level, being separated from the first active region in the first direction;
a second gate extending in the second direction, being between the first active region and the fifth active region, and being located on the second level;
an eighth contact coupled to the fifth active region, extending in the second direction, being located on the second level, overlapping the fifth active region, and being separated from the first contact in the first direction;
a ninth contact extending in the second direction, being over the eighth contact, being located on the third level, and being coupled to the fifth active region; and
a fourth via between the ninth contact and the second conductive structure, and the fourth via coupling the ninth contact to the second conductive structure.

10. The integrated circuit of claim 9, wherein the integrated circuit is part of an AND OR INVERTER logic circuit.

11. An integrated circuit comprising:
a first gate extending in a first direction, being located on a first level;
a second gate extending in the first direction, being located on the first level, and being separated from the first gate in a second direction different from the first direction;
a first gate portion extending in the second direction, overlapping the first gate and the second gate, being located on a second level different from the first level, and being coupled to at least the first gate; and
a first insulating layer extending in the second direction, overlapping the second gate, and being between the second gate and the first gate portion.

12. The integrated circuit of claim 11, further comprising:
a third gate extending in the first direction, being located on the first level, and being separated from the second gate in the first direction;
a first conductive structure extending in the first direction, being located on a third level different from the first level and the second level, and overlapping the third gate and the first gate portion;
a first via between the first gate portion and the first conductive structure, and the first via coupling the first gate portion to the first conductive structure; and
a second via between the third gate and the first conductive structure, and the second via coupling the third gate to the first conductive structure.

13. The integrated circuit of claim 12, further comprising:
a first active region in a substrate, extending in the first direction, being located on a fourth level different from the first level, the second level and the third level;
a second active region in the substrate, extending in the first direction, being located on the fourth level, and being separated from the first active region in the second direction;
a first contact coupled to the first active region and the second active region, extending in the second direction, being located on the first level, and overlapping the first active region and the second active region, and being separated from the third gate in the first direction; and
a second contact extending in the second direction, and overlapping at least a portion of the first contact, being located on the second level.

14. The integrated circuit of claim 13, further comprising:
a second insulating layer extending in the second direction, and being between the second contact and the portion of the first contact; and
a third via between the second contact and the first conductive structure, and the third via coupling the second contact to the first conductive structure.

15. The integrated circuit of claim 14, further comprising:
a third active region in the substrate, extending in the first direction, being located on the fourth level, and being separated from the first active region and the second active region in the second direction;
a fourth active region in the substrate, extending in the first direction, being located on the fourth level, and being separated from the third active region in the second direction;
a third contact coupled to the third active region, extending in the second direction, being located on the first level, and overlapping the third active region, and being separated from the first contact in the second direction; and
a fourth contact coupled to the fourth active region, extending in the second direction, being located on the first level, and overlapping the fourth active region, and being separated from the first contact and the third contact in the second direction;
wherein the second contact further overlaps the third contact and the fourth contact, and is electrically coupled with the third contact and the fourth contact.

16. The integrated circuit of claim 15, further comprising:
a fourth gate extending in the first direction, being located on the first level, and being separated from the first gate and the second gate in the second direction;
a second conductive structure extending in the first direction, being separated from the first conductive structure in the second direction, being located on the third level, and overlapping the fourth gate and the second contact;
a fourth via between the second contact and the second conductive structure, and the fourth via coupling the second contact to the second conductive structure; and
a fifth via between the fourth gate and the second conductive structure, and the fifth via coupling the fourth gate to the second conductive structure.

17. A method of forming an integrated circuit, the method comprising:
generating, by a processor, a layout design of the integrated circuit, wherein the generating of the layout design comprises:

generating a first active region layout pattern corresponding to fabricating a first active region of the integrated circuit, the first active region layout pattern extending in a first direction, and being located on a first level;

generating a second active region layout pattern corresponding to fabricating a second active region of the integrated circuit, the second active region layout pattern extending in the first direction, being located on the first level, and being separated from the first active region layout pattern in a second direction different from the first direction;

generating a first contact layout pattern corresponding to fabricating a first contact, the first contact layout pattern extending in the second direction, overlapping the first active region layout pattern, being located on a second level different from the first level, and the first contact being electrically coupled to the first active region;

generating a second contact layout pattern corresponding to fabricating a second contact, the second contact layout pattern extending in the second direction, overlapping the second active region layout pattern, being located on the second level, and being separated from the first contact layout pattern in the second direction, and the second contact being electrically coupled to the second active region; and generating a third contact layout pattern corresponding to fabricating a third contact, the third contact layout pattern extending in the second direction, being located on a third level different from the first level and the second level, and overlapping the first active region layout pattern and the second active region layout pattern, and the third contact being coupled to at least the first contact; and manufacturing the integrated circuit based on the layout design.

18. The method of claim 17, wherein the generating of the layout design comprises:

generating a first insulating layer layout pattern corresponding to fabricating a first insulating layer, the first insulating layer layout pattern extending in the second direction, and being between the second contact layout pattern and the third contact layout pattern, and the first insulating layer configured to electrically insulate the third contact from the second contact.

19. The method of claim 17, wherein the generating of the layout design comprises:

generating a first gate layout pattern corresponding to fabricating a first gate, the first gate layout pattern extending in the second direction, and being located on the second level;

generating a second gate layout pattern corresponding to fabricating a second gate, the second gate layout pattern extending in the second direction, being located on the second level, and being separated from the first gate layout pattern in the second direction; and generating a third gate layout pattern corresponding to fabricating a first gate portion, the third gate layout pattern extending in the second direction, overlapping the first gate layout pattern and the second gate layout pattern, being located on the third level, being separated from the third contact layout pattern in the first direction, and the first gate portion being coupled to at least the first gate.

20. The method of claim 19, wherein the generating of the layout design comprises:

generating a second insulating layer layout pattern corresponding to fabricating a second insulating layer, the second insulating layer layout pattern extending in the second direction, and being between the third gate layout pattern and the second gate layout pattern, and the second insulating layer configured to electrically insulate the first gate portion from the second gate;

generating a first conductive structure layout pattern corresponding to fabricating a first conductive structure, the first conductive structure layout pattern extending in the first direction, being located on a fourth level different from the first level, the second level and the third level, and overlapping the third contact layout pattern and the third gate layout pattern;

generating a first via layout pattern corresponding to a first via, the first via layout pattern being between the first conductive structure layout pattern and the third contact layout pattern, the first via coupling the third contact to the first conductive structure; and generating a second via layout pattern corresponding to a second via, the second via layout pattern being between the first conductive structure layout pattern and the third gate layout pattern, the second via coupling the first gate portion to the first conductive structure.

\* \* \* \* \*